US011456220B2

(12) United States Patent
Vronsky et al.

(10) Patent No.: US 11,456,220 B2
(45) Date of Patent: *Sep. 27, 2022

(54) TECHNIQUES FOR LAYER FENCING TO IMPROVE EDGE LINEARITY

(71) Applicant: Kateeva, Inc., Newark, CA (US)

(72) Inventors: Eliyahu Vronsky, Los Altos, CA (US); Nahid Harjee, Sunnyvale, CA (US)

(73) Assignee: KATEEVA, INC., Newark, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/804,015

(22) Filed: Nov. 6, 2017

(65) Prior Publication Data

US 2018/0061720 A1    Mar. 1, 2018

Related U.S. Application Data

(63) Continuation of application No. 15/416,931, filed on Jan. 26, 2017, now abandoned, which is a
(Continued)

(51) Int. Cl.
*H01L 21/66* (2006.01)
*H01L 21/02* (2006.01)
(Continued)

(52) U.S. Cl.
CPC ............ *H01L 22/12* (2013.01); *B05C 11/10* (2013.01); *B41J 2/01* (2013.01); *B41J 2/2054* (2013.01);
(Continued)

(58) Field of Classification Search
CPC .............................. B41J 2/2054; H01L 22/12
See application file for complete search history.

(56) References Cited

U.S. PATENT DOCUMENTS

| 4,922,270 A | 5/1990 | Cobbs et al. |
| 4,992,270 A | 2/1991 | Wilson et al. |

(Continued)

FOREIGN PATENT DOCUMENTS

| CN | 1258250 A | 6/2000 |
| CN | 1311100 A | 9/2001 |

(Continued)

OTHER PUBLICATIONS

JP 2009117140A, 2009, Machine Translation. (Year: 2009).*
(Continued)

*Primary Examiner* — Robert A Vetere
(74) *Attorney, Agent, or Firm* — Hauptman Ham, LLP

(57) ABSTRACT

An ink jet process is used to deposit a material layer to a desired thickness. Layout data is converted to per-cell grayscale values, each representing ink volume to be locally delivered. The grayscale values are used to generate a halftone pattern to deliver variable ink volume (and thickness) to the substrate. The halftoning provides for a relatively continuous layer (e.g., without unintended gaps or holes) while providing for variable volume and, thus, contributes to variable ink/material buildup to achieve desired thickness. The ink is jetted as liquid or aerosol that suspends material used to form the material layer, for example, an organic material used to form an encapsulation layer for a flat panel device. The deposited layer is then cured or otherwise finished to complete the process.

4 Claims, 13 Drawing Sheets

Related U.S. Application Data continuation of application No. 15/279,261, filed on Sep. 28, 2016, now Pat. No. 9,806,298, which is a continuation of application No. 14/627,186, filed on Feb. 20, 2015, now Pat. No. 9,496,519, which is a continuation of application No. 14/458,005, filed on Aug. 12, 2014, now Pat. No. 8,995,022.

(60) Provisional application No. 62/019,076, filed on Jun. 30, 2014, provisional application No. 62/005,044, filed on May 30, 2014, provisional application No. 61/977,939, filed on Apr. 10, 2014, provisional application No. 61/915,149, filed on Dec. 12, 2013.

(51) Int. Cl.

| | |
|---|---|
| *H01L 51/52* | (2006.01) |
| *H01L 51/56* | (2006.01) |
| *H01L 51/00* | (2006.01) |
| *B41J 2/205* | (2006.01) |
| *B41J 2/01* | (2006.01) |
| *B41J 2/21* | (2006.01) |
| *H04N 1/405* | (2006.01) |
| *B05C 11/10* | (2006.01) |
| *H01L 21/67* | (2006.01) |
| *H01L 33/52* | (2010.01) |
| *H01L 31/0203* | (2014.01) |
| *H01L 31/048* | (2014.01) |
| *H01L 33/54* | (2010.01) |
| *H01L 33/56* | (2010.01) |

(52) U.S. Cl.
CPC .......... *B41J 2/21* (2013.01); *H01L 21/02288* (2013.01); *H01L 21/67126* (2013.01); *H01L 22/26* (2013.01); *H01L 31/0203* (2013.01); *H01L 31/048* (2013.01); *H01L 33/52* (2013.01); *H01L 33/54* (2013.01); *H01L 51/0005* (2013.01); *H01L 51/0031* (2013.01); *H01L 51/5237* (2013.01); *H01L 51/5253* (2013.01); *H01L 51/56* (2013.01); *H04N 1/405* (2013.01); *H01L 33/56* (2013.01); *H01L 51/5256* (2013.01); *H01L 2227/323* (2013.01); *H01L 2933/005* (2013.01); *Y02E 10/549* (2013.01); *Y02P 70/50* (2015.11)

(56) References Cited

U.S. PATENT DOCUMENTS

| | | |
|---|---|---|
| 5,317,169 A | 5/1994 | Nakano et al. |
| 5,345,673 A | 9/1994 | Saitoh |
| 5,434,430 A | 7/1995 | Stewart |
| 5,469,276 A | 11/1995 | Shu |
| 5,555,006 A | 9/1996 | Cleveland et al. |
| 4,963,882 B1 | 10/1996 | Hickman |
| 5,561,449 A | 10/1996 | Raskin et al. |
| 5,681,757 A | 10/1997 | Hayes |
| 5,707,684 A | 1/1998 | Hayes et al. |
| 5,711,989 A | 1/1998 | Ciardella et al. |
| 5,779,971 A | 7/1998 | Pan et al. |
| 5,847,720 A | 12/1998 | Dunand |
| 5,895,692 A | 4/1999 | Shirasaki et al. |
| 5,906,682 A | 5/1999 | Bouras et al. |
| 5,932,012 A | 8/1999 | Ishida et al. |
| 6,013,982 A | 1/2000 | Thompson et al. |
| 6,019,454 A | 2/2000 | Serra et al. |
| 6,066,357 A | 5/2000 | Tang et al. |
| 6,149,263 A | 11/2000 | Nakano |
| 6,164,746 A | 12/2000 | Akahira et al. |
| 6,228,228 B1 | 5/2001 | Singh et al. |
| 6,247,787 B1 | 6/2001 | Giere et al. |
| 6,283,572 B1 | 9/2001 | Kumar et al. |
| 6,328,395 B1 | 12/2001 | Kitahara et al. |
| 6,329,108 B1 | 12/2001 | Fujiike et al. |
| 6,347,857 B1 | 2/2002 | Purcell et al. |
| 6,352,331 B1 | 3/2002 | Armijo et al. |
| 6,354,686 B1 | 3/2002 | Tanaka et al. |
| 6,401,001 B1 | 6/2002 | Jang et al. |
| 6,406,114 B1 | 6/2002 | Shioya |
| 6,481,816 B1 | 11/2002 | Oyen |
| 6,495,917 B1 | 12/2002 | Ellis-Monaghan et al. |
| 6,517,176 B1 | 2/2003 | Chaug |
| 6,565,177 B1 | 5/2003 | Corrigan |
| 6,629,741 B1 | 10/2003 | Okuda et al. |
| 6,736,484 B2 | 5/2004 | Nakamura |
| 6,739,686 B2 | 5/2004 | Imai |
| 6,754,551 B1 | 6/2004 | Zohar et al. |
| 6,783,210 B2 | 8/2004 | Takahashi et al. |
| 6,793,324 B2 | 9/2004 | Hosono et al. |
| 6,824,238 B2 | 11/2004 | Chang |
| 6,837,568 B2 | 1/2005 | Nakamura |
| 6,863,961 B2 | 3/2005 | Miyashita et al. |
| 6,910,762 B2 | 6/2005 | Nakamura |
| 6,960,036 B1 | 11/2005 | Fujita et al. |
| 6,972,261 B2 | 12/2005 | Wong et al. |
| 7,072,522 B2 | 7/2006 | Miyake et al. |
| 7,073,727 B2 | 7/2006 | Usuda |
| 7,093,924 B2 | 8/2006 | Nakamura |
| 7,101,013 B2 | 9/2006 | Nakamura |
| 7,111,755 B2 | 9/2006 | Koyama et al. |
| 7,121,642 B2 | 10/2006 | Stoessel et al. |
| 7,138,304 B2 | 11/2006 | Hirai |
| 7,188,919 B2 | 3/2007 | Satomura |
| 7,204,573 B2 | 4/2007 | Koyama |
| 7,207,647 B2 | 4/2007 | Silverbrook |
| 7,216,950 B2 | 5/2007 | Eguchi et al. |
| 7,217,438 B2 | 5/2007 | Newsome et al. |
| 7,223,309 B2 | 5/2007 | Takahashi et al. |
| 7,249,829 B2 | 7/2007 | Hawkins et al. |
| 7,258,408 B2 | 8/2007 | Usuda |
| 7,270,712 B2 | 9/2007 | Edwards et al. |
| 7,278,847 B2 | 10/2007 | Silverbrook |
| 7,281,778 B2 | 10/2007 | Hasenbein et al. |
| 7,381,449 B2 | 6/2008 | Miyasaka |
| 7,449,070 B2 | 11/2008 | Edwards et al. |
| 7,461,912 B2 | 12/2008 | Kamiyama et al. |
| 7,503,637 B2 | 3/2009 | Komatsu et al. |
| 7,513,595 B2 | 4/2009 | Nakamura |
| 7,517,549 B2 | 4/2009 | Hayashi |
| 7,554,697 B2 | 6/2009 | Mizutani et al. |
| 7,569,129 B2 | 8/2009 | Pamula et al. |
| 7,600,840 B2 | 10/2009 | Kim et al. |
| 7,611,754 B2 | 11/2009 | Edwards et al. |
| 7,612,917 B2 | 11/2009 | Nagaishi et al. |
| 7,616,340 B2 | 11/2009 | Yamazaki |
| 7,658,465 B2 | 2/2010 | Newsome et al. |
| 7,677,689 B2 | 3/2010 | Kim et al. |
| 7,699,428 B2 | 4/2010 | Kato |
| 7,757,632 B2 | 7/2010 | Edwards et al. |
| 7,775,179 B2 | 8/2010 | Kim et al. |
| 7,815,965 B2 | 10/2010 | Edwards et al. |
| 7,823,535 B2 | 11/2010 | Hanafusa et al. |
| 7,839,080 B2 | 11/2010 | Kim et al. |
| 7,850,267 B2 | 12/2010 | Usuda |
| 7,857,242 B2 | 12/2010 | Huang |
| 7,887,156 B2 | 2/2011 | Middleton et al. |
| 7,891,752 B2 | 2/2011 | Liu et al. |
| 7,901,026 B2 | 3/2011 | Albertalli et al. |
| 7,909,427 B2 | 3/2011 | Kim et al. |
| 7,914,104 B2 | 3/2011 | Silverbrook |
| 7,920,934 B2 | 4/2011 | Aruga |
| 7,972,875 B2 | 7/2011 | Rogers et al. |
| 8,025,353 B2 | 9/2011 | Hasenbein |
| 8,025,917 B2 | 9/2011 | Kinoshita |
| 8,033,634 B2 | 10/2011 | Komatsu et al. |
| 8,066,345 B2 | 11/2011 | Komori et al. |
| 8,119,186 B2 | 2/2012 | Sakai |
| 8,123,324 B2 | 2/2012 | Komori et al. |
| 8,124,190 B2 | 2/2012 | Miyasaka |
| 8,186,791 B2 | 5/2012 | Yamashita |
| 8,235,487 B2 | 8/2012 | Madigan et al. |

(56) References Cited

U.S. PATENT DOCUMENTS

| | | | |
|---|---|---|---|
| 8,248,656 B2 | 8/2012 | Lin et al. |
| 8,310,721 B2 | 11/2012 | Saita et al. |
| 8,323,724 B2 | 12/2012 | Shinohara |
| 8,342,623 B2 | 1/2013 | Hong et al. |
| 8,342,636 B2 | 1/2013 | Nakano et al. |
| 8,343,869 B2 | 1/2013 | Gothait et al. |
| 8,382,232 B2 | 2/2013 | Silverbrook |
| 8,383,202 B2 | 2/2013 | Somekh et al. |
| 8,413,602 B2 | 4/2013 | Nakamura |
| 8,435,093 B2 | 5/2013 | Takeuchi |
| 8,449,058 B2 | 5/2013 | Hasenbein |
| 8,459,768 B2 | 6/2013 | Hasenbein et al. |
| 8,466,484 B2 | 6/2013 | Slyke et al. |
| 8,579,408 B2 | 11/2013 | Kelly et al. |
| 8,668,307 B2 | 3/2014 | Lewartowski et al. |
| 8,784,938 B2 | 7/2014 | Suzuki et al. |
| 8,995,022 B1 | 3/2015 | Vronsky et al. |
| 9,010,899 B2 | 4/2015 | Harjee et al. |
| 9,139,747 B2 | 9/2015 | Kamada |
| 9,174,433 B2 | 11/2015 | Somekh et al. |
| 9,496,519 B2 | 11/2016 | Vronsky et al. |
| 9,527,276 B2 | 12/2016 | Mala et al. |
| 9,700,908 B2 | 7/2017 | Baker et al. |
| 9,755,186 B2 | 9/2017 | Vronsky et al. |
| 9,802,403 B2 | 10/2017 | Harjee et al. |
| 9,832,428 B2 | 11/2017 | Hauf et al. |
| 9,873,273 B2 | 1/2018 | Mauck et al. |
| 9,961,782 B2 | 5/2018 | Pun et al. |
| 2001/0017703 A1 | 8/2001 | Szumla |
| 2002/0109862 A1 | 8/2002 | Hayama |
| 2002/0180816 A1 | 12/2002 | Haflinger |
| 2003/0008429 A1 | 1/2003 | Yamazaki et al. |
| 2003/0087026 A1 | 5/2003 | Dijksman et al. |
| 2003/0101421 A1 | 5/2003 | Satoh |
| 2003/0184613 A1 | 10/2003 | Nakamura et al. |
| 2003/0197747 A1 | 10/2003 | Hattori |
| 2004/0004643 A1 | 1/2004 | Satomura |
| 2004/0009309 A1 | 1/2004 | Raksha et al. |
| 2004/0019143 A1 | 1/2004 | Koloski et al. |
| 2004/0027405 A1 | 2/2004 | Stoessel et al. |
| 2004/0104951 A1 | 6/2004 | Shibata et al. |
| 2004/0169691 A1 | 9/2004 | Newsome et al. |
| 2004/0170762 A1 | 9/2004 | Newsome et al. |
| 2004/0223014 A1 | 11/2004 | Barr et al. |
| 2005/0009213 A1* | 1/2005 | Wang ............... H01L 21/288 438/5 |
| 2005/0030612 A1 | 2/2005 | Yamazaki et al. |
| 2005/0053719 A1 | 3/2005 | Ishida |
| 2005/0078133 A1 | 4/2005 | Molinet et al. |
| 2005/0140709 A1 | 6/2005 | Sekiya |
| 2005/0156176 A1 | 7/2005 | Gupta et al. |
| 2005/0200273 A1* | 9/2005 | Nozawa ............ H01L 27/3246 313/503 |
| 2005/0200684 A1 | 9/2005 | Sakurada et al. |
| 2005/0247340 A1 | 11/2005 | Zeira |
| 2006/0046347 A1 | 3/2006 | Wood et al. |
| 2006/0093751 A1 | 5/2006 | White et al. |
| 2006/0126121 A1 | 6/2006 | Chung |
| 2006/0132529 A1 | 6/2006 | Verhoest et al. |
| 2006/0144331 A1 | 7/2006 | Hanafusa et al. |
| 2006/0209347 A1 | 9/2006 | Nagaishi et al. |
| 2006/0214976 A1 | 9/2006 | Iwao et al. |
| 2007/0070099 A1 | 3/2007 | Beer et al. |
| 2007/0109342 A1 | 5/2007 | Kato |
| 2007/0109606 A1 | 5/2007 | Nagae |
| 2007/0110893 A1 | 5/2007 | Lennon et al. |
| 2007/0176173 A1 | 8/2007 | Ramakrishnan et al. |
| 2008/0024532 A1 | 1/2008 | Kim |
| 2008/0049231 A1 | 2/2008 | Bachalo et al. |
| 2008/0057260 A1* | 3/2008 | Buchhauser ........ H01L 51/5253 428/76 |
| 2008/0117247 A1 | 5/2008 | Miller et al. |
| 2008/0150419 A1 | 6/2008 | Kang |
| 2008/0158278 A1 | 7/2008 | Inoue |
| 2008/0180473 A1 | 7/2008 | Gardner et al. |
| 2008/0227663 A1 | 9/2008 | Tisone et al. |
| 2008/0278534 A1 | 11/2008 | Kim et al. |
| 2008/0305969 A1 | 12/2008 | Dijksman et al. |
| 2008/0308037 A1 | 12/2008 | Bulovic et al. |
| 2008/0309698 A1 | 12/2008 | Nakano et al. |
| 2008/0317941 A1 | 12/2008 | Hanaoka |
| 2009/0096823 A1 | 4/2009 | Watt et al. |
| 2009/0096825 A1* | 4/2009 | Takahashi ............ B41J 2/2132 347/12 |
| 2009/0117261 A1 | 5/2009 | Sakai |
| 2009/0184990 A1 | 7/2009 | Shang et al. |
| 2009/0191342 A1 | 7/2009 | Chu et al. |
| 2009/0197013 A1* | 8/2009 | Gouch ................ B41C 1/003 427/558 |
| 2009/0274833 A1 | 11/2009 | Li et al. |
| 2009/0322828 A1 | 12/2009 | Kim et al. |
| 2010/0024725 A1 | 2/2010 | Lennon et al. |
| 2010/0066779 A1 | 3/2010 | Gothait et al. |
| 2010/0089636 A1* | 4/2010 | Ramadas ............. B82Y 15/00 174/521 |
| 2010/0090582 A1 | 4/2010 | Dkishiro et al. |
| 2010/0166950 A1 | 7/2010 | Nieminen |
| 2010/0184244 A1 | 7/2010 | Hunt |
| 2010/0201749 A1* | 8/2010 | Somekh ............ B05B 17/0638 347/56 |
| 2010/0231672 A1 | 9/2010 | Joyce et al. |
| 2010/0311298 A1 | 12/2010 | Suzuki et al. |
| 2011/0032297 A1 | 2/2011 | Mitsuzawa |
| 2011/0084290 A1 | 4/2011 | Nakamura et al. |
| 2011/0087718 A1 | 4/2011 | Srinivasan et al. |
| 2011/0121021 A1 | 5/2011 | Dudenhoefer et al. |
| 2011/0222126 A1 | 9/2011 | Asai et al. |
| 2011/0267390 A1 | 11/2011 | Bulovic et al. |
| 2011/0279544 A1 | 11/2011 | Dovrat et al. |
| 2012/0056923 A1 | 3/2012 | Vronsky et al. |
| 2012/0058251 A1 | 3/2012 | Yamazaki |
| 2012/0069076 A1 | 3/2012 | Higuchi |
| 2012/0139984 A1 | 6/2012 | Lang |
| 2012/0256981 A1 | 10/2012 | Matsuo |
| 2012/0306951 A1 | 12/2012 | Somekh et al. |
| 2012/0308252 A1 | 12/2012 | Shimura |
| 2012/0309252 A1 | 12/2012 | Takeuchi |
| 2013/0026533 A1 | 1/2013 | Lee |
| 2013/0057879 A1 | 3/2013 | Takagi et al. |
| 2013/0120485 A1 | 5/2013 | Kodama et al. |
| 2013/0127030 A1 | 5/2013 | Gong et al. |
| 2013/0168664 A1 | 7/2013 | Crankshaw |
| 2013/0206058 A1 | 8/2013 | Mauck et al. |
| 2013/0252533 A1 | 9/2013 | Mauck et al. |
| 2013/0286075 A1 | 10/2013 | Blessing et al. |
| 2013/0307898 A1 | 11/2013 | Somekh et al. |
| 2014/0055513 A1 | 2/2014 | Usui |
| 2014/0117316 A1 | 5/2014 | Choi |
| 2014/0165864 A1 | 6/2014 | Oppenheim |
| 2014/0184683 A1 | 7/2014 | Harjee et al. |
| 2014/0210886 A1 | 7/2014 | Driggers et al. |
| 2015/0171368 A1 | 6/2015 | Vronsky et al. |
| 2017/0054078 A1 | 2/2017 | Vronsky et al. |
| 2017/0084882 A1 | 3/2017 | Vronsky et al. |
| 2017/0140999 A1 | 5/2017 | Vronsky et al. |
| 2017/0141353 A1 | 5/2017 | Vronsky et al. |
| 2017/0141357 A1 | 5/2017 | Vronsky et al. |
| 2018/0008995 A1 | 1/2018 | Baker et al. |
| 2018/0061719 A1 | 3/2018 | Vronsky et al. |
| 2018/0146162 A1 | 5/2018 | Hauf et al. |
| 2019/0074484 A1 | 3/2019 | Harjee et al. |

FOREIGN PATENT DOCUMENTS

| | | |
|---|---|---|
| CN | 1366007 A | 8/2002 |
| CN | 1430554 A | 7/2003 |
| CN | 1473707 A | 2/2004 |
| CN | 1476973 A | 2/2004 |
| CN | 1503338 A | 6/2004 |
| CN | 1513214 A | 7/2004 |
| CN | 1572497 A | 2/2005 |
| CN | 1607378 A | 4/2005 |
| CN | 1668164 A | 9/2005 |

(56) References Cited

FOREIGN PATENT DOCUMENTS

| | | |
|---|---|---|
| CN | 1985366 A | 6/2007 |
| CN | 101020386 A | 8/2007 |
| CN | 101024334 A | 8/2007 |
| CN | 101202328 A | 6/2008 |
| CN | 101222026 A | 7/2008 |
| CN | 101301814 A | 11/2008 |
| CN | 101326060 A | 12/2008 |
| CN | 101498856 A | 8/2009 |
| CN | 101533894 A | 9/2009 |
| CN | 101544107 A | 9/2009 |
| CN | 101027186 B | 12/2010 |
| CN | 101950771 A | 1/2011 |
| CN | 101256092 B | 2/2011 |
| CN | 102107555 A | 6/2011 |
| CN | 1753600 B | 8/2011 |
| CN | 102189790 A | 9/2011 |
| CN | 101648458 B | 2/2012 |
| CN | 102343712 A | 2/2012 |
| CN | 102431293 A | 5/2012 |
| CN | 101743125 B | 7/2013 |
| CN | 103241025 A | 8/2013 |
| CN | 102555467 B | 7/2015 |
| CN | 103026789 A | 1/2016 |
| CN | 102597133 B | 10/2018 |
| EP | 0976567 A2 | 2/2000 |
| EP | 0902315 B1 | 4/2003 |
| EP | 0880303 B1 | 1/2004 |
| EP | 0887199 B1 | 3/2004 |
| EP | 1211916 B1 | 8/2006 |
| EP | D863478 B1 | 9/2006 |
| EP | D863004 B2 | 7/2011 |
| EP | 1874551 B1 | 11/2012 |
| EP | 1376716 B1 | 8/2013 |
| JP | H0578655 A | 3/1993 |
| JP | H06308312 A1 | 11/1994 |
| JP | H07169567 A | 7/1995 |
| JP | H07235378 A | 9/1995 |
| JP | H07294916 A | 11/1995 |
| JP | H10138475 A | 5/1998 |
| JP | H10012377 A1 | 6/1998 |
| JP | F10193587 A | 7/1998 |
| JP | 2991270 B2 | 12/1999 |
| JP | 2000062158 A | 2/2000 |
| JP | 3036436 B2 | 4/2000 |
| JP | 2000207543 A | 7/2000 |
| JP | 2000309123 A | 11/2000 |
| JP | 2001038892 A | 2/2001 |
| JP | 2001071476 A | 3/2001 |
| JP | 2001121722 A1 | 5/2001 |
| JP | 2001138590 A | 5/2001 |
| JP | 2001162840 A1 | 9/2001 |
| JP | 2002323615 A1 | 11/2002 |
| JP | 2003014442 A | 1/2003 |
| JP | 2003127430 A | 5/2003 |
| JP | 2003161824 A | 6/2003 |
| JP | 2003217840 A | 7/2003 |
| JP | 2003249355 A1 | 9/2003 |
| JP | 2003272847 A | 9/2003 |
| JP | 2003311943 A | 11/2003 |
| JP | 2003338370 A | 11/2003 |
| JP | 2004058627 A | 2/2004 |
| JP | 2004106511 A | 4/2004 |
| JP | 2004148750 A | 5/2004 |
| JP | 2004209412 A | 7/2004 |
| JP | 2004267874 A | 9/2004 |
| JP | 2004295092 A | 10/2004 |
| JP | 2004337709 A | 12/2004 |
| JP | 2005502987 A | 1/2005 |
| JP | 2005044613 A | 2/2005 |
| JP | 2005131606 A | 5/2005 |
| JP | 2005183184 A | 7/2005 |
| JP | 2005193104 A1 | 7/2005 |
| JP | 3679987 B2 | 8/2005 |
| JP | 2005296904 A * | 10/2005 |
| JP | 2005296904 A | 10/2005 |
| JP | 2006021146 A | 1/2006 |
| JP | 2006047803 A | 2/2006 |
| JP | 2006170910 A | 6/2006 |
| JP | 2006212501 A | 8/2006 |
| JP | 2007117833 A | 5/2007 |
| JP | 2007207762 A | 8/2007 |
| JP | 2007299725 A | 11/2007 |
| JP | 4027552 B2 | 12/2007 |
| JP | 2003217840 B | 1/2008 |
| JP | 2008004817 A | 1/2008 |
| JP | 2008123993 A | 5/2008 |
| JP | 2008233833 A | 10/2008 |
| JP | 2008540118 A | 11/2008 |
| JP | 2008296547 A | 12/2008 |
| JP | 2009093189 A | 4/2009 |
| JP | 2009117141 A | 5/2009 |
| JP | 4273819 B2 | 6/2009 |
| JP | 2002225259 A1 | 8/2009 |
| JP | 2009189954 A | 8/2009 |
| JP | 2009291710 A | 12/2009 |
| JP | 2010005593 A | 1/2010 |
| JP | 2010115650 A | 5/2010 |
| JP | 2010204189 A | 9/2010 |
| JP | 2011005453 A | 1/2011 |
| JP | 2011508062 A | 3/2011 |
| JP | 2011215173 A | 10/2011 |
| JP | 2011255366 A | 12/2011 |
| JP | 2012116188 A | 6/2012 |
| JP | 2012160858 A | 8/2012 |
| JP | 2012173504 A | 9/2012 |
| JP | 2012245671 A | 12/2012 |
| JP | 2013030571 A | 2/2013 |
| JP | 2013052614 A | 3/2013 |
| JP | 2013225671 A | 10/2013 |
| JP | 2013228368 A | 11/2013 |
| JP | 2014034205 A | 2/2014 |
| JP | 2014502931 A | 2/2014 |
| JP | 2014083748 A | 5/2014 |
| JP | 2017521030 A | 7/2017 |
| KR | 1020040067140 A | 7/2004 |
| KR | 10-2008-0031666 A | 4/2008 |
| KR | 1020080031666 A | 4/2008 |
| KR | 20080102829 A | 11/2008 |
| KR | 1020080102829 A | 11/2008 |
| KR | 20110110275 A | 10/2011 |
| KR | 20120132360 A | 12/2012 |
| TW | 200426036 A | 12/2004 |
| TW | I1548530 | 9/2016 |
| WO | 2007138818 A1 | 12/2007 |
| WO | 2008059276 A2 | 5/2008 |
| WO | 2008131383 A1 | 10/2008 |
| WO | 2010011298 A1 | 1/2010 |
| WO | 2010014061 A1 | 2/2010 |
| WO | 2010090080 A1 | 8/2010 |
| WO | 2012093086 A1 | 7/2012 |
| WO | 2012164628 A1 | 12/2012 |
| WO | 2013019466 A1 | 2/2013 |
| WO | 2013088430 A1 | 6/2013 |
| WO | 2013099276 A1 | 7/2013 |

OTHER PUBLICATIONS

JP2005296904, 2005, Machine Translation. (Year: 2005).*
CN First Office Action dated Oct. 24, 2016 for CN Application No. 201480067970.1. English Translation submitted with parent U.S. Appl. No. 15/279,261 on Feb. 22, 2017.
Gao et al., "The Physics of Digital Microfabrication with Molten Microdrops," 1993, Solid Freeform Fabrication—Conference, 4.sup.th Symposium, Solid freeform fabrication, University of Texas, pp. 237-244.
Informal Comments filed on Dec. 21, 2014 for the International Search and Written Opinion for PCT Application No. PCT/US2014/050749.
International Search Report and Written Opinion dated Nov. 14, 2014 for PCT Application No. PCT/US2014/050749.
Jabbour, Ghassan E., "Printing Techniques in Organic Based Optoelectronics," Semiconductor Device Research Symposium, 2001 International, Dec. 5-7, 2001.

(56) References Cited

OTHER PUBLICATIONS

Lee et al., "Fabrication of Organic Light Emitting Display Using Inkjet Printing Technology," Optomechatronic Technologies, 2009. ISOT 2009. International Symposium, Sep. 21-23, 2009, pp. 71-76.
Moon et al., "Fabrication of Functionality Graded Reaction infiltrated SIC-Si Composite by Three-Dimensional Printing(3DTM) process" Materials Science and Engineering, vol. 298, 2001, p. 110-119.
Non-Final Office action dated May 12, 2017 to U.S. Appl. No. 15/416,931.
Non-Final Office action dated Sep. 14, 2017, to U.S. Appl. No. 15/416,872.
Notice of Allowance dated Aug. 26, 2016 to U.S. Appl. No. 14/627,186.
Notice of Allowance dated Aug. 29, 2017, to U.S. Appl. No. 15/279,261.
Notice of Allowance dated Jul. 26, 2017, to U.S. Appl. No. 15/417,020.
Notice of Allowance dated Mar. 23, 2017, to U.S. Appl. No. 15/417,020.
Notice of Allowance dated Sep. 27, 2017 to U.S. Appl. No. 15/416,931.
Notice of Allowance dated Sep. 28, 2016 to U.S. Appl. No. 14/627,186.
Notice of Allowance dated Sep. 5, 2017, to U.S. Appl. No. 15/367,064.
Notice of Allowance issued to U.S. Appl. No. 14/458,005, dated Jan. 16, 2015.
Office action dated Jun. 14, 2017, to JP Patent Application No. 2016-526020. English Translation submitted with parent U.S. Appl. No. 15/279,261 on Sep. 18, 2017.
Request for Re-examination and response filed on Sep. 6, 2017, for the office action dated Aug. 16, 2017, to TW Patent Application No. 103141158. English Translation submitted with parent U.S. Appl. No. 15/279,261 on Aug. 18, 2017.
Response filed on Jun. 8, 2017, to the TW Official Letter dated Dec. 9, 2016 for TW Application No. 103141158. Reference with translation is attached.
Supplemental Notice of Allowance dated Oct. 13, 2016 to U.S. Appl. No. 14/627,186.
TW Official Letter dated Dec. 9, 2016 for TW Application No. 103141158. English Translation submitted with parent U.S. Appl. No. 15/279,261 on Aug. 18, 2017.
TW Second Official Action dated Aug. 15, 2017, to TW Patent Application No. 103141158. English Translation submitted with parent U.S. Appl. No. 15/279,261 on Sep. 27, 2017.
Zhou et al, "Three Dimensional Digital Halftoning for Layered Manufacturing Based on Droplets," Transactions of NAMRI/SME, vol. 36, 2009, pp. 175-182.
Corrected Notice of Allowance dated Feb. 27, 2019, to U.S. Appl. No. 15/361,845.
Examination report dated Jan. 22, 2019, to TW Patent Application No. 107141748.
Office action dated Dec. 12, 2018, to CN Patent Application No. 201711129386.6.
Office action dated Dec. 3, 2018, to CN Patent Application No. 201711129373.9.
Office action dated Dec. 3, 2018, to CN Patent Application No. 201711259332.1.
Office action dated Nov. 30, 2018, to CN Patent Application No. 201711129365.4.
Corrected Notice of Allowance dated Apr. 2, 2019 in U.S. Appl. No. 15/361,845.
Corrected Notice of Allowance dated Mar. 13, 2019 in U.S. Appl. No. 15/361,845.
Decision to Grant dated May 24, 2019 in Korean Application No. 10-2018-7033028.
Examiner Initiated Interview Summary dated Mar. 22, 2019 in U.S. Appl. No. 15/802,325.
Notice of Allowance dated Apr. 11, 2019 in U.S. Appl. No. 15/802,325.
Notice of Allowance dated Apr. 16, 2019 in U.S. Appl. No. 15/716,753.
Notice of Allowance dated Apr. 3, 2019 in U.S. Appl. No. 15/416,872.
Notice of Allowance dated Mar. 22, 2019 in U.S. Appl. No. 15/802,325.
Notice of Allowance dated May 30, 2019 in Taiwanese Patent Application No. 107141748.
Office Action dated Apr. 2, 2019 in Japanese Application No. 2017-521030.
Office Action dated Feb. 2, 2019 in Chinese Patent Application No. 201700029371.X.
Office Action dated Apr. 15, 2019 in Japanese Patent Application No. 2018-107021.
Office Action dated Feb. 27, 2019 in Japanese Patent Application No. 2018-92037.
Office Action dated Feb. 27, 2019 in Japanese Patent Application No. 2018-92039.
Office Action dated Jan. 16, 2019 in Chinese Patent Application No. 201711258756.6.
Office Action dated Jan. 31, 2019 in Chinese Patent Application No. 201711259406.1.
Office Action dated Apr. 25, 2019 for Japanese Patent Application 2018-089271.
Office action dated Dec. 17, 2018, to CN Patent Application No. 201711129340.4.
Office action dated Dec. 18, 2018, to CN Patent Application No. 201711129387.0.
Provisional Rejection dated Feb. 13, 2019 to KR Patent Application No. 10-2017-7011557.
Final Office Action dated Apr. 11, 2018, to U.S. Appl. No. 15/416,872.
Non-Final Office action dated Sep. 28, 2018, to U.S. Appl. No. 15/716,753.
Notice of Allowance dated Jul. 13, 2018, to U.S. Appl. No. 15/416,872.
Office action dated Jan. 11, 2018, to JP Patent Application No. 2016-526020.
Office action dated Sep. 3, 2018, to JP Patent Application No. 2017-160095.
EP Extended Search Report dated Dec. 21, 2018, EP18188398.4.
Non-final Office action dated Nov. 28, 2018, to U.S. Appl. No. 15/802,325.
Notice of Allowance dated Jan. 3, 2019, to U.S. Appl. No. 15/416,872.
Notice of Allowance dated Nov. 16, 2018 to U.S. Appl. No. 15/361,845.
Notice of Final Refusal dated Oct. 18, 2018, to KR Patent Application No. 10-2016-7018761.
Penultimate Office action dated Nov. 2, 2018, for JP Patent Application 2016-510764.
Provisional Rejection dated Nov. 30, 2018, to KR Patent Application No. 10-2018-7033028.
Office action dated Dec. 27, 2018, to CN Patent Application No. 201711129372.4.
BASF Group, "PEG200DMA Brochure" Sep. 2016.
EP Extended Search Report dated Mar. 9, 2018, to EP Patent Application No. 15838945.2.
EP Extended Search Report dated May 7, 2018 to EP Patent Application No. 15815375.9.
Examination Report dated Jan. 11, 2018, to TW Patent Application No. 103114950.
Final Official Action dated Feb. 2, 2018, to JP Patent Application No. 2016-096406.
Notice of Allowance dated Jun. 28, 2018, to U.S. Appl. No. 15/361,845.
Notice of Allowance dated Jun. 29, 2018 to U.S. Appl. No. 15/416,931.
Notice of Allowance dated May 11, 2018 to U.S. Appl. No. 15/607,137.
Notice of Allowance dated May 11, 2018 to U.S. Appl. No. 15/361,845.
Notice of Allowance dated Sep. 14, 2018 to U.S. Appl. No. 15/361,845.
Notice of Allowance dated Sep. 19, 2017, to U.S. Appl. No. 15/361,845.

(56) References Cited

OTHER PUBLICATIONS

Notification of First Refusal dated Jun. 22, 2018, to KR Patent Application No. 10-2016-7018761.
Provisional Rejection dated Feb. 28, 2018, to KR Patent Application No. 10-2016-7018761.
Seelig, et al., Webpage "Go with the Flow: Paste viscosity can inform why solder performs one way in high-volume production and another under high-mix conditions," 2017.
TW Office Action Rejection dated Aug. 3, 2018, for TW Patent Application No. 106140977.
Examiner Interview Summary dated Sep. 27, 2017 in U.S. Appl. No. 15/416,931.
Extended European Search Report dated Jan. 3, 2018, to EP Patent Application No. 14870074.3.
Final Office Action issued Nov. 25, 2019 in U.S. Appl. No. 15/607,137.
First Examination Report dated Sep. 20, 2019 in EP Patent Application No. 14787652.8.
Official Action dated Jul. 31, 2019 in JP Patent Application No. 2018-160163.
Notice of Final Rejection dated Jul. 12, 2019 in KR Patent Application No. 10-2018-7034202.
Non-Final Office Action dated Dec. 29, 2017 U.S. Appl. No. 15/361,845.
Non-Final Office Action dated Oct. 18, 2019 in U.S. Appl. No. 16/174,063.
Notice of Allowance dated Jan. 8, 2020 in U.S. Appl. No. 15/416,931.
Notice of Allowance dated Nov. 1, 2019 in U.S. Appl. No. 15/361,845.
Notice of Allowance dated Oct. 4, 2017 in U.S. Appl. No. 14/840,343.
Notice of Allowance dated Sep. 19, 2019 in U.S. Appl. No. 15/416,872.
Notice of Allowance dated Sep. 20, 2019 in U.S. Appl. No. 15/802,325.
Notice of Allowance dated Sep. 25, 2019 in U.S. Appl. No. 15/716,753.
Notice of Final Refusal dated Nov. 12, 2019 in KR Patent Application No. 10-2018-7034202.
Office Action dated Dec. 4, 2017 in JP Patent Application No. 2016-510764.
Official Action dated Oct. 30, 2019 in JP Patent Application No. 2018-92039.
Official Action dated Aug. 30, 2019 in JP Patent Application No. 2017-511904.
Official Action dated Dec. 3, 2019 in JP Patent Application No. 2017-521030.
Penultimate Office Action dated Oct. 21, 2019 in JP Patent Application No. 2018-107021.
Provisional Rejection issued Oct. 21, 2019 in KR Patent Application No. 10-2019-7029829.
Provisional Rejection Issued on Oct. 18, 2019 in KR Patent Application No. 10-2019-7024989.
Examination Report dated Jan. 11, 2018 in TW Patent Application No. 103114950.
Second Office Action dated Nov. 18, 2019 in CN Patent Application No. 201711258771.0.
Second Office Action dated Aug. 22, 2019 in CN Patent Application No. 201711129365.4.
Second Office Action dated Aug. 28, 2019 in CN Patent Application No. 201711129386.6.
Second Office Action dated Aug. 6, 2019 in CN Patent Application No. 201711129373.9.
Second Office Action dted Oct. 9, 2019 in CN Patent Application No. 201711259406.1.
Second Office Action dated Sep. 6, 2019 in CN Patent Application No. 201711129340.4.
Third Office Action dated Nov. 27, 2019 in CN Patent Application No. 201711129387.0.
First Office Action dated Jul. 2, 2019 in CN Patent Application No. 201810315491.7.
General Guidelines on Drop Size measurement Techniques and Terminology (1997).
Second Office Action dated Jul. 17, 2019 for CN Application 201711259332.1.
Second Office Action dated Aug. 30, 2019 to CN Application 201711258756.6.
Schiaffino, Stefano, "The Fundamentals of Molten Microdrop Deposition and Solidification," Aug. 7, 1996, Massachusetts Institute of Technology, 215 pages.
Provisional Rejection issued on Mar. 28, 2019 in KR Patent Application No. 10-2018-7034202.
Official Letter dated Jun. 3, 2019 in TW Patent Application No. 107144110.
Official Letter dated Jul. 9, 2019 in TW Patent Application No. 106140977.
Official Action dated Aug. 2, 2019 in JP Patent Application No. 2018-106102.
Office Action dated Jun. 14, 2017 in JP Patent Application No. 2016-526020.
Office Action dated Apr. 8, 2019 in CN Patent Application No. 201711129362.0.
Notice of Allowance dated Jun. 4, 2019 in U.S. Appl. No. 15/802,325.
Notice of Allowance dated Jan. 16, 2015 in U.S. Appl. No. 14/458,005.
Notice of Allowance dated Sep. 5, 2017 in U.S. Appl. No. 15/367,064.
Notice of Allowance dated Sep. 28, 2016 in U.S. Appl. No. 14/627,186.
Non Final Office Action dated Jul. 23, 2019 in U.S. Appl. No. 15/795,664.
Non Final Office Action dated Jul. 11, 2019 in U.S. Appl. No. 15/607,137.
Examination Report datd Jul. 17, 2019 in EP Patent Application No. 14870074.3.
Final Office Action dated Jul. 1, 2019 for JP Application No. 2016-510764.
Non Final Office Action dated Apr. 3, 2020 to U.S. Appl. No. 15/716,753.
Non Final Office Action dated Mar. 27, 2020 to U.S. Appl. No. 15/607,137.
Notice of Allowance dated Mar. 13, 2020 to U.S. Appl. No. 15/795,664.
Notice of Allowance dated Jan. 28, 2020 to U.S. Appl. No. 16/174,063.
Third Office Action dated Mar. 18, 2020 to CN Patent Application No. 201711129365.4.
Notification of Reason for Refusal dated Jan. 29, 2022 to KR Patent Application No. 10-2022-7000080.
Notice of Allowance dated Jul. 10, 2019 for U.S. Appl. No. 15/716,753.
Notice of Allowance dated Jun. 12, 2019 for U.S. Appl. No. 15/416,872.
Notice of Allowance dated Sep. 13, 2019 for U.S. Appl. No. 15/416,931.
Notice of Allowance dated Jun. 4, 2019 for U.S. Appl. No. 15/802,325.
Notice of First Refusal dated Jul. 12, 2019 to KR Patent Application No. 10-2018-7034202.
Office Action dated Apr. 8, 2019 for CN Patent Application No. 201711129362.0.
Official Action dated Aug. 2, 2019 to JP Patent Application No. 2018-106102.
Official Action dated Aug. 28, 2019 for JP Patent Application No. 2017-511904.
Official Action dated Jul. 31, 2019 for JP Patent Application No. 2018-160163.
Official Letter dated Jul. 8, 2019 to TW Patent Application No. 106140977.
Official Letter dated May 30, 2019 to TW Patent Application No. 107144110.
Second Office Action dated Aug. 30, 2019 to CN Patent Application No. 201711258756.6.
Second Office Action dated Jul. 17, 2019 for CN Patent Application No. 201711259332.1.
Examination Report dated Apr. 8, 2020 to TW Patent Application No. 109101918.

(56) References Cited

OTHER PUBLICATIONS

Examination Report dated Feb. 10, 2020 to TW Patent Application No. 108109190
Examination Report dated Jun. 17, 2020 to EP Patent Application No. 18188398.4.
Examination Report dated Mar. 31, 2020 to EP Patent Application No. 15815375.9.
Examination Report dated Oct. 16, 2019 to TW Patent Application No. 108109190.
International Search Report and Written Opinion dated Apr. 30, 2014 for PCT Application No. PCT/US2013/077720.
International Search Report and Written Opinion dated Dec. 11, 2015 for PCT Application No. PCT/US15/47687.
International Search Report and Written Opinion dated Oct. 6, 2015 to PCT Application No. PCT/US15/38693.
Non-Final Office Action dated Jun. 11, 2020 to U.S. Appl. No. 16/536,654.
Non-Final Office Action dated May 28, 2020 to U.S. Appl. No. 16/356,430.
Non-Final Office Action dated Nov. 3, 2016 for U.S. Appl. No. 14/788,609.
Notice of Allowance dated Jun. 10, 2020 to U.S. Appl. No. 15/795,664.
Notice of First Refusal dated Apr. 20, 2020 to KR Patent Application No. 10-2019-7024989.
Notice of First Refusal dated May 25, 2020 to KR Patent Application No. 10-2019-7031616.
Notification of a Second Provisional Rejection dated May 31, 2016 to KR Patent Application No. 10-2015-7020356.
Official Action dated Apr. 1, 2020 to JP Patent Application No. 2018-106102.
Official Action dated Jan. 6, 2020 to JP Patent Application No. 2018-89271.
Penultimate Office Action dated Feb. 4, 2020 to JP Patent Application No. 2018-107021.
Penultimate Office Action dated Mar. 4, 2020 to JP Patent Application No. 2017-511904.
Provisional Rejection dated Apr. 24, 2020 to KR Patent Application No. 10-2020-7010901.
Provisional Rejection dated Jun. 9, 2020 to KR Patent Application No. 10-2017-7002764.
Provisional Rejection dated Jan. 20, 2020 to KR Patent Application No. 10-2019-7031616.
Second Examination Report dated May 4, 2020 to EP Patent Application No. 14787652.8.
Second Office Action dated Nov. 25, 2019 to CN Patent Application No. 201810315491.7.
Second Office Action dated Sep. 26, 2016 to CN Patent Application No. 201380073929.0.
Third Office Action dated Jan. 16, 2020 to CN Patent Application No. 201711258756.6.
Third Office Action dated Mar. 6, 2020 to CN Patent Application No. 201810315491.7.
Ulichney, Robert, "A Review of Halftoning Techniques," 2000, Society of Photographic Instrementation Engineers (SPIE), vol. 3963, pp. 379-391.
Final Rejection dated Sep. 18, 2020 to JP Patent Application No. 2017-511904.
Office Action dated Sep. 25, 2020 to TW Patent Application No. 109101918.
Final Office Action dated Nov. 12, 2020 to U.S. Appl. No. 16/356,430.
Non-Final Office Action dated Nov. 17, 2020 to U.S. Appl. No. 16/546,006.
Notice for Reason of Refusal dated Dec. 14, 2020 to JP Patent Application No. 2019-199806.
Provisional Rejection dated Jan. 4, 2021 to KR Patent Application No. 10-2019-7036003.
Second Office Action dated Jul. 15, 2019 to CN Patent Application No. 201711129387.0.
Non-Final Office Action dated Nov. 17, 2020 for U.S. Appl. No. 16/546,006.
Notice of Allowance dated Apr. 8, 2021 to U.S. Appl. No. 16/546,006.
Notice of Allowance dated Oct. 13, 2021 to U.S. Appl. No. 16/356,430.
Provisional Rejection dated Mar. 5, 2021 to KR Patent Application 10-2021-7005418.
Second Examination Report dated Feb. 17, 2021 to EP Patent Application 18188398.4.
Second Office Action dated Apr. 1, 2021 to CN Patent Application No. 201910670338.0.
Supplemental Notice of Allowability dated May 4, 2021 to U.S. Appl. No. 16/546,006.
Notice of Allowance issued on Jun. 1, 2020 to U.S. Appl. No. 15/361,845.
Notice of Allowance dated Jun. 9, 2021 for U.S. Appl. No. 15/607,137.
Notice of Final Rejection dated Jul. 29, 2021 in KR Patent Application No. 10-2020-7027595.
Notice of Reason for Refusal dated Jun. 4, 2021 in JP Patent Application No. 2020148805.
Notice of Allowance dated Sep. 15, 2021 in U.S. Appl. No. 16/947,880.
Notice of Final Rejection dated Jul. 21, 2021 in KR Patent Application No. 10-2019-7036003.
Official Letter dated Aug. 25, 2021 to TW Patent Application No. 110106747.

\* cited by examiner

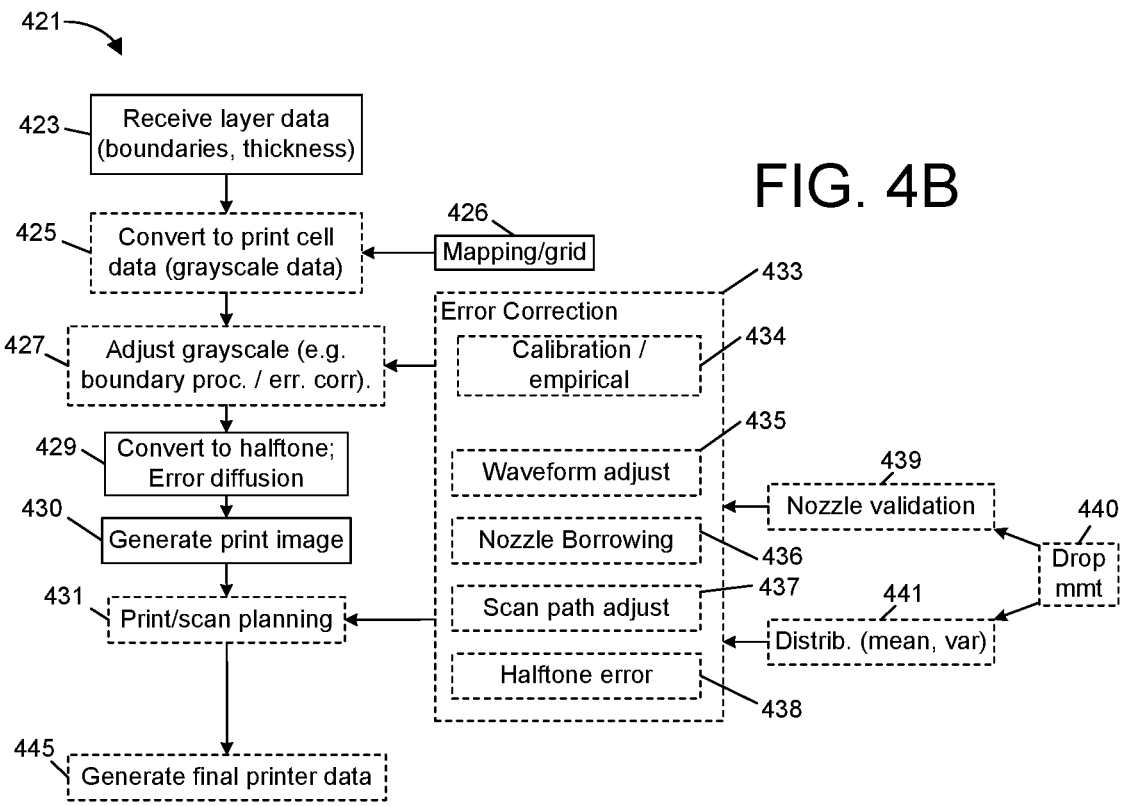
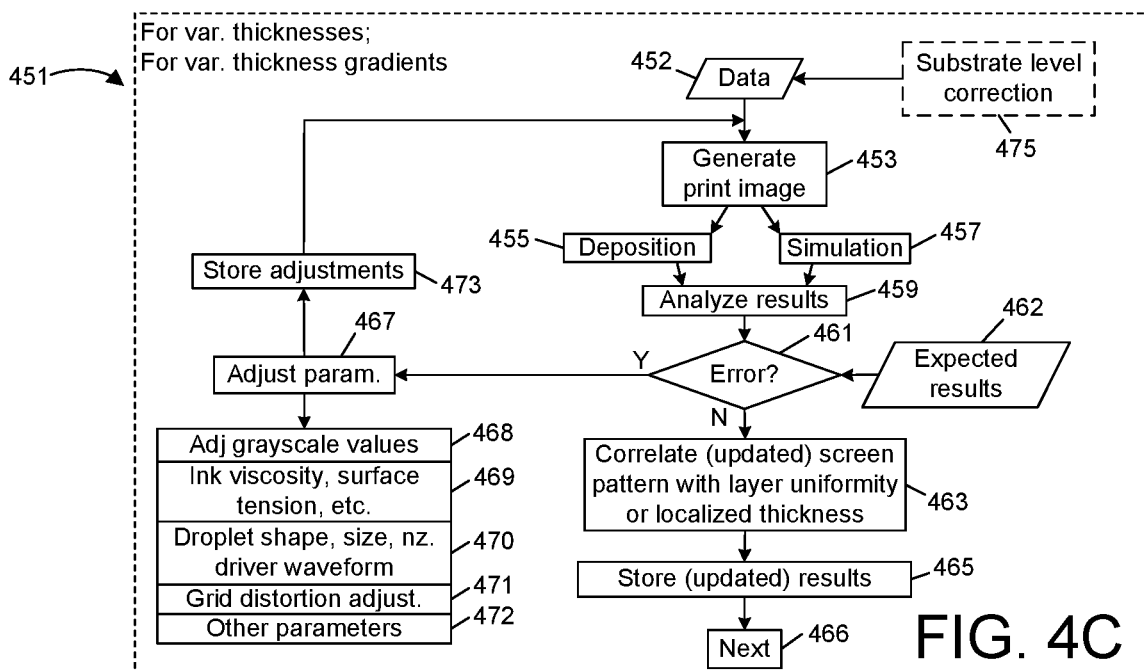

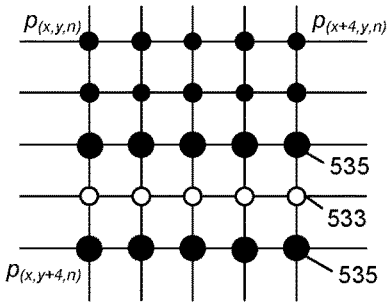
FIG. 5E
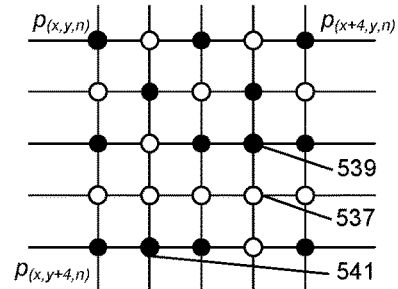
FIG. 5F
FIG. 6A
FIG. 6B
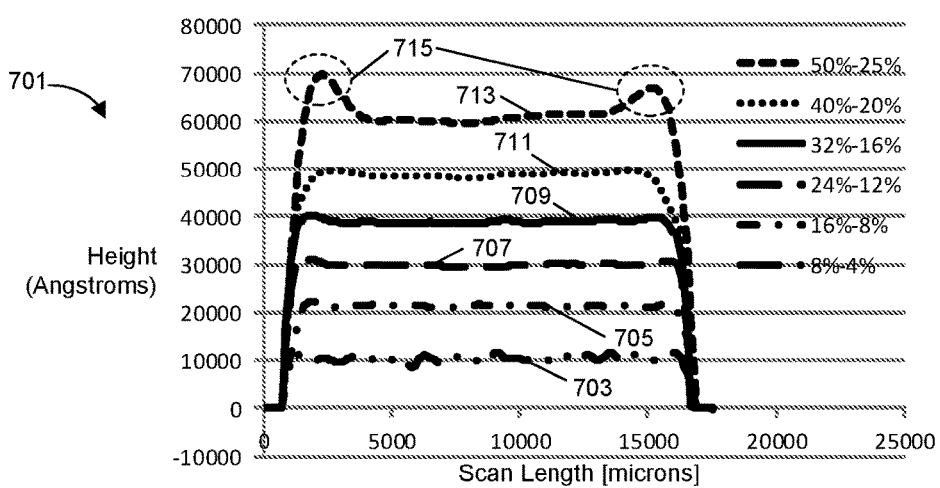
FIG. 7A

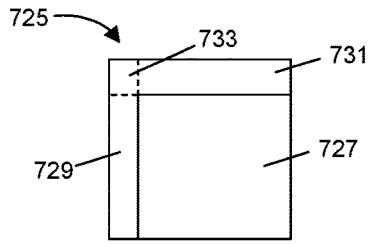
FIG. 7B
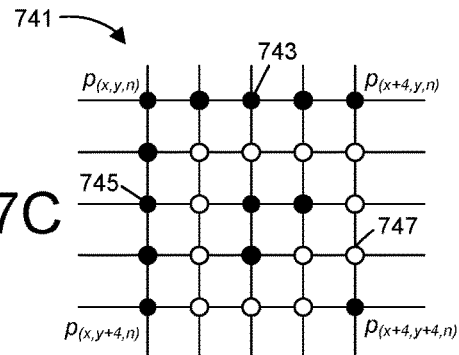
FIG. 7C
FIG. 7D
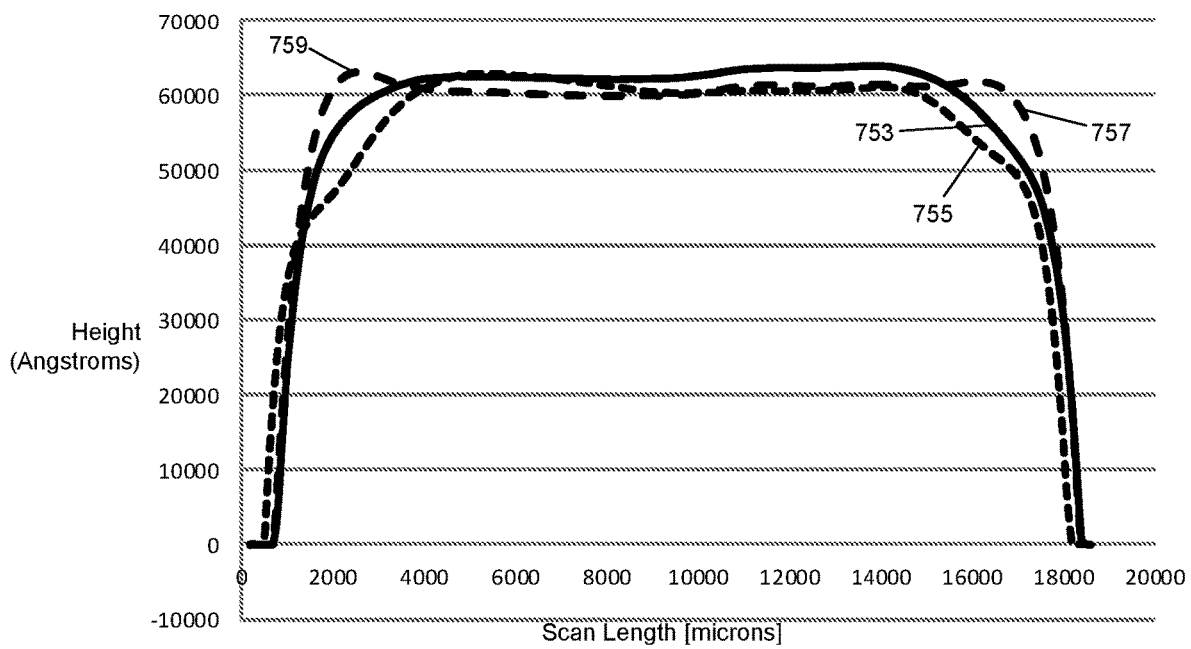
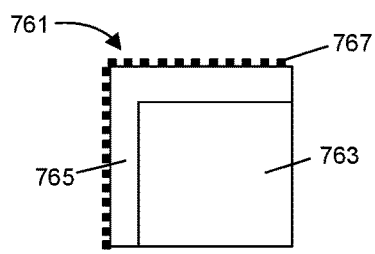
FIG. 7E

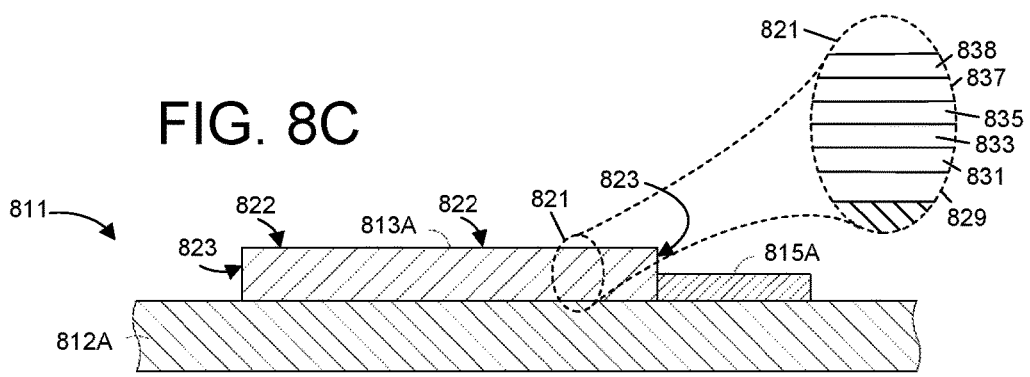
FIG. 8C
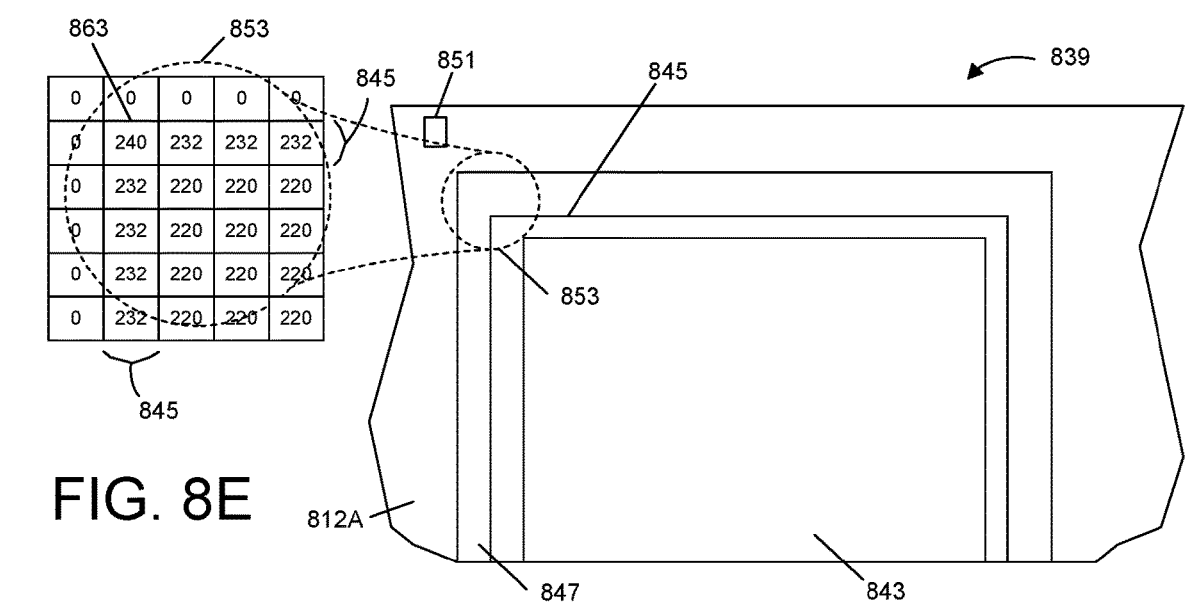
FIG. 8D
FIG. 8E

TECHNIQUES FOR LAYER FENCING TO IMPROVE EDGE LINEARITY

This application is a continuation of U.S. Utility application Ser. No. 15/416,931, filed on behalf of first-named inventor Eliyahu Vronsky on Jan. 26, 2017 for "Techniques For Edge Management Of Printed Layers In A Flat Panel Display," which in turn is a continuation of U.S. Utility application Ser. No. 15/279,261, filed on behalf of first-named inventor Eliyahu Vronsky on Sep. 28, 2016 for "Techniques For Edge Management Of Printed Layers In A Flat Panel Display," which in turn is a continuation of U.S. Utility application Ser. No. 14/627,186, filed on behalf of first-named inventor Eliyahu Vronsky on Feb. 20, 2015 for "Ink-Based Layer Fabrication Using Halftoning To Control Thickness" (issued on Nov. 15, 2016 as U.S. Pat. No. 9,496,519), which in turn is a continuation of U.S. Utility application Ser. No. 14/458,005, filed on behalf of first-named inventor Eliyahu Vronsky on Aug. 12, 2014 for "Ink-Based Layer Fabrication Using Halftoning To Control Thickness" (issued on Mar. 31, 2015 as U.S. Pat. No. 8,995,022). U.S. Utility application Ser. No. 14/458,005 in turn claims priority to each of U.S. Provisional Application No. 62/019,076, filed on behalf of first-named inventor Eliyahu Vronsky on Jun. 30, 2014 for "Ink-Based Layer Fabrication Using Halftoning to Control Thickness," U.S. Provisional Application No. 62/005,044, filed on behalf of first-named inventor Eliyahu Vronsky on May 30, 2014 for "Ink-Based Layer Fabrication Using Halftoning to Control Thickness," U.S. Provisional Application No. 61/977,939, filed on behalf of first-named inventor Eliyahu Vronsky on Apr. 10, 2014 for "Ink-Based Layer Fabrication Using Halftoning to Control Thickness," and U.S. Provisional Application No. 61/915,149, filed on behalf of first-named inventor Eliyahu Vronsky on Dec. 12, 2013 for "Ink-Based Layer Fabrication Using Halftone Variation." Priority is claimed to each of the aforementioned applications and each of the aforementioned applications is hereby incorporated by reference.

BACKGROUND

Various chemical and physical deposition processes can be used to deposit materials over a substrate. Some deposition processes rely on patterned deposition, where a mask or other mechanism is used to create nanoscale features within precise tolerances, for example, matching dimensions of electronic nanoscale structures such as transistor path widths, while other deposition processes provide relatively featureless, large scale deposition, such as blanket based coatings or depositions that span tens of microns of distance or more.

There exists a class of fabrication applications for which existing processes are suboptimal. More specifically, for applications where one desires to form a layer over a large region of the substrate relative to nanoscale features, particularly for organic materials deposition, it can be difficult to control uniformity of the deposited layer.

BRIEF DESCRIPTION OF THE DRAWINGS

FIG. 2C shows how a print head 259 is moved relative to a substrate 253.

FIG. 4B provides another flow chart used to describe conversion of data representing thickness of a desired layer to a halftone image.

FIG. 4C is a flow diagram associated with halftoning calibration.

FIG. 5B is used, relative to the halftone pattern of FIG. 5A, to discuss frequency modulated ("FM") halftoning.

FIG. 5C is used, relative to the halftone pattern of FIG. 5A, to discuss amplitude modulated ("AM") halftoning.

FIG. 5E shows a halftone pattern where droplet size (or shape) has been varied to compensate for a misfiring adjacent nozzle.

FIG. 5F shows a halftone pattern where droplets have been "borrowed" by one nozzle to compensate for a misfiring adjacent nozzle.

FIG. 6A is a chart showing grayscale values assigned to different print cells in dependence on thickness data.

FIG. 6B is another chart showing grayscale values assigned to different print cells in dependent on thickness data, but with grayscale corrections added in to smooth or correct error in resultant film thickness.

FIG. 7A provides a graph used to explain how different halftone droplet densities are associated with different grayscale values to produce desired layer thicknesses.

FIG. 7B schematically depicts one or more border regions of a substrate, and how halftoning and/or grayscale selection can be varied in the border regions to mitigate edge build-up.

FIG. 7C shows one possible scheme for halftoning near a border region, more particularly, for use at a corner of a deposited layer.

FIG. 7D shows edge enhancement of a print cell to provide a consistent layer edge.

FIG. 7E shows the use of both border adjacent halftone variation, to avoid edge buildup, and "fencing" to improve edge linearity.

FIG. 8C provides a cross-sectional view of the substrate of FIG. 8B, taken along lines C-C from FIG. 8B.

FIG. 8D shows the substrate of FIG. 8C after encapsulation (840) has been added; FIG. 8D also provides a close up showing that the encapsulation (840) can be formed of many individual layers, such as alternating organic and inorganic layers.

FIG. 8E shows the substrate of FIG. 8D in a plan view (i.e., from the same perspective as FIG. 8B).

Figure 1A:
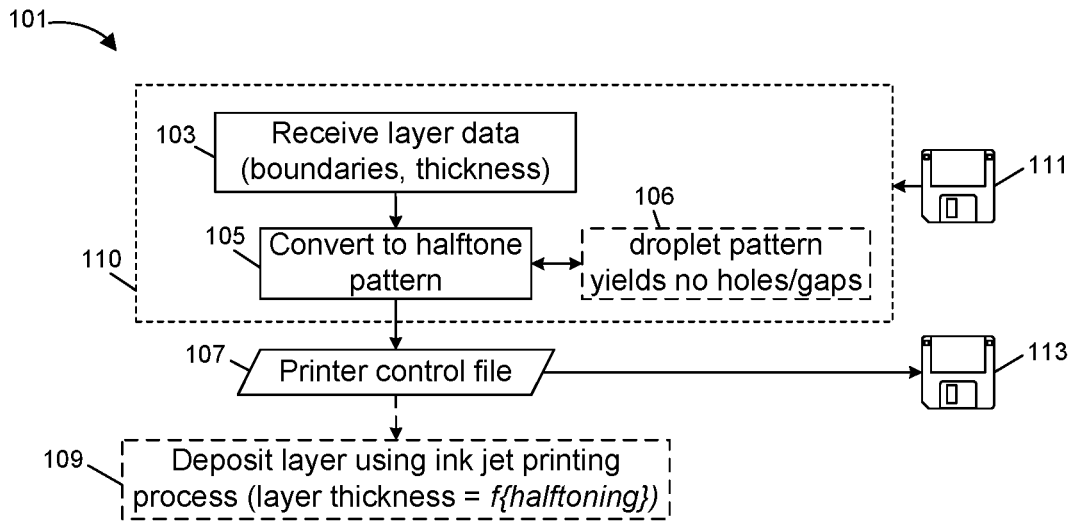
FIG. 1A is a diagram showing an embodiment of disclosed techniques, in which thickness data for a desired layer is converted to a halftone pattern useful for fabricating the desired layer.

The subject matter defined by the enumerated claims may be better understood by referring to the following detailed description, which should be read in conjunction with the accompanying drawings. This description of one or more particular embodiments, set out below to enable one to build and use various implementations of the technology set forth by the claims, is not intended to limit the enumerated claims, but to exemplify their application. Without limiting the foregoing, this disclosure provides several different examples of techniques for fabricating a materials layer using halftoning to control ink droplet density in a manner that will produce a desired thickness of the deposited layer. These techniques can be embodied as software for performing these techniques, in the form of a computer, printer or other device running such software, in the form of control data (e.g., a print image) for forming the materials layer, as a deposition mechanism, or in the form of an electronic or other device (e.g., a flat panel device or other consumer end product) fabricated using these techniques. While specific examples are presented, the principles described herein may also be applied to other methods, devices and systems as well.

DETAILED DESCRIPTION

This disclosure provides techniques for fabricating a layer on a substrate using a printing process. More specifically, data representing layer thickness is received and translated using halftoning to produce an ink jet droplet pattern. The ink is a viscous material such that droplets spread to a limited extent and, thus, the more droplets deposited per unit area (i.e., per cell location) the greater the thickness of the resultant layer.

In some embodiments, layer thickness is first converted to a grayscale value for each of a number of "print cells," with each print cell representing a unit area of substrate that has a common thickness value. For example, each print cell can be the smallest unit area representable by a dedicated thickness value. The gray scale values are then used to generate halftoning in a manner that will result in ink droplet density which produces the desired thickness. Note that this intermediate step of using print cells to locally represent thickness is optional.

In other embodiments, these processes are used to produce an encapsulation layer that will provide a barrier to prevent exposure of a substrate to materials such as oxygen and water. Halftoning can be selected to yield a continuous layer (i.e., after drop spreading, the deposition area in question is completely covered with ink, with no holes or voids) but with a variable ink volume (and associated, resultant variable thickness). Note that the halftoning can be expressed or applied in a number of manners, using single print head passes, multiple print head passes, and/or any other techniques that use multiple droplets at respective droplet locations to control the aggregate volume of a deposited ink.

A number of further, optional implementation variations can be applied to the techniques introduced above. First, calibration processes can be used (given variation in ink viscosity or other factors for example) to map different layer thicknesses to different grayscale values. To provide an introductory example, if it is desired to deposit a layer of 5.0 microns uniform thickness, this thickness data can first be converted to a grayscale value (e.g., a number within the range of 0-255 such as the number "103") with the number "103" being pre-associated with a given halftone droplet density that, given the ink in question and other process particulars, will produce a 5.0 micron-thick layer following printing and any associated cure process). Generally speaking, halftoning is performed as a single operation for an entire substrate area in question, but this process can also optionally be separately performed for respective "tiles" of a deposited layer, with halftone selection performed for each tile in a manner such that tiles have complementary droplet patterns so as to permit "seamless" stitching together of adjacent droplet patterns (i.e., to avoid Mura effect). Second, any one of a number of error correction processes can be applied to help ensure uniformity of a deposited layer. These variations will be further discussed below.

Thus, in one embodiment, desired layer thickness is first specified as an input. This thickness can optionally be first converted to a grayscale value, e.g., a value such as a percentage, e.g., "50%" or another relative ink volume measure. For example, in one contemplated implementation, a correlation between volume of applied ink and desired thickness will have been empirically determined in advance, and so, selecting such a value results in effective selection of a volume of ink that will build the desired thickness; it is also possible to use periodic calibration or dynamic measurement with feedback to arrive at a linkage between any desired thickness and the volume of ink that will ultimately produce the desired thickness. The conversion step can be performed for each of multiple print cell locations that will form part of the deposition area, optionally to develop a grayscale image representing an aggregation of the grayscale values of the respective print cells (see e.g., the discussion of FIGS. 6A and 6B, below). Based on these values, a halftone pattern is then selected or generated where the halftone pattern will result in the desired layer thickness resulting after any cure process for the deposited material. Note that the print cells can have any size relative to a halftone grid that is pertinent to the particular implementation. For example, in one embodiment, the print cells are small, having one or more print cells per halftone grid point (i.e., per possible halftone droplet). In another embodiment, print cells are relatively large, i.e., with many halftone grid points per print cell. A halftoning algorithm can be invoked to generate a droplet pattern that will produce the desired thickness, e.g., with droplets having relatively large dot gain, but with relatively sparse droplet ejections across halftone grid points; thus, even though every print cell might have a grayscale value of "103" (e.g., corresponding to a hypothetical desired layer thickness of 5.0 microns), not every associated halftone grid point will necessarily feature a droplet ejection.

Two specific non-limiting applications discussed below respectively use these techniques to regulate thickness of an encapsulation layer for organic light emitting diode devices ("OLEDs") and solar panels. In these applications, it is typically desired that an encapsulation layer should be impermeable to oxygen and water. Thus, the techniques just discussed can optionally be used to fabricate the encapsulation layer so as to provide that impermeability. Note that the general techniques can also be applied to deposition of other types of materials, organic and inorganic, and to the fabrication of other types of layers (e.g., other than encapsulation layers) and other types of devices. The disclosed techniques are especially useful for the deposition of materials which are to be deposited by liquid or other fluidic deposition processes (e.g., in the form of fluidic ink, whether liquid or vapor); for example, these techniques may readily be applied to depositions of organic materials suspended in a liquid medium. Note also that a typical deposition process deposits only one ink to build each layer (e.g., the layer is effectively monochromatic); this however is not required for all embodiments, and it is also possible to use multiple inks (for example, the mentioned processes can be used to deposit different light generating materials in three respective, fluidically isolated "pixel wells" associated with generation of red, green and blue component light for each image pixel of an OLED display panel, such as used in some televisions). Also note that the term "layer" is used in multiple senses, e.g., an encapsulation layer typically includes one or more constituent film layers, with the individual film layers as well as the aggregate each being an encapsulation "layer."

As used herein, the term "halftoning" refers to the process of generating or selecting a pattern of multiple droplets to apply a variable amount of ink responsive to desired layer thickness for a unit area (e.g., per print cell, per substrate or per unit of substrate area), with a "halftone pattern" being the pattern created by that process. In a typical embodiment discussed herein, halftoning is performed based on one or more grayscale values to produce a halftone pattern that locally represents layer thickness using a droplet pattern of variable droplet density (i.e., dependent on local grayscale value or a locally-weighted function of grayscale values), with each droplet position in a halftone grid being expressed as a Boolean value (i.e., 1 bit); each Boolean value (bit) denotes whether or not a nozzle is to eject a droplet at that position. A "halftone print image" represents a halftone pattern representing the entire print area. A "grayscale value" refers not to color (e.g., white versus gray versus black), but to a value that represents a variable layer thickness measure for a unit area of substrate that is to receive printing; for example, in one embodiment, a "small" grayscale value implies that a given print cell will receive a relatively small volume of ink (e.g., low density of droplets), corresponding to a relatively thin layer thickness for an area represented by the given print cell, while a "large" grayscale value implies that a given print cell will receive a larger volume of ink (relatively high density of droplets) corresponding to a thicker layer. Because layer thickness equals ink volume per unit area, grayscale value is used in many embodiments herein to specify layer thickness for a given unit area. Each grayscale value is typically a multi-bit value, e.g. 8 or 16 bits, but his need not be the case for all embodiments. A "grayscale pattern" is a pattern of any one or more grayscale values, whereas a "grayscale print image" or "grayscale image" is a grayscale pattern representing the print area, e.g., the substrate. A grayscale print image typically features an array of values that are each multi-bit (i.e., grayscale values) where each value represents layer thickness per a corresponding unit area; by contrast, a halftone print image typically features an array of single bit values that each represent whether or not an individual droplet will be ejected at a specific position. For many embodiments discussed below, particularly those geared to producing impermeable layers or layers with uniform thickness, halftone patterns used for printing are typically chosen (given dot gain/ink spreading) to produce a continuous layer, without holes or voids, though with different ink volumes. Note that in such applications, the inks in question typically comprise a monomer, a polymer, or a solvent that suspends a material, with the ink being dried, cured or otherwise processed after deposition so as to form the desired layer thickness as a permanent layer.

Figure 1B:
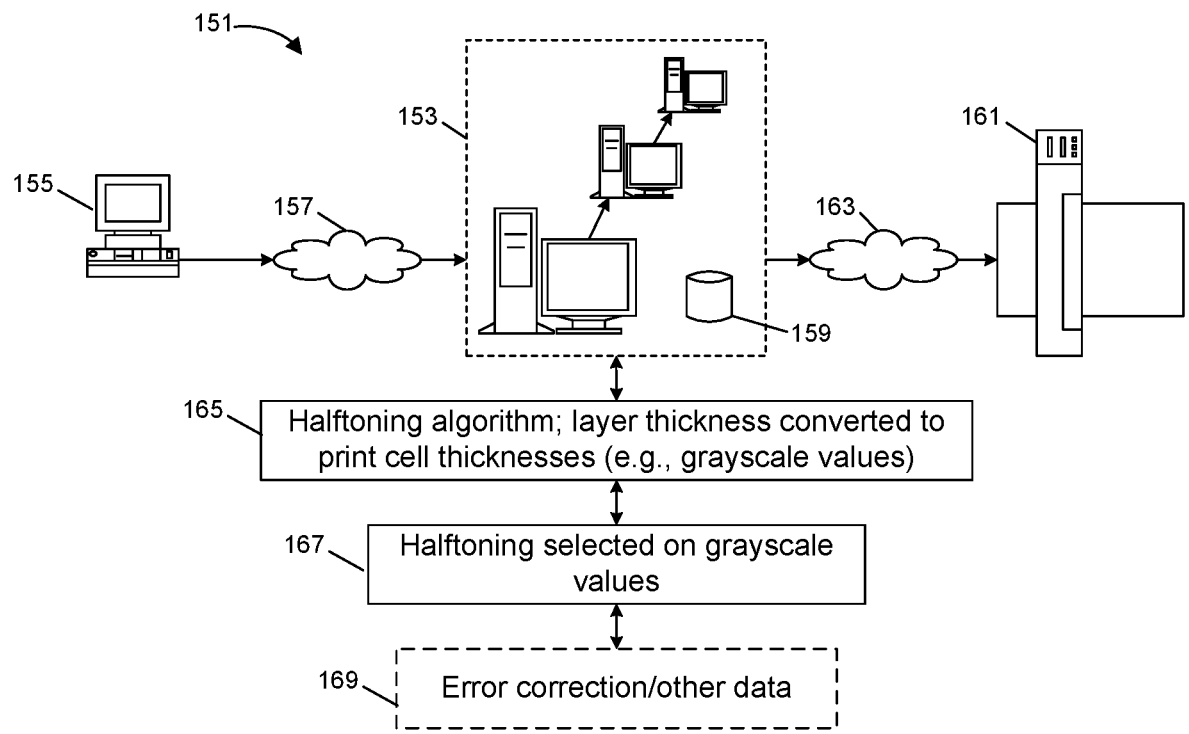
FIG. 1B is an illustrative diagram of a process in which layout data describing a desired layer is generated or received, converted into a halftone pattern, and used to deposit ink that will become a desired layer.
Figure 1C:
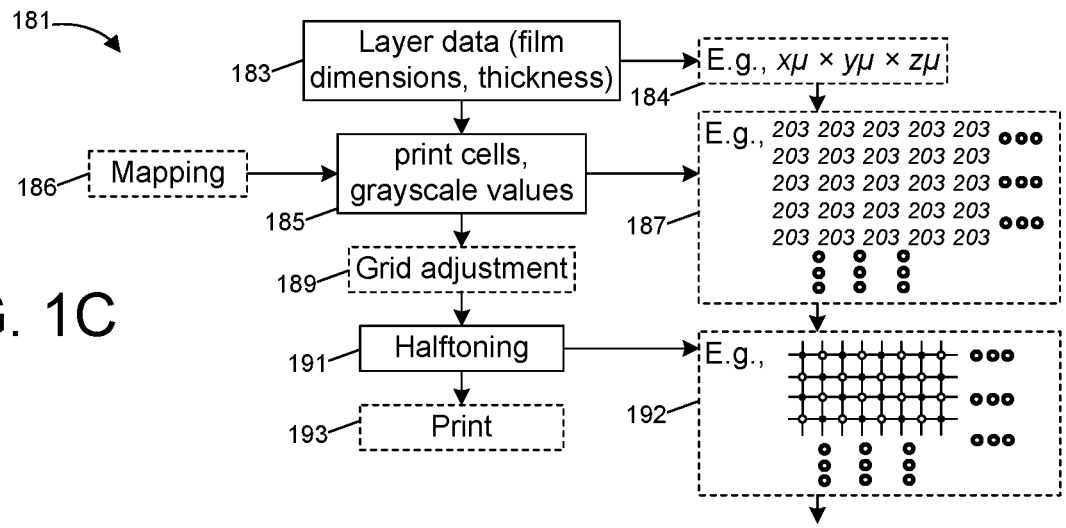
FIG. 1C is a block diagram of a detailed embodiment, where thickness data is used to obtain grayscale values for respective "print cells," and where the grayscale values are then used to generate a halftone pattern.

FIGS. 1A-1C are used to introduce several embodiments of the techniques introduced above.

FIG. 1A illustrates a first embodiment 101. Data is received representing a layer that is to be deposited over a substrate, as indicated by numeral 103. The substrate can be any underlying material or support surface, for example, glass or another surface, with or without previously deposited structures (e.g., such as electrodes, pathways or other layers or elements); it is not required that the underlying substrate be flat. Note that the received data will typically be presented as part of an electronic file representing a circuit or structure to be fabricated and, for the layer to be deposited, typically includes data defining x-y plane boundaries of the layer and data representing thickness at various points across the desired layer or within a structure of such a layer, for example, in a pixel well. To provide a non-limiting example, the underlying substrate could be an organic device such as an organic light emitting device or organic light emitting diode ("OLED") display panel in an intermediate state of fabrication, and the received data could indicate that the layer is to be part of an encapsulation of an active region of the OLED display that will seal that region against oxygen and water. The received data in such an encapsulation example would typically indicate where the particular encapsulation layer starts and stops (e.g., x and y edge coordinates) and its thickness as a height (e.g., a z-axis thickness of "5.0 microns"), with the height expressed as thicknesses for one or more various points. In one example, this layer data includes a thickness value for each point on an x-y grid system, though this is not required for all implementations (e.g., other coordinate systems could be used, and thickness for example could be expressed as a single uniform value, as a gradient, or using other means). As indicated by numeral 105, the received data is, using processes described herein, converted to a halftone pattern that will be used to influence deposition of layer material using a printing process, e.g., an ink jet printing process, to produce the desired layer thickness. Whether or not desired layer thickness is provided on a point-by-point basis, the thickness data is derived for each print cell that will be addressed by the printing process, and is then used to select a specific halftone pattern whose resultant droplets "build" the layer in question. Note that the relationship between print cell and halftone grid (i.e., droplet density) is arbitrary. In one embodiment, each print cell equates to a specific grid point, i.e., there is a one-to-one relationship. In a second embodiment, each print cell corresponds to more than one grid point (i.e., an integer or non-integer number of grid points). In yet a third embodiment, each grid point corresponds to a more than one print cell (i.e., an integer or non-integer number of print cells). Per dashed-line box 106 and as mentioned already, in one embodiment, the halftone pattern is optionally constrained to always produce a locally continuous film, though with variable ink volume dependent on desired layer thickness. The halftone patterns can be optionally determined in advance (e.g., with one to many halftone patterns that could be used per grayscale value or average of grayscale values), for example, so as to provide a capability to vary pattern selection; in another embodiment, droplet density is calibrated as a function of average grayscale value and is used "on the fly" to determine halftone patterning representing a set of grayscale values. In one embodiment, a set of grayscale values, each multi-bit, provides an input to halftone selection software, which then returns an output halftone pattern (e.g., with droplets positioned relative to a halftone grid, and with the decision to fire or not fire a droplet at a given grid point expressed as a single bit). The halftone pattern can be expressed as printer instructions (e.g., a print image to control a printer to print droplets at specific locations). These instructions contain information that will responsively cause the ink jet printing process to deposit ink at volume per unit area that is locally varied according to the information represented by the halftone pattern, with a greater aggregate print cell ink volume for thicker layers, and a lesser aggregate print cell ink volume for thinner layers.

Box 110, and media graphic 111, represent that, in one embodiment, the steps just introduced can be embodied as instructions stored on non-transitory machine-readable media, e.g., as software. "Non-transitory machine-readable media" means any tangible (i.e., physical) storage medium, irrespective of how data on that medium is stored, including without limitation, random access memory, hard disk memory, optical memory, a floppy disk or CD, server storage, volatile memory and other tangible mechanisms where instructions may subsequently be retrieved by a machine. The machine-readable media can be in standalone form (e.g., a program disk) or embodied as part of a larger mechanism, for example, a laptop computer, portable device, server, network, printer, or other set of one or more devices. The instructions can be implemented in different formats, for example, as metadata that when called is effective to invoke a certain action, Java code or scripting, code written in a specific programming language (e.g., as C++ code) or a processor-specific instruction set, or in some other form; the instructions can also be executed by the same processor or different processors, depending on embodiment. For example, in one implementation, instructions on non-transitory machine-readable media can be executed by a single computer and, in other cases as noted, can be stored and/or executed on a distributed basis, e.g., using one or more servers, web clients, or application-specific devices.

The halftoning produced by the process of box 110 can be employed immediately and/or stored for later use. To this effect, FIG. 1A shows that halftoning can be stored as a printer control file 107 (e.g., printer control instructions), for example, also on non-transitory machine-readable media 113. This media can be the same media as represented by media graphic 111, or different media, e.g., the RAM or hard disk of a desktop computer or printer, a disk, or a flash card. As a non-limiting example, such printer control instructions could be made available as a network-stored reference design which is adapted for download or transmission to an electronic destination. For most applications, as indicated by optional process block 109, the applied halftoning will ultimately be used to deposit a layer using the mentioned ink jet printing process. Once the layer deposition steps (and any post-deposition curing or other finishing steps) are complete, the deposited layer in the region of deposition will have a thickness that corresponds to the intended layer thickness, as a function of the halftoning.

FIG. 1B is an illustrative diagram showing a process and hardware for fabricating a layer, such as the layer just discussed with reference to FIG. 1A. The process and hardware are generally represented by numeral 151 and are seen to include one or more computers 153 that are able to receive layout data for one or more layers of material (e.g., as part of a design file). This layout data and any associated design file are generated by and received from a computer 155, for example a computer used for computer-assisted design ("CAD"). The received layout data (including any design file) can be part of instructions or data stored on machine-readable media where the data or instructions can be used to fabricate the desired component, for example, a consumer electronic product or another product. The layout data is optionally received over a network 157, for example a local area network ("LAN") or wide area network ("WAN," such as the Internet or a private network of a company). In some embodiments, the computer 155 is optionally itself one of the one or more computers 153, i.e., design of the layer and generation of printer control instructions can optionally be performed on one computer or within a single local network. The one or more computers 153 apply processing as introduced above, that is, to convert thickness data for a layer to at least one halftone pattern. The results of halftoning are stored in local memory 159 and are optionally transmitted to an ink jet printing mechanism 161 via network 163. Note that the one or more computers 153 can also be combined with the ink jet printing mechanism, e.g., these elements can be embodied as a control terminal for a fabrication mechanism that includes an ink jet printer that will form the desired layer, e.g., as one or more scans that print the layer, each scan as a single pass over an area of substrate, to deposit the desired layer thickness, e.g., following any cure or finishing procedure. The ink jetted by the ink jet printing mechanism typically includes a material (e.g., an organic material) jetted as a fluid, as mentioned. As introduced above and as further described below, in some embodiments, each print cell corresponding to the unit printable area of the substrate is assigned a discrete ink volume (e.g., in the form of a grayscale value). The size of a print cell is arbitrary and typically represents the minimum unit of substrate area that can or will be assigned a discrete thickness (i.e., grayscale value). Each print cell in turn is typically associated with one or more points on a grid where the points of the grid each represent possible, respective ink droplet positions. The firing of each possible droplet is controlled responsive to applied halftoning. In one embodiment, "frequency modulated" halftoning is used, meaning that the firing of droplets from respective print head nozzles (or positions) is performed at a specific spatial frequency, varied according to the desired layer thickness (e.g., see FIG. 5A). In another embodiment, "amplitude modulated" halftoning is used, that is, where droplet firings are in spatially-separated clusters, with the number of droplets per cluster varied according to desired thickness; thus a darker image (i.e., thicker layer) is represented by bigger apparent drops than a thinner layer, again in this embodiment, with dot gain sufficient to achieve a locally continuous film notwithstanding grid points where droplets are not fired (e.g., see FIG. 5C). In still other embodiments, droplet size and/or shape can be varied (e.g., from circular or elliptical or some other shape) by changing the electrical pattern used to fire one or more ink jet nozzles; alternatively or in addition, the halftone pattern and/or printer instructions can instruct multiple passes of a specific scan position by an ink jet print head. Finally, other techniques can also be used, alone or in combination with the techniques mentioned above. These optional features are represented by optional process block 165.

The processing of inputted layout data results in layer thickness data being identified for each print cell and, then, being converted to a grayscale value representing the particular print cell. For example, in one embodiment, the grayscale value is an eight-bit field having 256 possible values; if layer thickness were to range between one micron and eleven microns, then a thickness measure representing six microns (i.e., exactly intermediate thickness in the range) might be converted to the grayscale value "128." A halftone pattern (e.g., representing a locally continuous film) is then selected dependent on one or more of the assigned grayscale values, per numeral 167. Note again that the relationship between desired layer thickness and grayscale value need not be linear. For example, if a minimum eight-bit value of, e.g., "67" was needed to achieve a continuous film for a particular embodiment, then an assigned thickness might be represented by a number in the range of 0, 67-255.

FIG. 1B also introduces an optional (dashed-line) process, 169, relating to the use of error correction data (or other data) to influence halftoning. This can be applied in a number of ways, but to provide one introductory example, if it is determined in practice for a particular printing mechanism that a subset of ink nozzles are inoperative, the halftone pattern can be optionally adjusted to provide compensation (e.g., the pattern can be varied, or AM halftoning can be applied instead of FM halftoning, or another scheme can be used), or the print head can be instructed to use different nozzles (e.g., with an optional offset in scan path); as such error data would presumably affect each pass of a subject-print head over the substrate, the halftoning algorithm can optionally be updated, at least for the subject-print head, to perform future printing or print planning using modified parameters. In other embodiments, drive waveforms for a particular ink nozzle can be varied or tuned. For example, process variations for each nozzle (and other factors such as nozzle life/age and ink parameters such as viscosity, surface tension and temperature) can influence per-nozzle droplet volume; to mitigate this effect, the drive waveform for the nozzle can be varied in order to adjust volume, trajectory or velocity of an ejected droplet that contributes to an assigned or desired halftone pattern. Similar corrections/updates can be supplied depending on deposition machine particulars, ink qualities, and other factors. Note that error correction can also take other forms, for example, varying droplet size or shape, or changing the spatial positioning of droplets within a print cell. Applicant's copending PCT Patent Application No. PCT/US14/35193 for "Techniques for Print Ink Droplet Measurement and Control to Deposit Fluids within Precise Tolerances," filed on behalf of first named inventor Nahid Harjee on Apr. 23, 2014 (KT 13-0616CP) discloses techniques for individualized droplet volume, trajectory and velocity measurement, the validation of droplets as useable or aberrant to a point where a nozzle should be excluded from use, planning of print head scan paths around such issues, and the adjustment of (and provision of alternate) nozzle drive waveforms and other compensation for use in correcting such behavior; this mentioned application is hereby incorporated by reference, as though set forth herein. Various techniques for error correction will be discussed below but, as represented by optional process 169, if applied, such techniques can be used to adjust how an individual pattern is created, to correct for aberration in a deposited layer. Any of the techniques or processes described in the aforementioned copending PCT patent application (KT 13-0616CP) can be applied to adjust droplet generation to promote uniform droplet generation and/or error compensation.

FIG. 1C provides yet another flow diagram used to introduce the processes discussed above. A method implementing these processes is generally identified using numeral 181. First, layer data is received (183), for example, identifying size and shape of a desired layer and thickness of the desired layer. In one embodiment, the desired layer will be a part of a completed flat panel display (e.g., a television or other display device) and, in another embodiment, the desired layer will be part of a solar panel. Optionally, in some implementations, the desired layer is an encapsulation layer that will protect active elements of such a device against oxygen and/or water. As exemplified by dashed-line box 184, layer data can be optionally expressed in the form of a width, length and height (e.g., x microns by y microns by z microns, as depicted). Per box 185, the thickness data (e.g., "z microns" in this example) is then optionally converted to grayscale values, one for each one of multiple print cells, according to a mapping (186). For example, if it is determined that a layer thickness of 5.0 microns (i.e., z=5.0) corresponds to a specific ink volume, achieved by firing M droplets per some unit area, then grayscale values correlated with this ink droplet density (i.e., per mapping 186) are assigned to each print cell, as depicted in an example box 187. In this hypothetical, box 187 shows a grid of values "203" which (in this example) are already known to provide the desired ink density needed to obtain a 5.0 micron thick layer following application of ink. Per numeral 189, grayscale values or grid values can be optionally adjusted. For example, in one contemplated embodiment, grayscale values representing a border (e.g., periphery of a layer to be deposited) can be adjusted to avoid buildup at layer edges (see the discussion of FIGS. 7A-7E, below). Alternatively, if deposited ink has non-uniformities that can be linked to specific nozzles or print cells, then grayscale values can be adjusted so as to mitigate such non-uniformities. In an embodiment where the substrate has underlying structures (such that a uniform thickness of deposited ink results in a non-uniform surface because of underling active elements), then the gray scale values can be adjusted so as to level out the post-deposition surface of the new layer. Such adjustment can be applied before or after conversion of grayscale values to a halftone pattern, per process 191 (or otherwise optionally factored into the halftoning process). The halftoning process results in a bitmap where each grid intersection point is associated with a possible droplet, and where an individual grid value (e.g., single bit value) at a grid intersection point indicates whether a droplet is to be fired at the corresponding grid intersection point, as exemplified in example box 192. The result of this process is also a set of printer control instructions, amendable for use in printing the desired layer, for storage for later download, transfer, use or manipulation, or for prospectively controlling a printer. The ultimate printing operation is designated by the numeral 193 in FIG. 1C.

With the principal parts of several embodiments thus introduced, this description will now provide additional detail relating to certain fabrication techniques. FIGS. 2A-D will first be used to explain particulars of one possible deposition environment, e.g., an industrial fabrication machine that uses ink jet printing to deposit material that will directly form one or more permanent layers of a flat panel device. FIGS. 3A-6B will then be used to explain how halftoning can be used to control to layer thickness. FIGS. 7A-7E will be used to discuss edge buildup and boundary control. FIGS. 8A-8E will be used to narrate a hypothetical fabrication process. Finally, FIG. 9 will be used to discuss some fabrication options in manufacturing an OLED display device. These FIGS. and associated text should be understood to provide examples only, and other analogous techniques and implementations will no doubt occur to those skilled in the art. Using the described techniques and devices, a printing process and more specifically an ink jet printing process can be used to deposit nearly any desired layer using a fluidic ink, with uniform control over layer thickness provided by use of and adjustment of a halftone pattern. The described techniques are especially useful for "blanket" depositions, that is, where feature size of a deposited layer is large relative to any underlying nanoscale structures, but the techniques described above are not so limited.

Figure 2A:
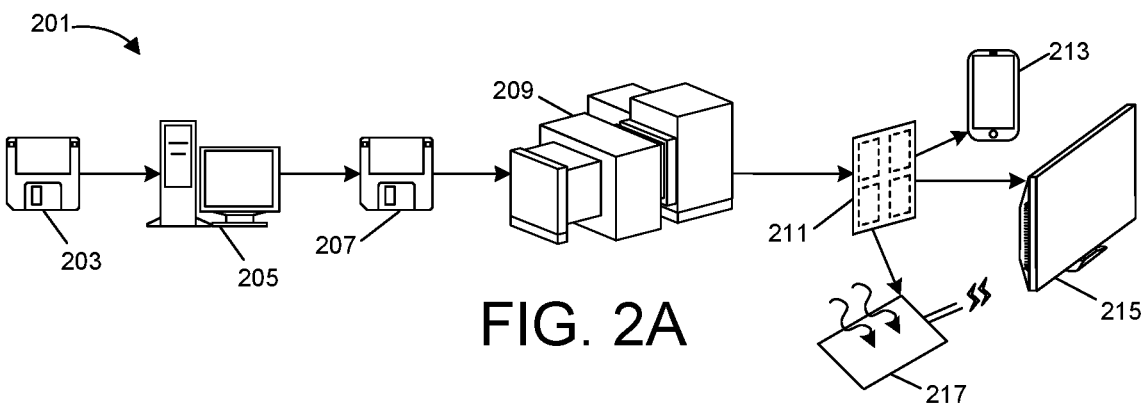
FIG. 2A provides an illustrative view showing a series of optional tiers, products or services that can each independently embody techniques introduced herein.

FIG. 2A represents a number of different implementation tiers, collectively designated by reference numeral 201; each one of these tiers represents a possible discrete implementation of the techniques introduced herein. First, halftoning techniques as introduced in this disclosure can take the form of instructions stored on non-transitory machine-readable media, as represented by graphic 203 (e.g., executable instructions or software for controlling a computer or a printer). Second, per computer icon 205, these techniques can also optionally be implemented as part of a computer or network, for example, within a company that designs or manufactures components for sale or use in other products. Third, as exemplified using a storage media graphic 207, the techniques introduced earlier can take the form of a stored printer control instructions, e.g., as a halftone print image that, when acted upon, will cause a printer to fabricate one or more layers of a component dependent on the use of one or more halftone patterns representing different ink volumes, per the discussion above. Note that printer instructions can be directly transmitted to a printer, for example, over a LAN; in this context, the storage media graphic can represent (without limitation) RAM inside or accessible to a computer or printer, or a portable media such as a flash drive. Fourth, as represented by a fabrication device icon 209, the techniques introduced above can be implemented as part of a fabrication apparatus or machine, or in the form of a printer within such an apparatus or machine. It is noted that the particular depiction of the fabrication device 209 represents one exemplary printer device that will be discussed in connection with FIG. 2B, below. The techniques introduced above can also be embodied as an assembly of manufactured components; in FIG. 2A for example, several such components are depicted in the form of an array 211 of semi-finished flat panel devices, that will be separated and sold for incorporation into end consumer products. The depicted devices may have, for example, one or more encapsulation layers or other layers fabricated in dependence on the methods introduced above. The techniques introduced above can also be embodied in the form of end-consumer products as referenced, e.g., in the form of display screens for portable digital devices 213 (e.g., such as electronic pads or smart phones), as television display screens 215 (e.g., OLED TVs), solar panels 217, or other types of devices.

Figure 2B:
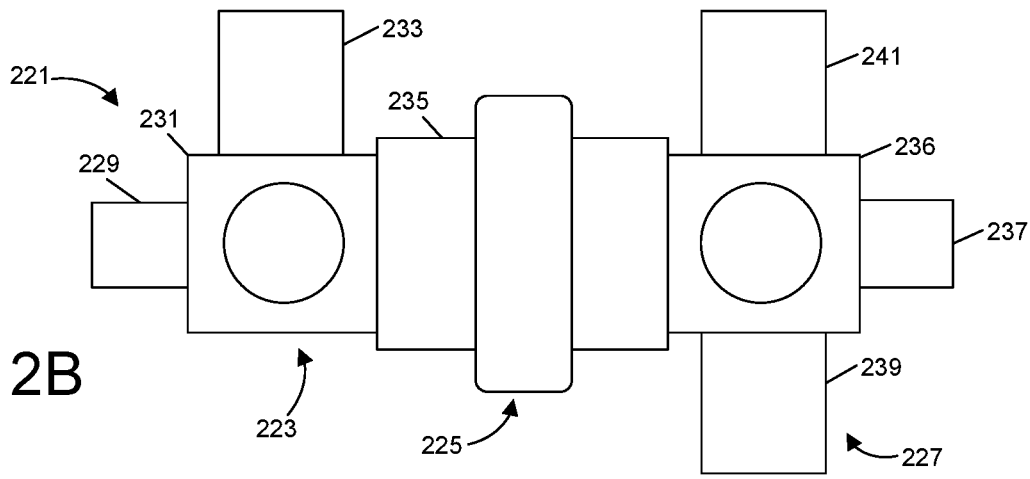
FIG. 2B provides a plan view of a fabrication mechanism that can be used to fabricate a component, for example, a flat panel device in presence of a controlled atmospheric environment.

FIG. 2B shows one contemplated multi-chambered fabrication apparatus 221 that can be used to apply techniques disclosed herein. Generally speaking, the depicted apparatus 221 includes several general modules or subsystems including a transfer module 223, a printing module 225 and a processing module 227. Each module maintains a controlled environment, such that printing for example can be performed by the printing module 225 in a first controlled atmosphere and other processing, for example, another deposition process such an inorganic encapsulation layer deposition or a curing process (e.g., for printed materials), can be performed in a second controlled atmosphere. The apparatus 221 uses one or more mechanical handlers to move a substrate between modules without exposing the substrate to an uncontrolled atmosphere. Within any given module, it is possible to use other substrate handling systems and/or specific devices and control systems adapted to the processing to be performed for that module.

Various embodiments of the transfer module 223 can include an input loadlock 229 (i.e., a chamber that provides buffering between different environments while maintaining a controlled atmosphere), a transfer chamber 231 (also having a handler for transporting a substrate), and an atmospheric buffer chamber 233. Within the printing module 225, it is possible to use other substrate handling mechanisms such as a flotation table for stable support of a substrate during a printing process. Additionally, a xyz-motion system, such as a split axis or gantry motion system, can be used for precise positioning of at least one print head relative to the substrate, as well as providing a y-axis conveyance system for the transport of the substrate through the printing module 225. It is also possible within the printing chamber to use multiple inks for printing, e.g., using respective print head assemblies such that, for example, two different types of deposition processes can be performed within the printing module in a controlled atmosphere. The printing module 225 can comprise a gas enclosure 235 housing an inkjet printing system, with means for introducing an inert atmosphere (e.g., nitrogen) and otherwise controlling the atmosphere for environmental regulation (e.g., temperature and pressure), gas constituency and particulate presence.

Various embodiments of a processing module 227 can include, for example, a transfer chamber 236; this transfer chamber also has a including a handler for transporting a substrate. In addition, the processing module can also include an output loadlock 237, a nitrogen stack buffer 239, and a curing chamber 241. In some applications, the curing chamber can be used to cure a monomer film into a uniform polymer film, for example, using a heat or UV radiation cure process.

In one application, the apparatus 221 is adapted for bulk production of liquid crystal display screens or OLED display screens, for example, the fabrication of an array of eight screens at once on a single large substrate. These screens can be used for televisions and as display screens for other forms of electronic devices. In a second application, the apparatus can be used for bulk production of solar panels in much the same manner.

Applied to the encapsulation example discussed above, and adapted to use the halftone-based printing techniques described above, the printing module 225 can advantageously be used in such applications to deposit organic encapsulation layers that help protect the sensitive elements of such devices. For example, the depicted apparatus 221 can be loaded with a substrate and can be controlled to move the substrate back and forth between the various chambers in a manner uninterrupted by exposure to an uncontrolled atmosphere during the encapsulation process. The substrate can be loaded via the input loadlock 229. A handler positioned in the transfer module 223 can move the substrate from the input loadlock 229 to the printing module 225 and, following completion of a printing process, can move the substrate to the processing module 227 for cure. By repeated deposition of subsequent layers, each of controlled thickness, aggregate encapsulation can be built up to suit any desired application. Note once again that the techniques described above are not limited to encapsulation processes, and also that many different types of tools can be used. For example, the configuration of the apparatus 221 can be varied to place the various modules 223, 225 and 227 in different juxtaposition; also, additional, fewer or different modules can also be used.

While FIG. 2B provides one example of a set of linked chambers or fabrication components, clearly many other possibilities exist. The halftoning techniques introduced above can be used with the device depicted in FIG. 2B, or indeed, to control a fabrication process performed by any other type of deposition equipment.

Figure 2C:
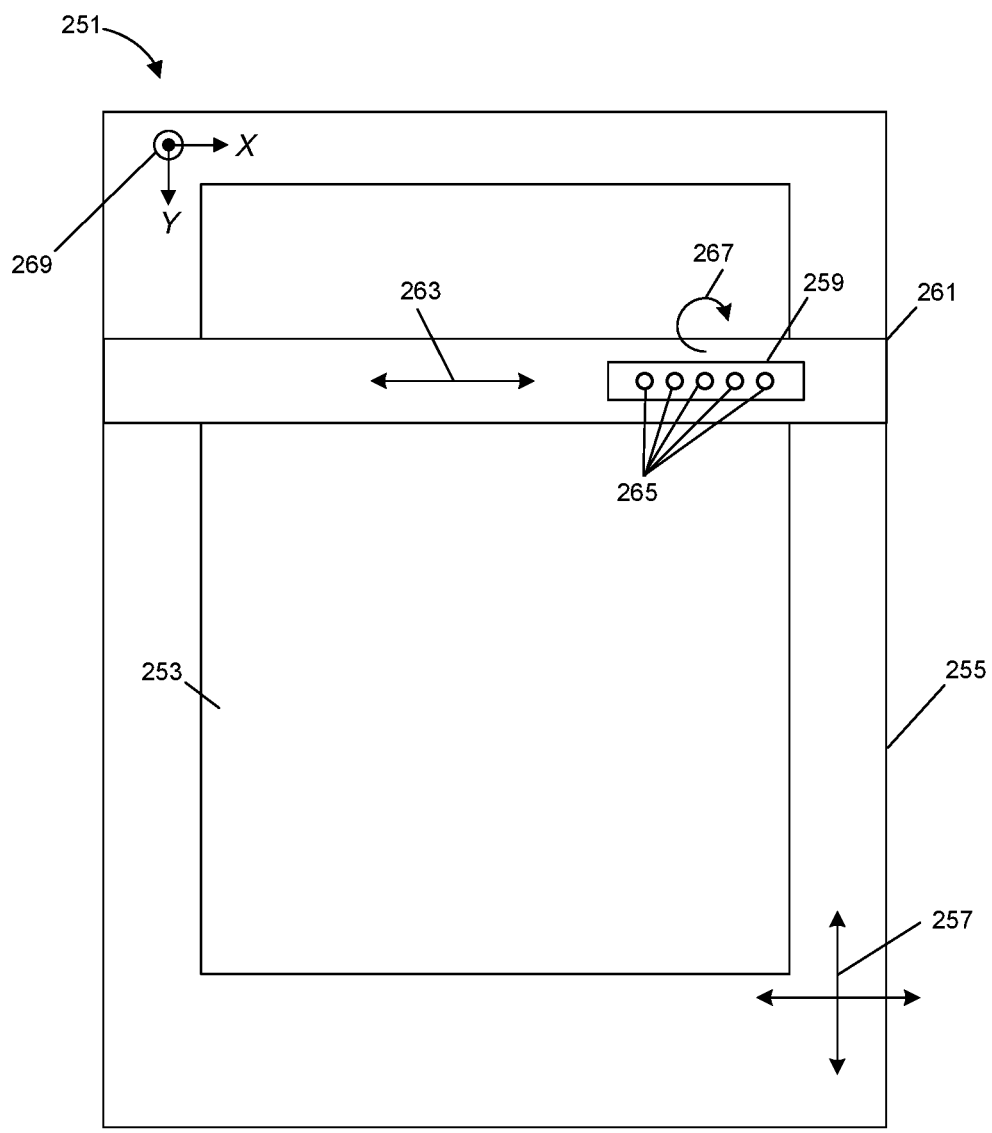
FIG. 2C is a plan view showing layout of a printer within the fabrication mechanism of FIG. 2B; more specifically.

FIG. 2C provides a plan view of the substrate and printer as they might appear during the deposition process. The print chamber is generally designated by reference numeral 251, the substrate to be printed upon is generally designated by numeral 253, and a support table used to transport the substrate is generally designated by numeral 255. Generally speaking, any x-y coordinate of the substrate is reached by a combination of movements, including x- and y-dimensional movement of the substrate by the support table (e.g., using flotation support, as denoted by numeral 257) and using "slow axis" x-dimensional movement of one or more print heads 259 along a traveler 261, as generally represented by arrows 263. As mentioned, the flotation table and substrate handling infrastructure are used to move the substrate and advantageously provide deskew control along one or more "fast axes," as necessary. The print head is seen to have plural nozzles 265, each of which is separately controlled by a firing pattern derived from a halftone print image (e.g., to effectuate printing of columns of print cells as the print head is moved from left-to-right and vice-versa along the "slow axis"). Note that while only 5 nozzles are depicted in FIG. 2C that any number of nozzles can be used; for example, in a typical industrial printing implementation, there can be multiple print heads with thousands of nozzles present. With relative motion between the one or more print heads and the substrate provided in the direct of the fast axis (i.e., the y-axis), printing describes a swath that follows individual rows of print cells. The print head can also advantageously be adjusted to vary effective nozzle spacing (e.g., by rotating of the one or more print heads, per numeral 267). Note that multiple such print heads can be used together, oriented with x-dimension, y-dimension, and/or z-dimensional offset relative to one another as desired (see axis legend 269 in FIG. 2C). The printing operation continues until the entire target region (and any border region) has been printed with ink, as desired. Following deposition of the necessary amount of ink, the substrate is finished, either by evaporating solvent to dry ink (e.g., using a thermal process), or by use of a cure process, such as a UV cure process.

Figure 2D:
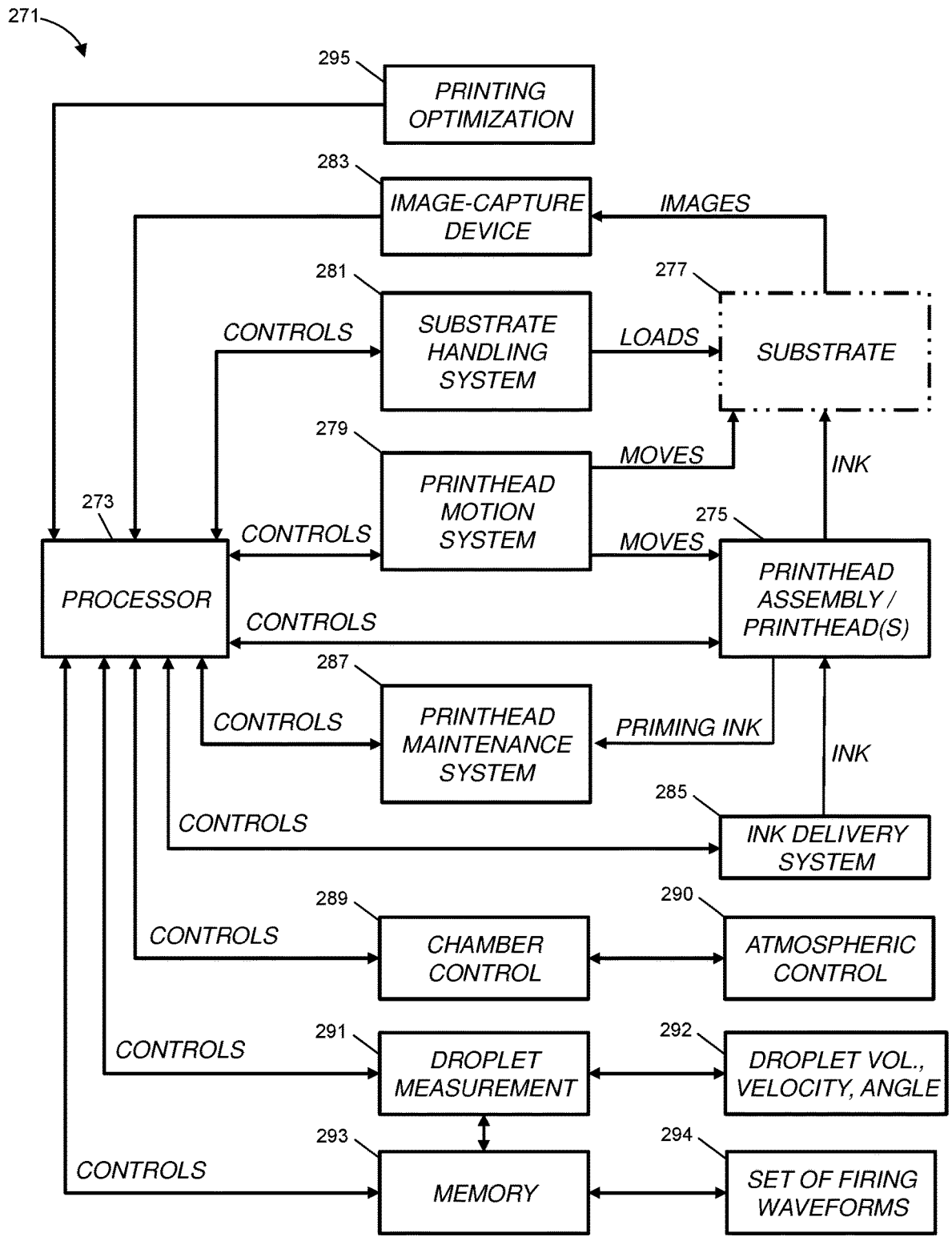
FIG. 2D is a block diagram of various subsystems associated within a printing module of FIG. 2A.

FIG. 2D provides a block diagram showing various subsystems of one apparatus (271) that can be used to fabricate devices having one or more layers as specified herein. Coordination over the various subsystems is provided by a processor 273, acting under instructions provided by software (not shown in FIG. 2D). During a fabrication process, the processor feeds data to a print head 275 to cause the print head to eject various volume of ink depending on firing instructions provided by a halftone print image. The print head 275 typically has multiple ink jet nozzles, arranged in a row or array, and associated reservoirs that permit jetting of ink responsive to activation of piezoelectric or other transducers; such transducers cause a respective nozzle to eject a controlled amount of ink in an amount governed by an electronic firing waveform signal applied to the corresponding piezoelectric transducer. Other firing mechanisms can also be used. The print head applies the ink to a substrate 277 at various x-y positions corresponding to the grid coordinates within various print cells, as represented by the halftone print image. Variation in position is effected both by a print head motion system 279 and substrate handling system 281 (e.g., that cause the printing to describe one or more swaths across the substrate). In one embodiment, the print head motion system 279 moves the print head back-and-forth along a traveler, while the substrate handling system provides stable substrate support and both "x" and "y" dimension transport (and rotation) of the substrate, e.g., for alignment and deskew; during printing, the substrate handling system provides relatively fast transport in one dimension (e.g., the "y" dimension relative to FIG. 2C), while the print head motion system 279 provides relatively slow transport in another dimension (e.g., the "x" dimension relative to FIG. 2C), e.g., for print head offset. In another embodiment, multiple print heads can be used, with primary transport being handled by the substrate handling system 281. An image capture device 283 can be used to locate any fiducials and assist with alignment and/or error detection.

The apparatus also comprises an ink delivery system 285 and a print head maintenance system 287 to assist with the printing operation. The print head can be periodically calibrated or subjected to a maintenance process; to this end, during a maintenance sequence, the print head maintenance system 287 is used to perform appropriate priming, purge of ink or gas, testing and calibration, and other operations, as appropriate to the particular process. Such a process can also include individual measurement of parameters such as droplet volume, velocity and trajectory, for example, as discussed in Applicant's copending PCT patent application referenced earlier (KAT-13-616CP), and as referenced by numerals 291 and 292.

As was introduced previously, the printing process can be performed in a controlled environment, that is, in a manner that presents a reduced risk of contaminants that might degrade effectiveness of a deposited layer. To this effect, the apparatus includes a chamber control subsystem 289 that controls atmosphere within the chamber, as denoted by function block 290. Optional process variations, as mentioned, can include performing jetting of deposition material in presence of an ambient nitrogen gas atmosphere (or another inert environment, having a specifically selected gas and/or controlled to exclude unwanted particulate). Finally, as denoted by numeral 293, the apparatus also includes a memory subsystem that can be used to store halftone pattern information or halftone pattern generation software, i.e., should the apparatus directly perform rendering of layout data to obtain a halftone print image according to the techniques introduced above, to internally generate printer control instructions that govern the firing of (and timing of) each droplet. If such rendering is performed elsewhere, and the task of the apparatus is to fabricate a device layer according to a received printer instructions, then the halftone print image can be stored in the memory subsystem 293 for use during the printing process. As noted by numeral 294, in one optional embodiment, individual droplet particulars can be varied (e.g., to correct for nozzle aberration) through the variation of firing waveform for any given nozzle. In one embodiment, a set of alternate firing waveforms can be selected in advance and made available to each nozzle, on a shared or dedicated basis. In another embodiment, a single waveform is decided upon in advance (e.g., selected relative to alternatives) and is programmed for indefinite use in connection with a specific nozzle.

Figure 3A:
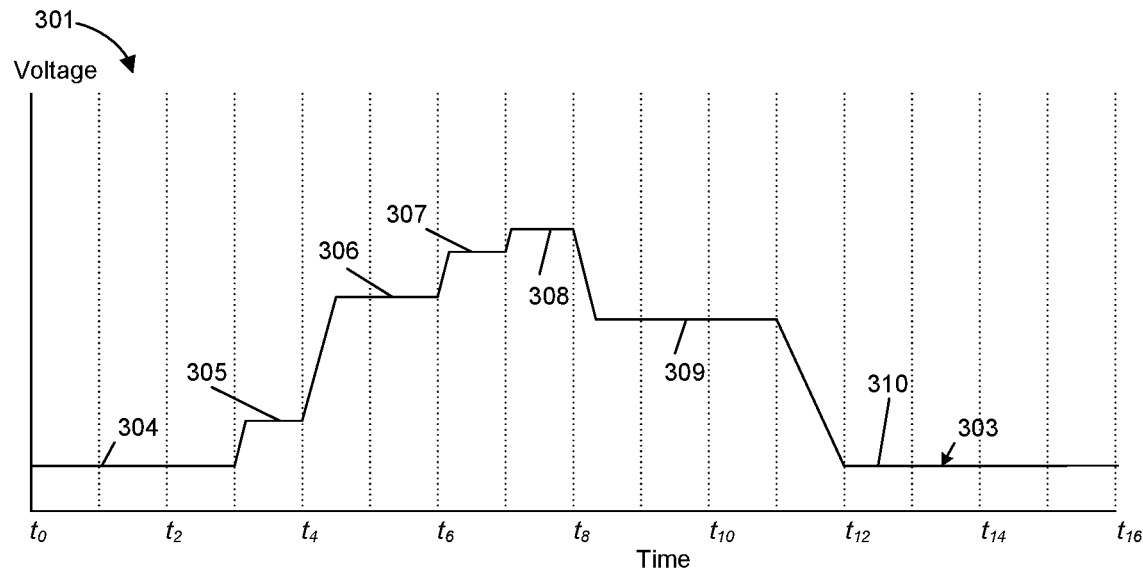
FIG. 3A shows a way of defining a waveform used to create an individual ink droplet according to discrete waveform segments.

Structure and techniques for modifying or tuning nozzle firing particulars are explained with reference to FIGS. 3A-3C. In one embodiment, waveforms can be predefined as a sequence of discrete signal levels, e.g., defined by digital data, with a drive waveform being generated by a digital-to-analog converter (DAC). Numeral 301 in FIG. 3A identifies a graph of a waveform 303 having discrete signal levels, 304, 305, 306, 307, 308, 309 and 310. In one embodiment, each nozzle driver can include circuitry that receives multiple waveforms (e.g., up to sixteen or another number), with each waveform being defined as a series of signal levels of variable voltage and duration. Each waveform can be expressed as a sequence of up to sixteen such signal levels, each expressed as a multi-bit voltage and a multi-bit duration. That is to say, in such an embodiment, pulse width can effectively be varied by defining different durations for one or more signal levels, and drive voltage can be waveform-shaped in a manner chosen to provide subtle droplet size, velocity or trajectory variation, e.g., with droplet volumes gauged to provide specific volume gradations increments such as in units of 0.01 pL. Thus, with such an embodiment, waveform shaping provides ability to tailor droplet volumes and flight parameters to be close to ideal values. These waveform shaping techniques also facilitate a strategy for reducing or eliminating Mura; for example, in one optional embodiment, a single assigned nozzle drive waveform is tailored in advance for each nozzle, such that all nozzles provide uniform droplet volume (e.g., as near as possible to 10.00 pL). In another embodiment, alternative predetermined waveforms are optionally made available to each nozzle, with dynamic calibration (or another process) used to select (e.g., program) "the one" of the alternative predetermined waveforms that is to be applied in the short term. Other possibilities also exist.

Typically, the effects of different drive waveforms and resultant droplet volumes are measured in advance. In one embodiment, for each nozzle, up to sixteen different drive waveforms can be stored in a nozzle-specific, dedicated, 1 k static random access memory (SRAM) for later, elective use in providing discrete volume variations, as selected by software. With the different drive waveforms on hand, each nozzle is then instructed droplet-by-droplet as to which waveform to apply via the programming of data that effectuates the specific drive waveform.

Figure 3B:
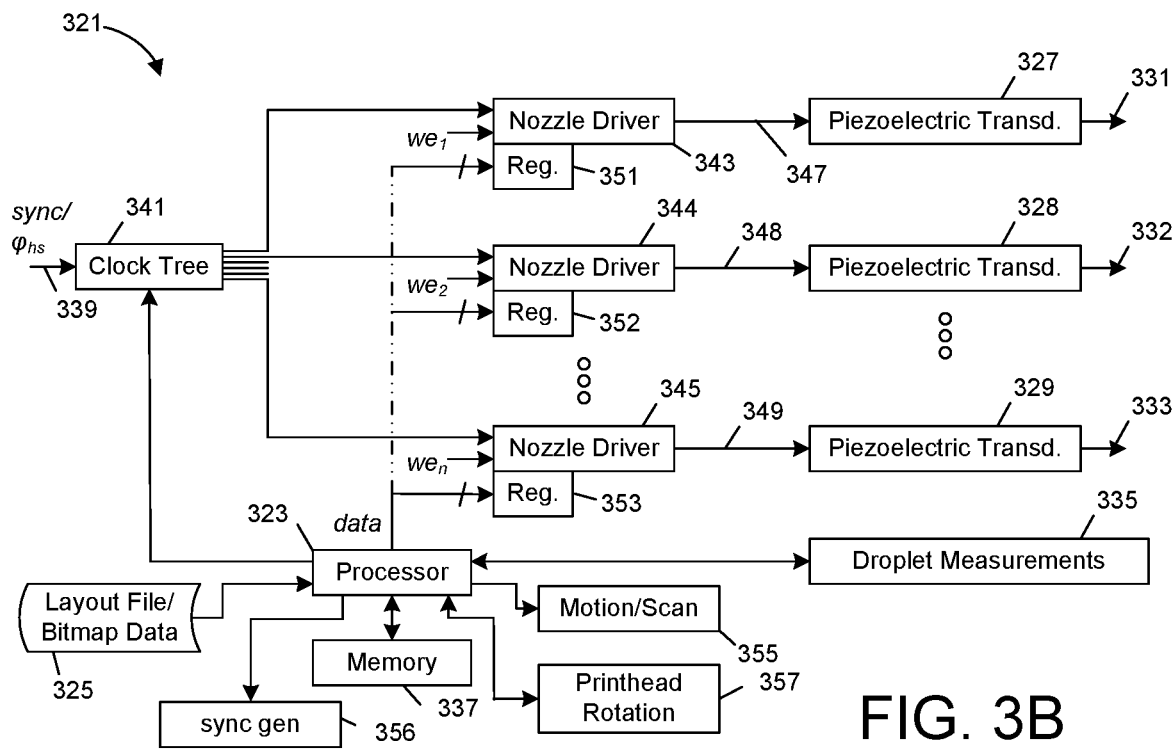
FIG. 3B shows an embodiment where droplets having different parameters can be created based on different nozzle firing waveforms.

FIG. 3B is a diagram showing circuitry that can be used to such an embodiment, generally designated by numeral 321. In particular, a processor 323 is used to receive data defining a particular layer of material that is to be printed. As represented by numeral 325, this data can be a layout file or bitmap file that defines desired thickness per grid point or positional address. A series of piezoelectric transducers 327, 328 and 329 generate associated respective droplet volumes 331, 332 and 333, that are each dependent on many factors, including nozzle drive waveform, nozzle-to-nozzle and print-head-to-print-head manufacturing variations. During a calibration operation, each one of a set of variables can be tested for its effects on droplet volume, including nozzle-to-nozzle variation, to determine one or more drive waveforms for the respective nozzle, given the particular ink that will be used; if desired, this calibration operation can be made dynamic, for example, to respond to changes in temperature, nozzle clogging, print head age or other parameters. This calibration is represented by a droplet measurement device 335, which provides measured data to the processor 323 for use in managing print planning and ensuing printing. In one embodiment, this measurement data is calculated during an operation that takes minutes, e.g., no more than thirty minutes for thousands of nozzles and preferably much less time (e.g., for thousands of print head nozzles and potentially, for each nozzle, dozens of possible nozzle firing waveforms). In another embodiment, such measurement can be performed iteratively, that is to update different subsets of nozzles at different points in time. A non-imaging (e.g., interferometric) technique can optionally be used for measurement, for example, as described in the aforementioned copending, commonly-assigned PCT patent application; this potentially results in dozens of droplet measurements per nozzle, covering dozens to hundreds of nozzles per second. This data and any associated statistical models (and means) can be stored in memory 337 for use in processing the layout or bitmap data 325 when it is received. In one implementation, processor 323 is part of a computer that is remote from the actual printer, whereas in a second implementation, processor 323 is either integrated with a fabrication mechanism (e.g., a system for fabricating displays) or with a printer.

To perform the firing of droplets, a set of one or more timing or synchronization signals 339 are received for use as references, and these are passed through a clock tree 341 for distribution to each nozzle driver 343, 344 and 345 to generate the drive waveform for the particular piezoelectric transducer (327, 328 and 329, respectively), i.e., with a dedicated piezoelectric transducer per nozzle (and with thousands of nozzles typically present, even though only three are illustrated in FIG. 3B). Each nozzle driver has one or more registers 351, 352 and 353, respectively, which receive multi-bit programming data and timing information from the processor 323. Each nozzle driver and its associated registers receive one or more dedicated write enable signals (we$_n$) for purposes of programming the registers 351, 352 and 353, respectively. In one embodiment, each of the registers comprises a fair amount of memory, including a 1 k SRAM to store multiple, predetermined waveforms, and programmable registers to select between those waveforms and otherwise control waveform generation. The data and timing information from the processor is depicted in FIG. 3B as multi-bit information, although this information can instead be provided via a serial connection to each nozzle (as will be seen in FIG. 3C, discussed below).

For a given deposition, print head or ink, the processor chooses for each nozzle a set of sixteen prearranged drive waveforms that can be electively (i.e., "at will") applied to generate a droplet; note that this number is arbitrary, e.g., in one design, four waveforms could be used, while in another, four thousand could be used. These waveforms are advantageously selected to provide desired variation in output droplet volume for each nozzle, e.g., to cause each nozzle to have at least one waveform choice that produces a near-ideal droplet volume (e.g., a mean droplet volume of 10.00 pL) and to accommodate a range of deliberate volume variation for each nozzle that can be used to produce an ideal droplet size, ejection velocity and flight trajectory. In various embodiments, the same set of sixteen drive waveforms are used for all of the nozzles, though in the depicted embodiment, sixteen, possibly-unique waveforms are each separately defined in advance for each nozzle, each waveform conferring respective droplet volume (and velocity and trajectory) characteristics.

During printing, to control deposition of each droplet, data selecting one of the predefined waveforms is then programmed into each nozzle's respective registers 351, 352 or 353 on a nozzle-by-nozzle basis. For example, given a target droplet volume of 10.00 pL, nozzle driver 343 can be configured through writing of data into registers 351 to set one of sixteen waveforms corresponding to one of sixteen different droplet volumes. The volume produced by each nozzle would have been measured by the droplet measurement device 335, with nozzle-by-nozzle (and waveform-by-waveform) droplet volumes and associated distributions registered by the processor 323 and stored in memory. The processor can, by programming the register 351, define whether or not it wants the specific nozzle driver 343 to output a processor-selected one of the sixteen waveforms. In addition, the processor can program the register to have a per-nozzle delay or offset to the firing of the nozzle for a given scan line (e.g., to optionally correct for substrate skew, to correct for error including velocity or trajectory error, and for other purposes); this offset is effectuated by counters which delay firing of the particular nozzle by a programmable number of timing pulses for each scan. To provide an example, if the result of droplet measurement indicates that one particular nozzle's droplet tends to have a lower than expected velocity, then the corresponding nozzle waveform can be triggered earlier (e.g., advanced in time, by reducing a dead time preceding the active signal levels used for piezoelectric actuation); conversely, if the result of droplet measurement indicates that the one particular nozzle's droplet has a relatively high velocity, then the waveform can be triggered later, and so forth. Other examples are clearly possible—for example, a slow droplet velocity can be counteracted in some embodiments by increasing drive strength (i.e., signal levels and associated voltage used to drive a given nozzle's piezoelectric actuator). In one embodiment, a sync signal distributed to all nozzles occurs at a defined interval of time (e.g., one microsecond) for purposes of synchronization and in another embodiment, the sync signal is adjusted relative to printer motion and substrate geography, e.g., to fire every micron of incremental relative motion between print head and substrate. The high speed clock ($\varphi_{hs}$) is run thousands of times faster than the sync signal, e.g., at 100 megahertz, 33 megahertz, etc.; in one embodiment, multiple different clocks or other timing signals (e.g., strobe signals) can be used in combination. The processor also optionally programs values defining or adjusting print grid spacing (or equivalently, timing); in one implementation, the print grid spacing is common to the entire pool of available nozzles and is equal to the halftone grid spacing, though this need not be the case for each implementation. For example, in some cases, a printer grid can be defined in a manner that adjusts timing (e.g. phase) of each nozzle's droplet patterns so as to compensate for substrate skew or other factors. Thus, in one optional embodiment, nozzle firing patterns can be varied to effectively transform the halftone grid to match a substrate geography that is a priori unknown (e.g., with software rotating or adjusting the printer instructions as necessary for proper printing). Clearly, many design alternatives are possible. Note that the processor 323 in the depicted embodiment can also dynamically reprogram the register of each nozzle during operation, i.e., the sync pulse is applied as a trigger to launch any programmed waveform pulse set in its registers; if new data is asynchronously received by the depicted circuitry before the next sync pulse (e.g., to adjust a droplet waveform and potentially droplet timing, trajectory and/or volume), then the new data will be applied with the next sync pulse. The processor 323 also controls initiation and speed of scanning (355) in addition to setting parameters for the sync pulse generation (356). In addition, the processor controls optional rotation of the print head (357), for the various purposes described above. In this way, each nozzle can concurrently (or simultaneously) fire using any one of sixteen different waveforms for each nozzle at any time (i.e., with any "next" sync pulse), and the selected firing waveform can be switched with any other of the sixteen different waveforms dynamically, in between fires, during a single scan.

Figure 3C:
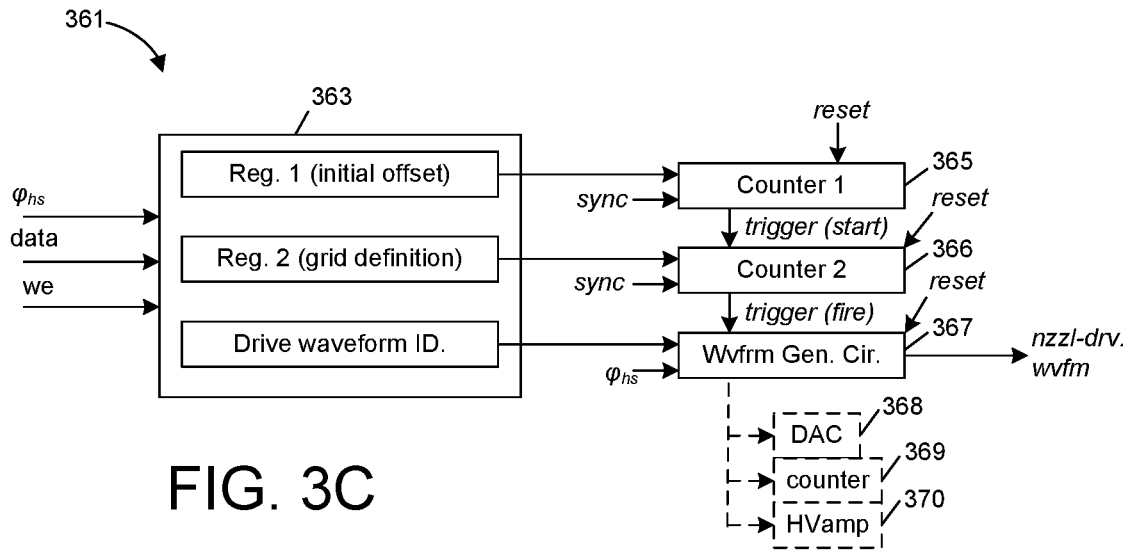
FIG. 3C shows circuitry associated with generating and applying a desired waveform at a programmed time (or position) to a nozzle of a print head; this circuitry provides one possible implementation of each of circuits 343/351, 344/352 and 345/353 from FIG. 3B, for example.

FIG. 3C shows additional detail of circuitry (361) that can be used in such an embodiment to generate output nozzle drive waveforms for each nozzle; the output waveform is represented as "nzzl-drv. wvfm" in FIG. 3C. More specifically, the circuitry 361 receives inputs of the sync signal, a single-ended or differential line carrying serial data ("data"), a dedicated write enable signal (we) and the high speed clock ($\varphi_{hs}$). A register file 363 provides data for at least three registers, respectively conveying an initial offset, a grid definition value and a drive waveform ID. The initial offset is a programmable value that adjusts each nozzle to align with the start of a print grid. For example, given implementation variables such as multiple print heads, multiple rows of nozzles, different print head rotations, nozzle firing velocity and patterns and other factors, the initial offset can be used to align each nozzle's droplet pattern with the start of the print grid, to account for delays, skew and other factors. Offsets can be differently applied across multiple nozzles, for example, to rotate a grid or halftone pattern relative to substrate geography, or to correct for substrate misalignment; advantageously, these functions can be performed by software, i.e., by instructions stored on non-transitory, machine-readable media. Similarly, offsets can also be used to correct for aberrant velocity or other effects. The grid definition value is a number that represents the number of sync pulses "counted" before the programmed waveform is triggered (e.g., representing a firing frequency); in the case of an implementation that prints flat panel displays (e.g., OLED panels), the halftone grid firing points presumably have one or more regular spacings relative to the different print head nozzles, corresponding to a regular (constant spacing) or irregular (multiple spacing) grid. Thus, if the grid spacing value was set to two (e.g., every two microns), then each nozzle could be fired at this interval. The drive waveform ID represents a selection of one of the pre-stored drive waveforms for each nozzle, and can be programmed and stored in many manners, depending on embodiment. In one embodiment, the drive waveform ID is a four bit selection value, and each nozzle has its own, dedicated 1 k-byte SRAM to store up to sixteen predetermined nozzle drive waveforms, stored as 16×16×4B entries. Briefly, each of sixteen entries for each waveform contains four bytes representing a programmable signal level, with these four bytes representing a two-byte resolution voltage level and a two-byte programmable duration, used to count a number of pulses of the high-speed clock. Each programmable waveform can thus consist of zero to up to sixteen discrete pulses each of programmable voltage and duration (e.g., of duration equal to 0-255 pulses of a 33 megahertz clock).

Numerals 365, 366 and 367 designate one embodiment of circuitry that shows how a specified waveform can be generated for a given nozzle. A first counter 365 receives the sync pulse, to initiate a countdown of the initial offset, triggered by start of a new line scan; the first counter 365 counts down in micron increments and, when zero is reached, a trigger signal is output from the first counter 365 to a second counter 366. This trigger signal essentially starts the firing process for each nozzle for each scan line. The second counter 366 then implements a programmable grid spacing in increments of microns. The first counter 365 is reset in conjunction with a new scan line, whereas the second counter 366 is reset using the next edge of the high-speed clock following its output trigger. The second counter 366, when triggered, activates a waveform circuit generator 367, which generates the selected drive waveform shape for the particular nozzle. As denoted by dashed line boxes 368-370, seen beneath the generator circuit, this latter circuit is based on a high speed digital-to-analog converter 368, a counter 369, and a high-voltage amplifier 370, timed according to the high-speed clock ($\varphi_{hs}$). As the trigger from the second counter 366 is received, the waveform generator circuit retrieves the number pairs (signal level and duration) represented by the drive waveform ID value and generates a given analog output voltage according to the signal level value, with the counter 369 effective to hold DAC output for a duration according to the counter. The pertinent output voltage level is then applied to the high-voltage amplifier 370 and is output as the nozzle-drive waveform. The next number pair is then latched out from registers 363 to define the next signal level value/duration, and so forth.

The depicted circuitry provides an effective means of defining any desired waveform according to data provided by the processor 323 from FIG. 3B. Software receives print instructions and adjusts or interacts with those instructions as necessary in order to comply with or correct for grid geometry or a nozzle with aberrant velocity or flight angle. The durations and/or voltage levels associated with any specific signal level (including a first, "delay" signal level of zero volts, which effectively defines an offset relative to sync) can be adjusted to this end. As noted, in one embodiment, the processor decides upon a set of waveforms in advance (e.g., sixteen possible waveforms, per-nozzle) and it then writes definition for each of these selected waveforms into SRAM for each nozzle's driver circuitry, with a "firing-time" decision of programmable waveform then being effected by writing a four-bit drive waveform ID into each nozzle's registers.

With optional circuitry for generating individual droplets (i.e., per nozzle droplets) thus described, this disclosure will now further discuss halftone generation techniques and associated error correction techniques. As should be appreciated, precise controls over per-nozzle droplet volume, for example, with a well formed understanding of per-nozzle droplet mean volume (and expected volume distribution) and a similar understanding for droplet flight and trajectory, and with optional circuitry for varying per-nozzle waveforms, droplet timing, droplet volume and other particulars, permits deposition of very precise ink droplets using the techniques described above.

Figure 4A:
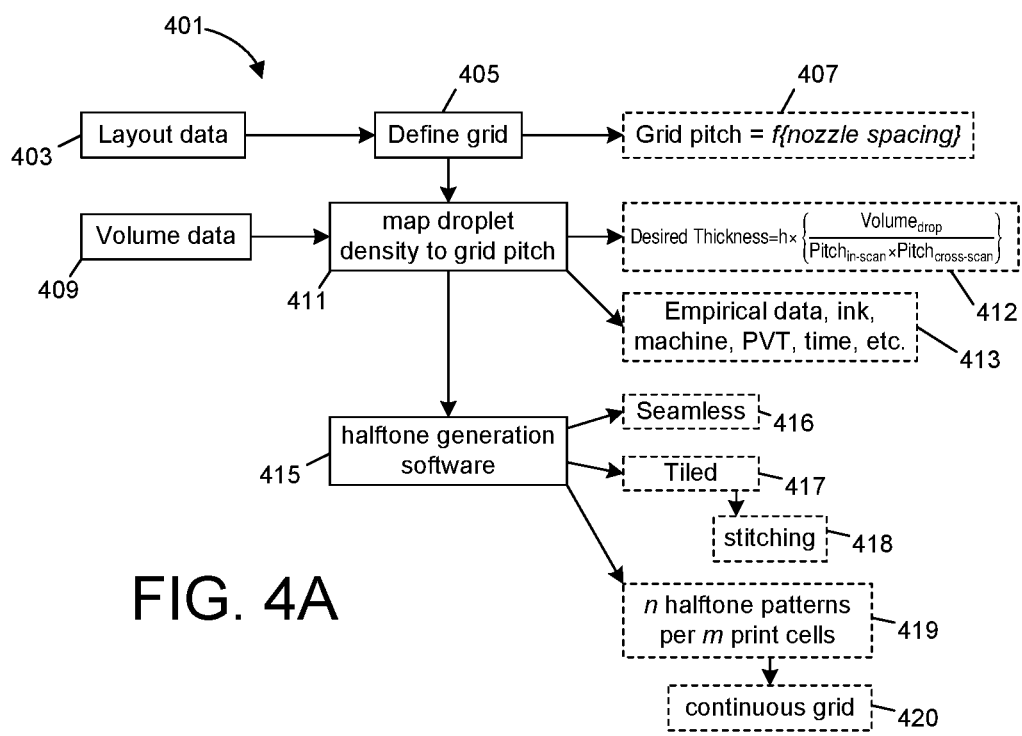
FIG. 4A provides a flow chart used to describe conversion of data representing thickness of a desired layer to a halftone image.

FIG. 4A provides a method diagram 401 for controlling layer thickness using halftoning. These techniques can optionally be used with the waveform tuning techniques and circuitry described above. More specifically, as depicted by numeral 403, layout data 403 is first received and used to define the desired grid (405). This grid will bear a relationship to nozzle spacing used by the printer (407) and, accordingly, software determines this relationship and uses this relationship to plan halftoning and print parameters such as scan path, to develop printer control instructions. Software also receives ink volume data (409), which for example, identifies the amount of ink per unit area needed to achieve a desired layer thickness. Note that in one embodiment, the correlation between volume and thickness is measured after test layer formation (e.g., after cure or drying). In a variation, the correlation is measured on the basis of thickness of wet ink following one or more print head passes. In one embodiment, software then maps droplet density to grid pitch (411), for example, using the formula $$\text{Desired Thickness} = h \times \left\{ \frac{\text{Volume}_{drop}}{\text{Pitch}_{in\text{-}scan} \times \text{Pitch}_{cross\text{-}scan}} \right\}$$

as also seen within dashed-line box 412. The in-scan pitch represents the spacing between drop opportunities in a first direction of relative motion between the print head and substrate, the cross-scan pitch represents the spacing between drop opportunities in a direction generally perpendicular to (or otherwise independent of) this first direction, and the parameter h (times 100) is the grayscale value in percentage. In one embodiment, this relationship can vary over time and, thus, can be re-measured to develop empirical data (413), for dynamic factors such as process or temperature, for specific machine or ink particulars, for nozzle age, or for other factors.

With desired droplet density identified, software then invokes a halftone pattern generation subroutine (or a separate software planning process), as represented by numeral 415. In one embodiment, this planning can be performed by a remote computer while, in another embodiment, this process is integrated with the printer. The halftone pattern generation function plans droplet deposition patterns so as to produce droplet patterns, with each droplet having substantially uniform volume, according to a selection of points on a halftone grid. In another embodiment, droplet variation is not necessarily uniform, but rather, droplet measurements are factored into halftone pattern generation, i.e., such that selected gridpoints for droplet firings contemplate specific droplet volumes (or trajectories or velocities) associated with nozzles firing at those points, with the halftoning generation accommodating (and factoring in) nozzle-to-nozzle variation. Ideally, the pattern is defined so that the spreading of ink produces a locally continuous layer of material of homogeneous thickness. Planned as a single process covering the area of the entire layer (to be deposited on the substrate), and according to a single halftone grid that spans the deposition area of interest, the ink is deposited ideally in a manner that is seamless (416), i.e., to avoid Mura. As mentioned earlier, in one embodiment, desired layer thickness is apportioned to different "print cells" with a thickness or grayscale value applied to each print cell, and with the halftone generation software receiving a grayscale image (i.e., an array of grayscale values) and developing a halftone pattern based on this grayscale image (e.g., with local ink volume variation controlled by individual print cell values and with error diffusion relied upon as appropriate to achieve desired homogeneity). As noted, in another embodiment, halftone patterns can be separately (independently) planned for each of plural "tiles" of adjacent deposition areas (417) with halftone droplet patterns for each tile planned, but with halftoning performed in a complementary manner (418), such that droplet patterns are "stitched together" on a common grid, once again to avoid Mura. This is discussed below in connection with FIG. 5D. Note that seamless pattern interface (e.g., "stitching") can be enhanced through the use of a continuous grid (420). In such an embodiment, groups of one or more print cells (e.g., "m" print cells) can be equated to groups of one or more tiles (e.g., "n" tiles) and used to generate a halftone pattern for each tile, per process 419.

FIG. 4B provides another flow diagram 421 associated with these processes. As with the earlier examples, data representing layout of a desired layer is first received, per numeral 423. This data specifies boundaries of the layer to be deposited and provides information sufficient to define thickness throughout the layer. This data can be generated on the same machine or device on which the process 421 is performed, or it can be generated by a different machine. In one embodiment, the received data is defined according to an x-y coordinate system and the provided information is sufficient to compute desired layer thickness at any represented x-y coordinate point, for example, optionally specifying a single height or thickness to be applied throughout the layer, consistent with the x-micron by y-micron by z-micron example introduced earlier. Per numeral 425, this data can be converted to a grayscale value for each print cell in a deposition area that will receive the layer. If print cell area does not inherently correspond to the x-y coordinate system matching the layout data, then the layout data is converted (e.g., by averaging thickness data for multiple coordinate points and/or using interpolation) to obtain a grayscale value for each print cell. This conversion can be based on predetermined mapping information, for example, produced using relationships or equations such as those discussed above. Per numeral 427, correction can optionally be performed at this stage upon the grayscale values in order to ultimately produce a homogeneous layer (or for other desired effect). To provide one example (which will be discussed further below), if it is desired to compensate for varying heights of microstructures that will sit underneath the desired layer, an optional technique adds offsets to select grayscale values to "boost" the layer of interest at specific locations to effectively planarize a top surface of the deposited layer; for example, a desired 5.0 micron thick encapsulation layer is desired across a deposition region, and structures defining the underlying substrate vary by e.g., a micron in thickness, then grayscale values could be manipulated to deposit 6.0 micron thick encapsulation in some areas, in an effort to produce a level top surface of the encapsulation layer. Other techniques are also possible. In one embodiment, such grayscale value manipulation can also be used to correct for nozzle firing aberration (e.g., in the in-scan direction) to deposit more ink (for example, if a particular nozzle or set of nozzles produce insufficient ink volume) or less ink (e.g., the particular nozzle or set of nozzles produce excess ink volume). Such an optional process can be predicated on a calibration process and/or empirically-determined data, per function block 434. The grayscale values are then converted to a halftone pattern, per numeral 429, with error diffusion across the halftone grid relied upon to help ensure localized layer homogeneity. Based on this halftoning process, a print image (or other printer control instructions) is then generated, per numeral 430.

FIG. 4B also shows use of a number of optional error correction processes 433, applied to help ensure uniformity in the deposited layer. Such uniformity can be important to device quality, whether to ensure development of adequate encapsulation to produce a water/oxygen barrier, or to provide high-quality light generating or light guiding elements of a display panel, or for other purpose or effect. As noted above, a calibration process or empirically determined (dead-reckoned) data can be used to correct grayscale values attributable to nozzle droplet variation or other factors, per numeral 434. Alternatively, individual nozzle drive waveforms can be planned or adjusted to correct error, as represented by numeral 435. In yet another embodiment, nozzles can be validated or qualified (439), with each nozzle either determined to meet minimum droplet generation thresholds or disqualified from use. If a specific nozzle is disqualified, then in order to generate the desired halftone pattern, a different nozzle (or repeated pass of acceptable nozzles) can be used to deposit the droplet(s) that would otherwise have been printed by the disqualified nozzle, per numeral 436. For example, in one embodiment, a print head has nozzles arranged both in rows and columns, such that if one nozzle is aberrant, a different, redundant nozzle can be used to deposit the droplet desired for a particular grid point. Optionally also, such issues can be taken into account and used to adjust a scan path, for example, offsetting the print head in a manner such that the desired droplet(s) can be deposited using a different nozzle (with the print head adjusted in position so as to permit this). This is represented by the numeral 437 in FIG. 4B. Alternatively, an error can be generated (438) and used to prompt software to select a different halftone pattern (e.g., that relies on a different nozzle). Many such alternatives are possible. As represented by numerals 440 and 441, in one embodiment, each nozzle is calibrated in advance using a droplet measurement device (440) that repeatedly measures droplet parameters (to develop a per-nozzle or per-drive waveform distribution of measurements), with software then building a statistical model (441) for each nozzle with an understanding of nozzle droplet means for volume, velocity and trajectory, and with an understanding of expected per-nozzle variance for each of these parameters. This data can be used to qualify/validate specific nozzles (and/or droplets), as mentioned, or to select nozzles or nozzle waveforms that will be used to produce each individual droplet. Each such measurement/error correction process can be factored into print planning (431), including scan path planning, i.e., such that printer data (or print control instructions) are generated and/or updated so as to optimize the print process, while ensuring desired layer properties. Finally, per numeral 445, final printer data (e.g., a final print image or other printer control instructions) is then generated for sending to the printer at fabrication time.

As noted, in order to assess the need for error correction, a calibration process can be performed specific to the ink, machine and process that will be used to form the desired layer of material. In one embodiment, therefore, techniques introduced herein can be applied to test droplet and/or halftone parameters and to provide inputs that ultimately affect the halftone pattern or final print image. For example, such calibration can be used to gauge grayscale values (e.g., in order to determine which grayscale values to apply to particular desired thicknesses) or to calibrate halftone generation so that generated halftone patterns reliably map assigned grayscale values to the desired thicknesses. Other alternatives are also possible. Exemplary techniques based on patterns are generally designated by numeral 451 in FIG. 4C, while exemplary techniques based on individual droplet measurement and nozzle qualification are explained in reference to FIG. 4D.

As part of the calibration process, a halftone pattern (or associated halftoning parameters) can be assigned to thickness data (452) to generate a print image 453 representing a layer. The layer can be part of a test run, for example, selected to provide uniform layer thickness atop a flat substrate, but alternatively, can be data correlated in advance with expected results. In one embodiment, the data can represent a standard applied in a "live" print process or product run. As before, the print image is formed by translating desired layer thickness for each of plural print cells into associated grayscale values (i.e., with a grayscale value for each print cell). Each per-print cell grayscale value is used to select a halftone pattern. In this embodiment also, the halftone pattern is optionally selected to produce a macroscopically-continuous film (e.g., so as to produce a layer impervious or resistant to penetration by water or oxygen). As represented by alternate flow paths 455 and 457, the halftone print image can be used either to control a printer in an actual deposition process or can be applied to a simulation process (i.e., by a software program) to simulate/estimate qualities of the finished layers, given any other pertinent process parameters (e.g., dot gain for a particular ink formulation, measured droplet volumes and so forth). For example, with a test deposition, a resultant device could be measured with a stylus profilometer, optical interferometer or camera, with the results used to assess layer quality. See, e.g., the discussion of FIGS. 7A and 7D below. Any results are then analyzed, per numeral 459, to assess uniformity and presence of defects, holes or voids. More generally, the results are compared by an error process (461) with expected results (462) to determine deviation. For example, a fabricated or simulated layer may be thinner in some areas than in other areas which, if a uniformly flat layer was expected, might represent a failure in the nozzle firing pattern. The error process 461 detects such deviations and correlates deviations with specific types of errors. If no deviation is detected, and the layer has exactly the correct thickness, the process tentatively associates the selected grayscale values with a specific thickness and updates stored data or other settings, as appropriate, per numerals 463 and 465. Note that this association can later be adjusted/updated as necessary, via another loop or pass of the configuration method 451. The method 451 can then be repeated (466) for other desired layer thicknesses and/or gradients, in order to fully develop a comprehensive mapping between different selectable grayscale values and desired thicknesses. Per numeral 467, if deviation between the simulated or physical layer and the expected data is detected, associated process parameters are responsively adjusted. As reflected by numerals 468-472, some of the parameters that can be adjusted include selected grayscale values (e.g., the relation of grayscale values to thicknesses is changed if the test layer is too thick or thin), factors influencing dot gain (e.g., ink viscosity, surface tension or other factors) or drop coverage (e.g., droplet shape, size, driver waveform, etc.), grid spacing or mapping, or any other desired parameters. The process can incrementally adjust (e.g., increment or decrement) each setting, store updated adjustment data (473) as appropriate, and optionally repeat the method 451 to test the new settings. Once any adjusted settings are determined to be correct (i.e., when error process 461 detects no error), the settings and any adjustment data are stored per reference numeral 465. Note that in some applications (not necessarily all), scaling of grayscale values to desired thicknesses will be linear, such that this calibration process can be performed using only a small number (e.g., 2) of data points. Once this process is complete, a complete mapping should be available that links each permissible grayscale value to a specific layer thickness. At this point, the method ends. Note that the method 451 can be performed multiple times, e.g., to obtain halftone patterns to be applied for each of multiple specific machines or print heads, for use in general across plural machines or print heads, for each different types of ink or layer materials, or to customize process to any variable affecting the deposition process.

In some applications, it might be desired to deposit a layer of material over underlying structures, such as electric pathways, transistors and other devices. This might be the case where the desired application is solar panel or OLED fabrication, as non-limiting examples, and where the material layer is to "blanket" these structures. For example, the techniques discussed above can be applied to deposit one or more organic barrier or encapsulation layers, e.g., as part of an encapsulation layer stack that includes alternating organic/inorganic barrier layer pairs. In such an instance, it might be desired to have such encapsulation result in a relatively flat post deposition surface, notwithstanding varying topography created by underlying structures. To this effect, the method 451 can also be optionally performed for a given design, as represented by process block 475, to develop print cell-level (e.g., grayscale value) correction data that will be used to adjust the thickness of the encapsulation layer on a print cell-by-print cell basis to adjust jetted ink to account for variation in the height of underlying structures. Such correction data is optionally used to develop a correction image that can be used to adjust desired layer thickness for a particular design or, alternatively, to update/overwrite original thickness data by modifying grayscale values pre-deposition or by performing a second deposition. As an alternative, in many embodiments, a smoothing or barrier layer can also be deposited prior to encapsulation using conventional techniques, so as to effectively planarize the substrate prior to receiving the layer of interest. For example, a deposition process can be used to "fill in" and effectively planarize top surface layers of the substrate and, subsequently, encapsulation can be added using the printing process and related data conversions discussed herein. In yet another variation, in one error process, if it is determined that certain nozzle sets or grayscale values produce volumes that are off target, the original grayscale values can be adjusted at the level of the grayscale print image to correct for this error also. In another embodiment, corrections can be applied at the bitmap (i.e., print image) level. These processes are generally represented in FIG. 4C via the application of a substrate-level "map" or set of correction values, e.g., to planarize any deviation in a surface of a deposited layer. Whatever the motivation, numeral 475 represents that a correction can be applied, either to instructions for depositing ink, or via an additional post deposition process, to adjust (i.e., to normalize) data so as to obtain layer homogeneity.

Figure 4D:
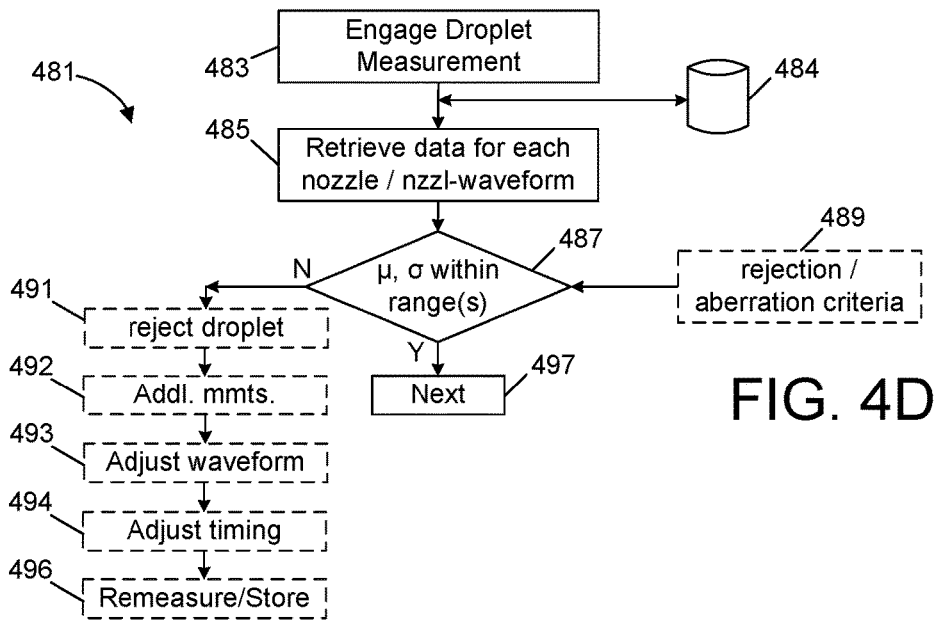
FIG. 4D is a flow diagram associated with droplet measurement and qualification.

FIG. 4D provides a flow diagram 481 relating to droplet measurement and nozzle qualification. In one embodiment, droplet measurement is performed within a printer using a droplet measurement device to obtain statistical models (e.g., distribution and mean) for each nozzle and for each waveform applied to any given nozzle, for each of droplet volume, velocity and trajectory. That is, as noted earlier, droplet volume and other droplet parameters can vary, not only-nozzle-to-nozzle, but over time, with each droplet varying according to statistical parameters. Thus, in order to model droplets and account for statistical variation, repeated measurements are taken and used to develop an understanding of a mean ($\mu$) and standard deviation ($\sigma$) for each of these parameters for each nozzle. For example, during a calibration operation (or maintenance operation), a number of measurements (e.g., 6, 12, 18, or 24 measurements) can be taken of droplets from a given nozzle and used to obtain a reliable indicator of droplet expected volume, velocity and trajectory. Such measurements can optionally be dynamically performed, e.g., every hour, day or on another intermittent or periodic process. Note that as referenced above, some embodiments can assign different waveforms for use in generating droplets of slightly different parameters from each nozzle (see FIGS. 3A-3C, discussed above). Thus, for example, if there are three choices of waveforms for each of a dozen nozzles, there are up to 36 waveform-nozzle combinations or pairings, or 36 different sets of expected droplet characteristics that can be obtained from the given set of nozzles; in one embodiment, measurements are taken for each parameter for each waveform-nozzle pairing, sufficient to develop robust statistical model for each pairing and sufficient to have a high-confidence, narrow distribution of droplet values. Note that, despite planning, it is conceptually possible that a given nozzle or nozzle-waveform pairing may yield an exceptionally wide distribution, or a mean which is sufficiently aberrant that it should be specially treated. Such treatment applied in one embodiment is represented conceptually by FIG. 4D.

More particularly, a general method is denoted using reference numeral 481. Data stored by the droplet measurement device 483 is stored in memory 484 for later use. During the application of method 481, this data can be recalled from memory and data for each nozzle or nozzle-waveform pairing can be extracted and individually processed (485). In one embodiment, a normal random distribution is built for each variable, described by a mean, standard deviation and number of droplets measured (n), or using equivalent measures. Note that other distribution formats (e.g., Student's-T, Poisson, etc.), can be used. Measured parameters are compared to one or more ranges (487) to determine whether the pertinent droplet can be used in practice. In one embodiment, at least one range is applied to disqualify droplets from use (e.g., if the droplet has a sufficiently large or small volume relative to desired target, then that nozzle or nozzle-waveform pairing can be excluded from short-term use). To provide an example, if 10.00 pL droplets are desired or expected, then a nozzle or nozzle-waveform linked to a droplet mean more than, e.g., 1.5% away from this target (e.g., <9.85 pL or >10.15 pL) can be excluded from use. Range, standard deviation, variance, or another spread measure can also or instead be used. For example, if it is desired to have droplet statistical models with a narrow distribution (e.g., $3\sigma<\pm0.5\%$ of mean), then droplets from a particular nozzle or nozzle-waveform pairing with measurements not meeting this criteria can be excluded. It is also possible to use a sophisticated/complex set of criteria which considers multiple factors. For example, an aberrant mean combined with a very narrow distribution might be okay, e.g., if it is desired to use droplets with $3\sigma$ volume within 10.00 pL±0.1 pL, then a nozzle-waveform pairing producing a 9.96 pL mean with ±0.08 pL $3\sigma$ value might be excluded, but a nozzle-waveform pairing producing a 9.93 pL mean with ±0.03 pL $3\sigma$ value might be acceptable. Clearly there are many possibilities according to any desired rejection/aberration criteria (489). Note that this same type of processing can be applied for per-droplet flight angle and velocity, i.e., it is expected that flight angle and velocity per nozzle-waveform pairing will exhibit statistical distribution and, depending on measurements and statistical models derived from the droplet measurement device, some droplets can be excluded. For example, a droplet having a mean velocity or flight trajectory that is outside of 5% of normal, or a variance in velocity outside of a specific target, could hypothetically be excluded from use. Different ranges and/or evaluation criteria can be applied to each droplet parameter measured and provided by storage 484.

Depending on the rejection/aberration criteria 489, droplets (and nozzle-waveform combinations) can be processed and/or treated in different manners. For example, a particular droplet not meeting a desired norm can be rejected (491), as mentioned. Alternatively, it is possible to selectively perform additional measurements (492) for the next measurement iteration of the particular nozzle-waveform pairing; as an example, if a statistical distribution is too wide as a function of measurement error, it is possible to take additional measurements for the particular nozzle-waveform, so as to improve confidence of averaged values (e.g., variance and standard deviation are dependent on the number of measured data points). Per numeral 493, it is also possible to adjust a nozzle drive waveform, for example, to use a higher or lower voltage level (e.g., to provide greater or lesser velocity or more consistent flight angle), or to reshape a waveform so as to produce an adjusted nozzle-waveform pairing that meets specified norms. Per numeral 494, timing of the waveform can also be adjusted (e.g., to compensate for aberrant mean velocity or droplet volume associated with a particular nozzle-waveform pairing). As an example, as noted earlier, a slow droplet can be fired at an earlier time relative to other nozzles, and a fast droplet can be fired later in time to compensate for faster flight time. Many such alternatives are possible. Per numeral 496, any adjusted parameters (e.g., firing time, waveform voltage level or shape) can be stored for use during print scan planning. Optionally, if desired, the adjusted parameters can be applied to remeasure (e.g., validate) one or more associated droplets. After each nozzle-waveform pairing (modified or otherwise) is qualified (passed or rejected), the method then proceeds to the next nozzle-waveform pairing, per numeral 497.

Figure 5A:
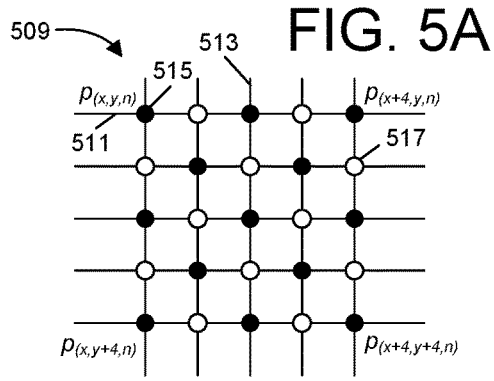
FIG. 5A shows one halftone pattern representing a specific ink volume for a print cell.

FIG. 5A shows a first example 509 of a halftone pattern and an associated, hypothetical grid. In FIG. 5A, the grid is seen to have five vertically-separated or "y" coordinates (represented for example by axis 511) and five horizontally-separated or "x" coordinates (represented for example by axis 513). Note that typically a grid is much larger, and a five-by-five array of grid intersections is depicted simply for purposes of illustration. Each intersection between a vertical axis and a horizontal axis defines a grid point, such as point 515. Each point thus has a coordinate set associated with it, expressed as p(x,y,n) in FIG. 5A. The value "n" in this example refers to the $n^{th}$ pass of a print head, i.e., grid points can optionally be repeated during a printing process or made respective to different print heads or print head passes. Given this coordinate system, points seen on the top line of the grid in this example have coordinates p(x,y,n), p(x+1,y,n), p(x+2,y,n), p(x+3,y,n) and p(x+4,y,n); each depicted point in this example is thus a possible droplet coordinate associated with one pass of a single print head. Naturally, this coordinate system is exemplary only, and any type of coordinate system can be used. In FIG. 5A, a solid dot at a particular grid point (such as at point 515) indicates that, according to a selected or calculated halftone pattern, an ink jet droplet is to be dispensed at that point, while a hollow circle at a grid point (such as at point 517) indicates that no ink droplet is to be dispensed at that point. For the halftone pattern represented by FIG. 5A, for example, ink will be dispensed at point 515 but not at point 517. As mentioned, in one embodiment, each grid point, such as point 515, corresponds to an individual print cell; in other embodiments, this need not be the case. The depicted grid coordinates and "dot" system should not be confused with ultimate extent of area coverage from ink on a printable surface of the substrate. That is, ink as a fluid will spread and cover a larger surface area than represented by the dots 515 and 517 seen in FIG. 5A, a result which is referred to as "dot gain." The larger the dot gain, the greater the spreading of each ink droplet. In the example presented by FIG. 5A, assuming consistent grid spacing, the minimum dot gain should at least be sufficient to allow the minimum halftone droplet density (e.g., given ink viscosity, manufacturer grid specification and other particulars) to produce a continuous film. In practice, where a continuous film is desired, the dot gain will typically be much larger than the distance between closest grid points, e.g., sufficient to account for no ink printed at the substantial majority of the print cells, and with error diffusion relied upon (given ink viscosity) to provide homogeneity in the finished layer. For example, in a hypothetical case where every grid point exactly corresponds to a respective print cell, if every print cell were assigned the same grayscale value (e.g., "50%"), then half of the print cells would receive printed ink and half would not, with error diffusion (and ink droplet spreading) resulting in a homogeneous layer thickness.

Figure 5B:
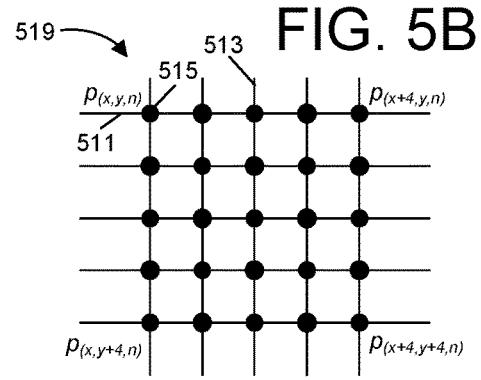
FIG. 5B shows another halftone pattern representing a specific ink volume; more particularly.

By comparing the halftone pattern 509 of FIG. 5A to a halftone pattern 519 seen in FIG. 5B, one can observe relative effects of FM halftoning. In the case of these FIGS, the ejected droplets are all depicted to be the same size, so for a thicker layer, a denser droplet pattern is used (e.g., more solid dots at grid intersections), and for a thinner layer, a less dense droplet pattern is used (e.g., fewer solid dots at grid intersections). FIG. 5A shows an approximately 50% density of droplets that will achieve this effect, whereas FIG. 5B shows that all grid coordinates (such as at point 515) have a solid circle, indicating a droplet firing at the particular grid coordinate. The depiction in FIGS. 5A and 5B might therefore correspond to respective grayscale values of 127 and 255, respectively (in a system having 256 possible values), or 50% and 100% (in a percentage based system). Again, other numbering schemes are also possible and it should be understood that the correspondence between layer thickness and droplet density may be dependent on dot gain and/or may be nonlinear; for example, where the minimum number of droplets for the depicted 25 gridpoints needed to obtain continuous coverage is "5," the halftone pattern of FIG. 5A might correspond to a grayscale value of 40% ((13−5)/20).

Note that the "grid" typically represents all possible firing positions of a group of ink jet nozzles and that each grid point in the halftone print image uses exactly 1-bit, denoting whether or not a droplet is to be ejected; thus, different "x" separations depending on embodiment will represent different nozzle firing times and/or firing from different print heads and/or different print head passes. A nozzle error (e.g., failure to fire) will appear as a regular pattern and can be detected through errors in a deposited layer. Reflecting back on the discussion earlier, related to error correction, if it is determined in practice that a particular nozzle does not operate, the depicted grid might be printed with errors that would be observed as thickness variation in the deposited layer. To mitigate this error, the halftone pattern(s) (or grayscale value(s)) could be adjusted so as to increase ejected ink volume for adjacent grid positions, or otherwise change drop shape, frequency or firing time. Mitigation is seen in FIG. 5E for example, where it is noted that droplets 535 (from adjacent working nozzles) are deliberately larger to account for missing droplets 533 that should have been printed by a defective nozzle. Alternatively, per FIG. 5F, if a relatively sparse droplet pattern is applied (e.g., per the example of FIG. 5A) but a nozzle is misfiring and thus incapable of ejecting droplets at position 537, the droplets can be moved into adjacent lines (539/541) printed by working nozzles to maintain local droplet density. Other examples are also possible. Corrections can optionally be applied using any of the mentioned techniques, e.g., increasing or decreasing droplet size, moving droplets in a local area, adjusting electrical firing pattern for a nozzle, adding print head passes, increasing size or shape of selected droplets, and so forth.

Figure 5C:
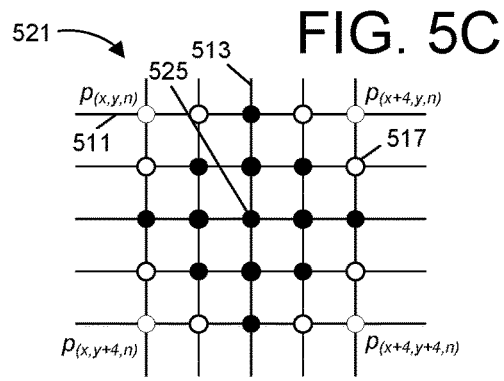
FIG. 5C shows another halftone pattern representing a specific ink volume; more particularly.

FIG. 5C provides a third example halftone pattern example, 521. Taken together with pattern 509 seen in FIG. 5A, FIG. 5C provides an example of amplitude modulated ("AM") halftoning, where apparent droplet size is varied by providing a variable concentration (or cluster) of droplets, depending on grayscale value(s). For example, a concentration of dots centered at point 525 represents the same ink volume as the pattern from FIG. 5A, with individual droplets again fired on a binary decision basis, but with the relative concentration of droplets regionally varied. AM halftoning can therefore also optionally be used to vary layer thickness over an area of substrate. As with the examples before, thickness data for a desired layer can be converted to grayscale values, and the grayscale values can then be mapped to a halftone pattern; where AM halftoning is used, larger grayscale values result in a generally corresponding area of the substrate receiving larger apparent droplets.

Figure 5D:
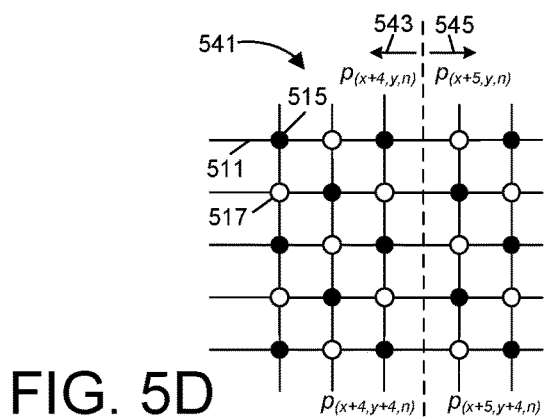
FIG. 5D shows the optional use of complementary (or "stitched") halftone patterns for adjacent tiles.

FIG. 5D provides a grid depiction used to illustrate optional variation of halftone patterns to "stitch" together adjacent tiles of the substrate, to avoid Mura effect. In such an optional embodiment, halftone patterns for each of multiple "tiles" can be made dependent on patterns selected for adjacent tiles to provide for seamless droplet densities across tiles. For example, FIG. 5D shows a hypothetical droplet deposition pattern 541 where a first region 543 is seen to correspond to the pattern of FIG. 5A (approximately 50% halftoning) and where a second region 545 has a similar halftone pattern, also providing 50% density. Generally speaking, this FIG. represents a situation where different regions of the substrate receive independently generated halftone patterns, and where it is desired to "stitch" adjacent patterns together in a manner that is complementary, i.e., to avoid Mura. For region or "tile" 545, the halftone pattern is therefore seen to be varied (e.g., inverted in this case) and selected such that seamless blending between tiles 543 and 545 occurs. To provide an example, if the pattern from FIG. 5A was selected for both print regions or tiles (i.e., 543 and 545), then each of adjacent grid coordinate pairs $p(x+4,y,n)$ and $p(x+5,y,n)$, $p(x+4,y+3,n)$ and $p(x+5,y+3,n)$ and $p(x+4,y+5,n)$, $p(x+5,y+5,n)$ would be represented using black-filled circles, corresponding to a local increase in droplet density. By selecting the halftone pattern for tile 545 in a manner dependent on the pattern selected for tile 543, an appropriate pattern can be selected that provides for seamless transitions in droplet pattern between tiles. There are also other techniques for achieving variation, such as rotation of halftone patterns (e.g., using the techniques discussed above in connection with FIGS. 3A-C), and so forth. Note that as depicted in FIG. 5D, both tiles use a common grid, such as represented by a common horizontal axis 511; this facilitates seamless stitching so as to avoid existence of a defect in between tiles. Tiles (i.e., independent halftone pattern selection for different, abutting substrate regions) can be used in one embodiment, but are, generally speaking, not required to implement the techniques described herein.

The various halftone patterns introduced above for FIGS. 5A-5F are provided as illustrative examples of halftone patterning only. Many additional patterns can be conceived for a given grayscale value (or ink volume). Any particular halftone pattern (or multiple patterns for respective tiles) can be adjusted to correct for errors and otherwise promote uniformity in the fabricated layer.

FIG. 6A provides a table 601 that exemplifies a number of print cells, such as print cell 603. Note that each cell contains a "grayscale" value, such as the value "203" depicted within print cell 603. All print cells having a non-zero value represent the deposition area that is to receive the layer material to be jetted, i.e., each numerical value represents a layer thickness for a substrate region corresponding to the x-y position of the corresponding print cell, where thickness has been converted to a grayscale value. This value can be empirically mapped in advance to the desired thicknesses (e.g., 1.0 micron thickness to a 10% or "25.5" grayscale value as a hypothetical example), with such mapping possibly varying dependent on ink, printer, temperature, process and other parameters. Alternatively, as the end goal is that the assigned halftone pattern should provide an ink volume that will correspond to desired thickness, variable mapping can be provided between the assigned grayscale values and halftone pattern selection. Thus, in one embodiment, the grayscale values assigned to various thicknesses are fixed (e.g., 10% of maximum value per micron of thickness, following the hypothetical just presented) but with a variable mapping between each grayscale value and halftone pattern selection. Other variations are also possible.

Note that, as alluded to earlier, there exist alternate error correction techniques (i.e., besides adjustment of individual nozzle particulars). Thus, FIG. 6B shows a grayscale image 611 that is similar to FIG. 6A, but where the last row (i.e., represented by print cell 603) has had its grayscale values increased, i.e., by "5" in this hypothetical example. Assuming a left to right scanning motion relative to the orientation of FIG. 6B, if it were determined (e.g., empirically or automatically) that nozzles corresponding to this last row tended to produce low volume drops, the grayscale data could be increased for the affected print cells such that, when printed, any aberrations in layer thickness are corrected. Conversely, if a particular row of print cells featured high drop volumes, it would be possible to artificially decrease grayscale values pertinent to affected print cells so as to planarize the resultant layer. Such a technique is especially useful where print cell size corresponds to each point of the halftone/print grid. Note that such adjustment need not be done by row or column or by scan path, i.e., it is possible to apply error adjustment on the basis of a map representing all or part of a printing substrate to adjust the grayscale values assigned to select print cells. As will be discussed below and elsewhere herein, such techniques can also be employed to vary edge build-up, i.e., to promote uniformity right up to a boundary or edge of the deposited layer.

FIG. 7A provides a graph, generally designated by numeral 701, showing thickness profiles of fabricated films obtained with a stylus profilometer, useful in connection with the calibration process seen in FIG. 4C. Following the production of actual test layers of material, or simulation of those layers, grayscale values corresponding to an ink volume can be correlated with different steps in layer thickness. For example, a first curve 703, representing a 1.0 micron thick layer, is associated with a grayscale value representing an 8% fill (or 8% of maximum print cell ink volume for a given pass or operation). Note that the film is continuous, i.e., there are no gaps in the center of the layer represented by curve 703, which is seen to have substantially uniform thickness. For a subsequent fabrication process, if a layer thickness of 1.0 micron was assigned by received layout data for the deposited layer, this quantity of 1.0 micron would be converted to a a grayscale value for each print cell, as appropriate, and the grayscale value for print cells in a locality would then be applied to select a halftone pattern that would distribute droplets to various halftone grid points associated with that locality in order to achieve a uniform deposited layer (following droplet spreading). Similarly, a second curve 705 is seen to represent a uniform 2.0 micron thick layer, corresponding to 16% fill. Based on such test or calibration data for the particular process, a halftone pattern correlated to 16% ink volume for a particular substrate region might be generated to produce a 2.0 micron thick layer. Mappings between layer thickness values and/or grayscale values and/or halftone pattern selection can also be extrapolated using this process; as an example, if layout data called for a 1.5 micron thick encapsulation layer, grayscale values selected to correspond to a point roughly between these two values (12%) could be applied (e.g., halfway between 8% and 16%). Other illustrated curves 707, 709, 711 and 713, respectively corresponding to 3.0, 4.0, 5.0 and 6.0 micron-thick layers are associated with grayscale values of 24%, 32%, 40% and 50%, respectively. By specifically matching different grayscale values to respective layer thicknesses, and associating halftone patterning used to deliver a corresponding amount of ink to a print cell, a designer can customize ink deposition to any desired thickness in a manner that will lead to predictable results; this provides a high degree of control over thickness of material deposited via fluidic ink.

In many applications, it is also desirable to provide a crisp, straight edge at border regions. For example, if a halftone pattern representing a low droplet density is selected for a border region, then it is possible, given ink and deposition properties, that the deposited layer will have a jagged, tapered or interrupted edge. To mitigate this possibility, in one embodiment, software detects print cells that would produce such an edge and adjusts halftoning (i.e., as a function of grayscale value gradient) to provide a crisp, straight edge that, in effect, frames the deposited layer. For example, FIG. 7B provides a box 725 representing a corner of a deposited layer, with grid points not shown. To produce a thin film, the halftone patterning can be made relatively sparse in area 727. If used in border regions 729, 731, and 733 this density may produce a jagged edge. Thus, the density of droplets in areas 729, 731 and 733 can be purposely increased to improve edge linearity. If box 725 represents a print cell along an intermediate, left edge of a deposited layer, it would suffice to increase the density in area 729.

Note that in addition to adjusting gray scale values for border regions, it is also possible to adjust halftoning applied to such a region. For example, FIG. 7C shows an exemplary halftone pattern 741 that could be used where (as in the case of box 733 of FIG. 7B), the region represents the corner of a deposited film; note that FIG. 7C is similar to FIGS. 5A-5F in its use of a grid and solid fill circle to denote a droplet ejection point. The particular halftone pattern represented in FIG. 7C represents the same ink volume as the pattern seen in FIG. 5A (i.e., 13 of 25 possible droplets ejected). However, the pattern in FIG. 7C features relatively dense use of droplets along a top edge 743 of the substrate and a left edge 745 of the film, while interior region 747 is left relatively sparse, i.e., to produce relatively crisp left and upper edges.

Note that the use of such framing or "fencing" techniques is not required for all embodiments, and it is within the capabilities of one of ordinary skill in the art to determine the best strategy for a particular application, ink and process technology.

FIG. 7D represents a graph 751 that illustrates how grayscale image adjustment can be used to shape layer edges. More specifically, three curves 753, 755 and 757 are presented in FIG. 7D, obtained using stylus profilometer measurements of fabricated 6.0 micron encapsulation layers. The differences between these curves were produced by varying the grayscale values applied to print cells that abut edges. Relative to a baseline represented by curve 753, curve 755 represents a process where the grayscale value (and associated ink volume for the print cell) is decreased on approach to a boundary in the encapsulation layer (e.g., before the encapsulation layer periphery). By contrast, curve 757 represents a process where the grayscale value is increased for print cells abutting the same boundary; note that layer thickness actually increases slightly immediately before the boundary, e.g., at x positions of 2000 μ and 17000 μ. By adjusting the grayscale values for border regions, a designer can adjust edge buildup at layer boundaries in a desired manner, including for purposes of providing a uniform layer thickness or surface, or smoothing or enhancing transitions. Note that the amount of the ink buildup adjacent to the layer edges will be largely dependent on ink properties, such as surface tension (and its dependence on temperature). For example, some inks may naturally form a lip, or so-called capillary ridge, (e.g., such as represented at point 759 of curve 757); in such an event, the grayscale adjustment process just described can be applied so as to remove this lip, e.g., to help tailor thickness of the ultimate layer by decreasing grayscale values for print cells abutting a layer edge, such that the profile of the permanent layer more closely matches curve 753.

Returning briefly to the discussion of edge enhancement (see the discussion of FIG. 7C, above), it is also possible to employ multiple processes to tailor a layer's edge profile. FIG. 7E shows a portion of a substrate 761 that is to have a central region 763 of uniform layer thickness, a border region 765 of "adjusted" droplet density (i.e., selected so as to avoid edge buildup) and a set of fencing clusters 767 selected to provide edge uniformity. Perhaps otherwise stated, central region 763 represents an area of substantially uniform ink volume density, border region 765 represents an area of adjusted ink density (e.g., reduced density) relative to the central region, and fencing clusters 767 represent a relatively dense ink density selected to provide sharp, well-defined layer edges. In the presented example, halftoning might be performed based on uniform grayscale values in the central region (e.g., subject perhaps to nozzle error correction or underlying substrate geography correction, depending on embodiment) and adjusted grayscale values in the border region (e.g., selected so as to avoid edge buildup "horns" 715, seen in FIG. 7A). Halftoning can be based on the entire collection, or for example, the central and border region only (i.e., with fencing enforced following, and irrespective of, halftoning process). As should be appreciated by this example, many variations are possible which rely on grayscale and/or halftone variation in order to tailor edge buildup and/or provide for desired edge characteristics.

Naturally, while this example has been discussed in terms of an encapsulation layer, these same principles can be applied to the formation of any desired layer. For example, it is expressly contemplated that the described printing principles can be used to fabricate any of the HIL, HTL, EML, ETL or other layers of an OLED device, for example, by way of illustration, with respective print wells or on another patterned or unpatterned basis. Some examples will be discussed further below.

FIGS. 8A-8E are used to narrate an exemplary fabrication process. As implied by FIG. 8A, it should be assumed for this narration that it is desired to fabricate an array of flat panel devices. A common substrate is represented by numeral 801, and a set of dashed-line boxes, such as box 803, represents geometry for each flat panel device. A fiducial, preferably with two-dimensional characteristics, is formed on the substrate and used to locate and align the various fabrication processes. Following eventual completion of these processes, each panel (803) will be separated from the common substrate using a cutting or similar process. Where the arrays of panels represent respective OLED displays, the common substrate 801 will typically be glass, with structures deposited atop the glass, followed by one or more encapsulation layers. Light emission may occur through the glass or the encapsulation layers (depending on design). For some applications, other substrate materials can be used, for example, a flexible material, transparent or opaque. As noted, many other types of devices can be manufactured according to the described techniques.

Figure 8A:
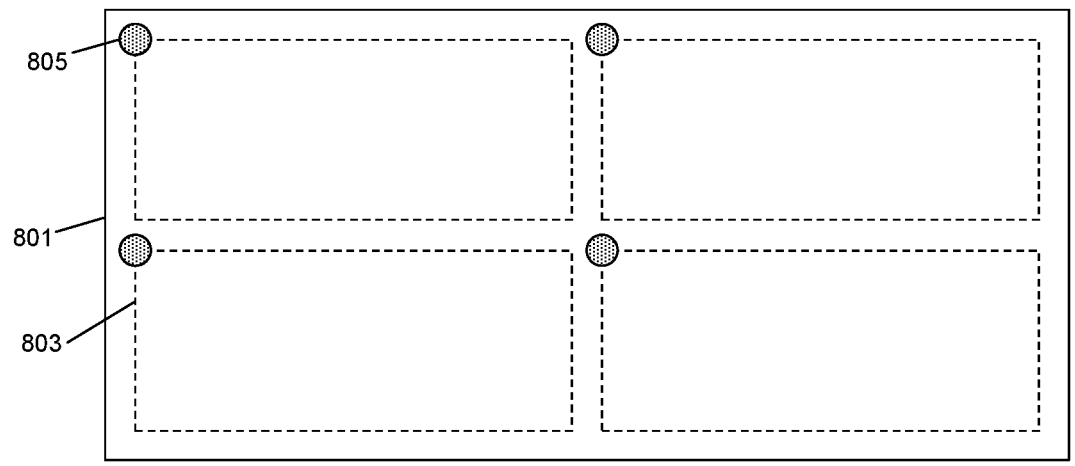
FIG. 8A shows a substrate 801 that will be arrayed into multiple flat panels, for example, multiple organic light emitting diode ("OLED") display panels, solar panels, or other types of panels.
Figure 8B:
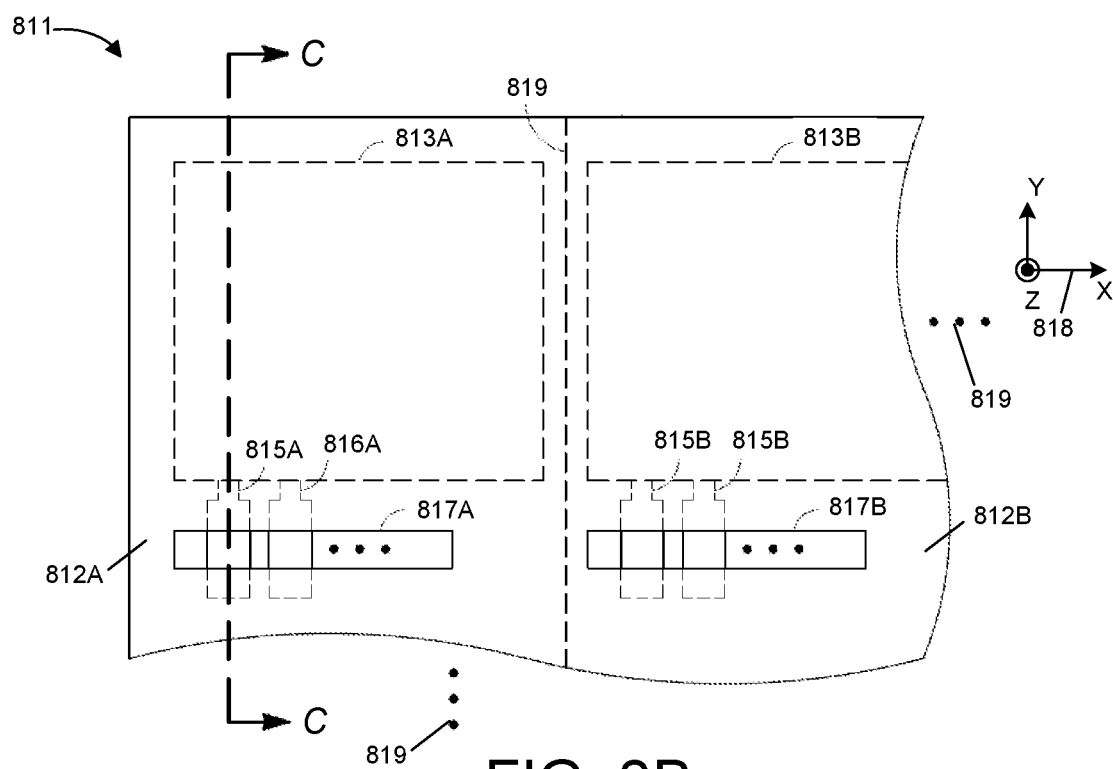
FIG. 8B shows the substrate of FIG. 8A after active elements and electrodes have been added to the substrate of FIG. 8A.

FIG. 8B is used to help illustrate fabrication of OLED panels. Specifically, FIG. 8B shows the substrate in a later stage of the fabrication process, after structures have been added to the substrate. The assembly is generally represented by numeral 811, and is seen to still feature an array of panels on a common substrate. Features specific to one panel will be designated using a numeral followed by a respective letter, for example, the letter "A" for a first panel, "B" for a second panel, and so forth. Each panel has a respective portion of the substrate, 812A/812B, for example, and an active region 813A/813B that contains light emitting layers. Generally speaking, the respective active region will include electrodes and luminescent layers necessary to provide pixilation and associated routing of electrical signals, such as for control and power. This routing conveys power and control information between respective terminals (e.g., 815A/B, 816A/B) associated with a terminal block 817A/817B and the active region for the respective panel. Typically, the encapsulation layer must provide a protective "blanket" over the active region only (i.e., to seal electroluminescent materials) while permitting unimpeded external access to the terminal block 817A/B. Thus, a printing process must deposit liquid ink in a manner that reliably and uniformly covers the active region (813A/813B) without gaps, holes or other defects, while at the same time reliably and uniformly not covering the terminal block 817A/817B. The active region is thus said to form a "target region" that will receive deposited ink to form the desired layer, while the terminal block forms part of an "exposed region" that will not receive the ink. Note in FIG. 8B the use of numeral 818 to denote an xyz coordinate system and the use of numeral 819 to reference respective sets of ellipses to indicate presence of any number of panels replicated in x and y dimensions of the array.

FIG. 8C illustrates a cross-section of the assembly 811, taken along lines C-C from FIG. 8B. In particular, this view shows the substrate 812A of panel A, the active region 813A of panel A, and conductive terminals (815A) of panel A used to effect electronic connection to the active region. A small elliptical region 821 of the view is seen magnified at the right side of the FIG. to illustrate layers in the active region above the substrate 812A. These layers respectively include an anode layer 829, a hole injection layer ("HIL") 831, a hole transport layer ("HTL") 833, an emissive or light emitting layer ("EML") 835, an electron transport layer ("ETL") 837 and a cathode layer 838. Additional layers, such as polarizers, barrier layers, primers and other materials can also be included. When the depicted stack is eventually operated following manufacture, current flow removes electrons from the EML, and resupplies of those electrons from the cathode to cause the emission of light. The anode layer 829 typically comprises one or more transparent electrodes common to several color components and/or pixels to attract and remove electrons; for example, the anode can be formed from indium tin oxide (ITO). The HIL 831 is typically a transparent, high work function material that will form a barrier to unintended leakage current. The HTL 833 is another transparent layer that passes electrons from the EML to the anode, while leaving electrical "holes" in the EML. Light generated by the OLED originates from recombination of electrons and holes in the EML material 835; typically, the EML consists of separately-controlled, active materials for each of three primary colors, red, green and blue, for each pixel of the display. In turn, the ETL 837 supplies electrons to the EML from the cathode layer to each active element (e.g., each red, green or blue color component). Finally, the cathode layer 838 typically consists of patterned electrodes to provide selective control to color component for each pixel. Lying at the rear of the display, this layer is typically not transparent, and can be made from any suitable electrode material.

As noted, layers in the active region can be degraded through exposure to oxygen and/or moisture. It is therefore desired to enhance OLED life by encapsulating these layers, both on faces or sides (822) of those layers opposite the substrate, as well as lateral edges, designated by numeral 823. The purpose of encapsulation is to provide an oxygen and/or moisture resistant barrier, as mentioned.

FIG. 8D shows an aggregate structure 839 where encapsulation 840 has been added to the substrate. Note that the encapsulation 840 now encloses faces 822 and lateral edges 823 relative to the substrate 812A and that the encapsulation extends laterally to occupy a deposition area larger than the underlying active layers; at a terminus of this area, the encapsulation forms a gradient or border region to help enclose/seal lateral edges of the active region 813A. This is observed in detail at the left side of FIG. 8D within a magnified elliptical region 841. As seen in this expanded view, the encapsulation comprises a number of thin layers, for example, alternating organic and inorganic layers, which provide a barrier against moisture and oxygen. The organic encapsulation layers can be advantageously deposited using the techniques introduced above, with the thickness of each individual layer regulated using the mentioned techniques. Relative to a particular organic encapsulation layer 842, a first region 843 overlies underlying structures, such as the mentioned electrodes and the other OLED layers discussed above. A second region 845 operates as a buffer region, i.e., to maintain a substantially uniform surface 846 that is planar with the first region 843. Optionally, deposited thickness can be the same in both of regions 843 and 845, but this need not be the case for all deposition processes. Irrespective of region, an ink jet printing process, using halftoning to translate layer thickness, can be used to control thickness and promote uniformity of the particular encapsulation layer 842. Finally, a third, gradient or border region 847 represents a transition to an exposed area of the underlying substrate (e.g., to provide electrical terminals for the active region). Numeral 849 indicates an associated taper in the encapsulation surface as it transitions to exposed substrate.

FIG. 8E is used to help illustrate the use of processing to adjust material thickness at layer edges in the context of an OLED panel. These processes were generally introduced earlier in connection with FIGS. 7B-7E. For example, in an encapsulation process such as the one discussed, it can be desirable to ensure consistent layer thickness all the way to a planned encapsulation periphery in order to provide for reliable edge sealing of any underlying sensitive material layers. Note that the use of "fencing" as was seen in FIG. 7E is not separately seen in this FIG., though the same fencing process could be used here. In FIG. 8E, the substrate is once again observed in a plan view, that is, from the same perspective as seen in FIGS. 8A and 8B (though depiction of the electrical terminals is omitted). Note the use of a fiducial 851 to align processes such that an organic encapsulation layer is correctly printed over underlying substrate. The target region (representing area where the encapsulation layer is to be deposited) is seen to comprise regions 843 and 845 from FIG. 8D. Rather than have undesired edge effects given spreading of deposited ink and the effect of surface energy/tension of that ink, the grayscale image can be adjusted (i.e., before printing) so as to change grayscale values for individual print cells along the layer's edge and, in so doing, change the edge profile at a layer periphery. For example, grayscale values within region 845 can be increased as depicted in FIG. 8E so as to optionally increase ink volume in areas approaching the boundary. Note in this regard that the target region can initially be associated with a particular thickness, for example, represented by hypothetical grayscale value "220" in this example. If it is determined empirically that due to ink spreading, a transition (for example, at the boundary between regions 845 and 847) provides insufficient coverage, the grayscale value in that area can be selectively increased to provide mitigation, for example, by increasing the grayscale value (e.g., from "220" to "232" in FIG. 8E) for one or more rows or columns of print cells representing the layer periphery. As referenced earlier, corrections can be stored as a correction image (e.g., as the corrections might, depending on application, vary as a function of process, temperature, ink and other factors), or they can optionally be incorporated into the layout data, grayscale image or other stored data. Note that where multiple boundary conditions are present, for example, intersection of two borders, it may be desired to provide further adjustment, such as the depicted grayscale value of "240" for corner print cell 863. Clearly many possibilities exist. By adjusting droplet density in these border regions, the techniques introduced above permit customized control over the layer edges in any manner suitable to the particular deposition process at issue, for example, to facilitate edge sealing of flat panel devices. Note that it is also possible for software to automatically provide for adjusted print cell fill (i.e., to adjust grayscale values) according to a selected scaling factor any time the software detects print cells within a defined distance from a layer edge. Fencing can be added before or after a grayscale image is sent for halftone generation, depending on desired embodiment or effect.

Figure 9:
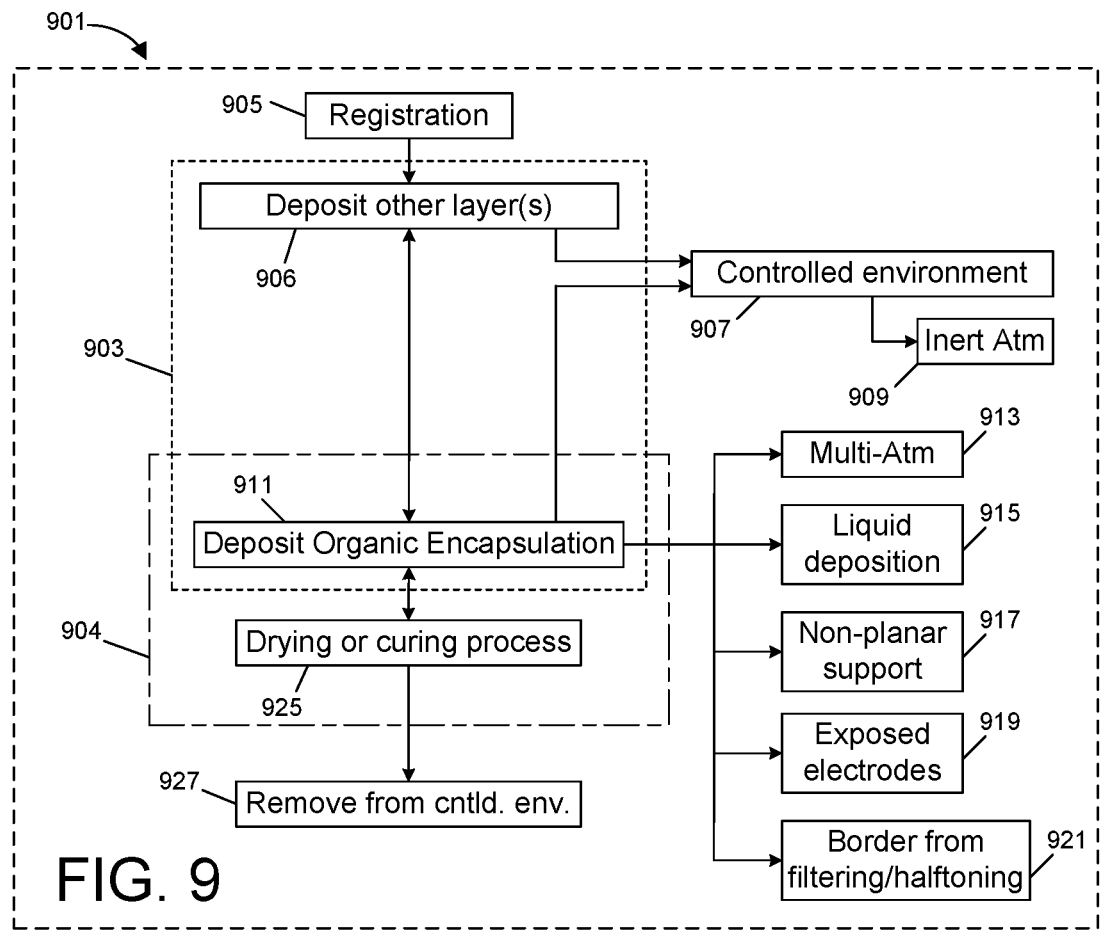
FIG. 9 is a block diagram of one process for depositing an organic encapsulation layer.

FIG. 9 presents a method generally represented by numeral 901. In this example, it should be assumed that it is desired to deposit a layer as part of an encapsulation process of a device such as a flat panel display or a solar panel. The encapsulation is used to help protect internal materials of the device from exposure to moisture or oxygen, thus prolonging expected lifetime of the device. This application is but one application for disclosed techniques, and nearly any type of layer (organic or inorganic), for nearly any type of device that is to receive a printed layer of material can benefit from the teachings herein.

It will be assumed for this discussion that the layer will be an organic material deposited over a substrate, as part of a repeating stack of alternating organic and inorganic materials layers; as many pairs of such layers are built up, this stack will encapsulate sensitive materials against a specific layer of the substrate. For example, in an OLED device, an electrode, one or more emissive layers, a second electrode and alternating organic/inorganic encapsulation layer pairs can be deposited over a layer of glass, with the encapsulation (once finished) sealing the emissive layers (including lateral edges of the emissive layers) against the glass layer. Typically, it is desired to minimize exposure of the assembly to contaminants during the fabrication process until the encapsulation has been completed. To this effect, in a process described below, while the various layers are added, the substrate is kept in one or more controlled environments until the encapsulation has been completed. The encapsulation can be formed using a multi-chambered process where the substrate is subjected to alternating deposition processes to form the organic and inorganic layer pairs. In this example, it is assumed that the techniques introduced above are applied to deposit an organic layer within the encapsulation stack and that this layer is typically deposited in liquid form and then hardened or otherwise cured to form a permanent layer prior to addition of the next (inorganic) layer. An ink jet printing process can be advantageously used to deposit this organic layer according to the principles introduced above.

Note that a "controlled atmosphere" or "controlled environment" as used herein refers to something other than ambient air, i.e., at least one of the composition or the pressure of a deposition atmosphere is controlled so as to inhibit introduction of contaminates; an "uncontrolled environment" means normal air without means of excluding unwanted particulates. In connection with the process depicted by FIG. 9, both the atmosphere and pressure can be controlled, such that deposition occurs in the presence of an inert material, such as nitrogen gas, at a specified pressure, free from unwanted particulates. In one embodiment, a multi-tool deposition mechanism can be used to alternately deposit organic and inorganic layers of an encapsulation of sensitive materials, for example, using different processes. In another embodiment, a multi-chambered fabrication mechanism is used, such that some processing (e.g., active layer or inorganic encapsulation layer deposition) occurs in one chamber while a printing process using the principles introduced herein is applied in a different chamber; as will be discussed below, a mechanical handler can be used to automate transportation of the substrate from one chamber to the next without exposing the substrate to an uncontrolled environment. In still another embodiment, continuity of the controlled environment is interrupted, i.e., the other layers are fabricated elsewhere and the substrate is loaded into a deposition chamber, a controlled atmosphere is introduced, the substrate is cleaned or purified, and then the desired layer is added. Other alternatives are also possible. These different embodiments are variously represented by FIG. 9. FIG. 9 expressly shows two optional process integrations, including integration (903) of fabrication of an inorganic encapsulation layer (and/or one or more other layers, such as active layers) with deposition of an organic encapsulation layer in a secured environment (e.g., not exposed to uncontrolled atmosphere) and/or integration (904) of the deposition of the organic encapsulation layer with a subsequent drying, curing or other process, to solidify the organic encapsulation layer and otherwise finish the layer as a permanent structure. For each optional integration process, the mentioned steps can be performed in one or more controlled environments that are uninterrupted by exposure to an uncontrolled environment (e.g., ambient air). For example, a multi-chamber fabrication device with means for controlling the deposition environment can be used, as mentioned.

Irrespective of embodiment, the substrate is positioned for patterning and/or printing as appropriate. Accordingly, registration is first performed (905) using fiducials (or recognizable patterns) on the substrate. Typically, a fiducial will consist of one or more alignment marks that identify each region that is to be printed. As an example, as introduced earlier (see, e.g., element 805 from FIG. 8A), several flat panels can be fabricated together and cut from one die or common substrate; in such a case, there might be a separate fiducial for each panel, positioned so that the printing mechanism and associated process can be precisely aligned with any pre-patterned structures for each panel. Note, however, that fiducials can be used even where a single panel is to be fabricated. As will be further discussed below, the deposition system can include an imaging system having a known positional relationship relative to the printing mechanism, with digital images of the substrate fed to a processor or CPU and analyzed using image analysis software to precisely identify the fiducials. In one optional variation, there are no special marks added to the substrate, i.e., the printing system recognizes its target by simply identifying any existing structures (such as any previously-deposited particular electrode or particular electrodes) and aligns to this pattern. Note also that, advantageously, each fiducial represents a two dimensional pattern, permitting correction of position and any substrate skew prior to deposition.

One or more layers are then added to the substrate, for example, consisting of one or more emissive layers, electrode layers, charge transport layers, inorganic encapsulation layers, barrier layers and/or other layers or materials (906). As mentioned, deposition in one embodiment is performed in a controlled environment (907), optionally in an inert atmosphere (909) such as nitrogen gas or a noble gas. Following this processing, an organic encapsulation layer is deposited as a liquid ink, as represented by numeral 911. In contradistinction to other possible processes (e.g., used to add a mask layer), the ink in this embodiment directly provides the material that will form the desired layer following cure, hardening, etc. Note also that the printing process is also advantageously performed in a controlled environment (907), such as in an inert atmosphere (909), and that the processes can be repeated and alternated as denoted by the fact that connection arrows are bidirectional; for example, a stack of inorganic and organic encapsulation layer pairs can be built up as introduced earlier.

FIG. 9 also shows various process options to the right of process box 911. These options include the use of a multi-atmosphere process (913), the deposition of the organic encapsulation layer as a liquid ink (915), the deposition of the organic encapsulation layer atop a non-planar substrate (917), the use of a target deposition region of the substrate (that will receive the encapsulation layer) and an exposed region of the substrate (that will not be enclosed by the encapsulation layer) (919) and the generation of a border region (or gradient region) that will seal lateral edges of any underlying layers (e.g., from halftoning specific to a border region or gradient filtering, 921), as discussed above in connection with FIGS. 7A-7E.

Once each organic encapsulation layer has been deposited, as discussed above, the layer is dried or otherwise cured (925) to render the layer permanent. In one embodiment, the organic encapsulation layer is deposited as a liquid monomer or polymer, and following deposition, an ultraviolet light is applied to the deposited ink to cure the material and harden it and form a layer of the desired thickness. In another possible process, the substrate is heated to evaporate any solvent or carrier for suspended materials, which then forms a permanent layer having the desired thickness. Other finishing processes are also possible.

Finally, once all encapsulation processes (including the desired number of organic and inorganic layer pairs) have been completed, the entire substrate can be removed from the controlled environment, per numeral 927.

While the described process can be used to deposit encapsulation for sensitive materials, as discussed above, the same process can also be used to deposit many different and other types of layers as well, including inorganic layers and layers for non-electronic devices.

As shown by the description above, halftoning processes can advantageously be used to fabricate layers of controlled thickness using print cell-to-print cell and/or nozzle-to-nozzle control over ink densities. More specifically, the described techniques are especially useful where a liquid ink is used to deposit layer material of a desired thickness. By selecting grayscale values and generating halftone patterns that provide complete coverage (that is, to deposit a layer of sufficient density to avoid defects or holes), a layer can be inexpensively and efficiently applied with localized control over thickness and uniformity, e.g., notwithstanding a liquid deposition medium and any subsequent cure process. The disclosed techniques are particularly useful for the deposition of homogenous layers such as blanket coatings, encapsulation layers, and other layers where feature size is relatively large (e.g., tens of microns or more) compared to the widths and feature definitions of any underlying electronic pathways. As also noted above, the disclosed techniques can be embodied in different forms, for example, as software (instructions stored on non-transitory machine-readable media), as a computer, printer or fabrication mechanism, as an information file (stored on non-transitory machine-readable media) useful in instructing fabrication of such a layer, or in a product (e.g., a flat panel) made dependent on use of the described techniques. Optionally also, error correction techniques can be used to correct for droplet aberration from individual nozzles, to blend adjacent halftone patterns (e.g., for adjacent tiles), to correct grayscale values to planarize the deposited layer, or for other effect. Several embodiments rely on error diffusion to ensure layer homogeneity and distribute droplet patterns in a manner that averages grayscale values for neighboring print cells. Again, many other applications will occur to those skilled in the art.

The foregoing description and in the accompanying drawings, specific terminology and drawing symbols have been set forth to provide a thorough understanding of the disclosed embodiments. In some instances, the terminology and symbols may imply specific details that are not required to practice those embodiments. The terms "exemplary" and "embodiment" are used to express an example, not a preference or requirement. Note that some elements described above can be described as "means for" performing a particular function. Generally, such "means" includes structure described above, including, where and as applicable, instructions stored on non-transitory machine-readable media (e.g., software or executable instructions) that are written in a manner that will, when executed, cause at least one processor to perform a particular function. Without limitation, specified functions can also be performed by dedicated equipment, such as special purpose analog or digital machines.

As indicated, various modifications and changes may be made to the embodiments presented herein without departing from the broader spirit and scope of the disclosure. For example, features or aspects of any of the embodiments may be applied, at least where practical, in combination with any other of the embodiments or in place of counterpart features or aspects thereof. Accordingly, the specification and drawings are to be regarded in an illustrative rather than a restrictive sense.

What is claimed is:

1. A method of fabricating a layer of an electronic device, wherein the layer is to span an area, the area having at least one lateral edge, the method comprising:
    using an ink jet printer to deposit droplets of liquid, the droplets to coalesce to form a continuous liquid coat within the area; and
    using a curing mechanism to cure the continuous liquid coat to form the layer;
    wherein using the ink jet printer to deposit the droplets of liquid comprises deposing droplets at a first droplet density at the at least one lateral edge to form a frame for the layer, and
    depositing droplets within the frame at a second droplet density different from the first droplet density, wherein depositing droplets at the first droplet density comprises firing droplets at locations corresponding to nodes of a print grid, wherein depositing droplets at the second droplet density also comprises firing droplets at locations corresponding to nodes of the print grid, and wherein the first droplet density corresponds to droplet density at a minimum pitch relative to positional overlap between the nodes of the print grid and the at least one lateral edge.

2. The method of claim 1, wherein depositing droplets at the first droplet density comprises depositing the droplets in a manner that defines at least one straight line.

3. A method of fabricating a layer of an electronic device, wherein the layer is to span an area, the area having at least one lateral edge, the method comprising:
    using an ink jet printer to deposit droplets of liquid, the droplets to coalesce to form a continuous liquid coat within the area; and
    using a curing mechanism to cure the continuous liquid coat to form the layer;
    wherein using the ink jet printer to deposit the droplets of liquid comprises deposing droplets at a first droplet density at the at least one lateral edge to form a frame for the layer, and
    depositing droplets within the frame at a second droplet density different from the first droplet density, wherein the depositing of droplets within the frame at the second droplet density is performed at a first region within the frame, and the method further comprises depositing droplets within the frame at a third droplet density different from the second droplet density at a second region within the frame, the second region intermediate to the first region and an edge of the at least one lateral edge.

4. The method of claim 3, wherein the method further comprises adjusting the second droplet density according to a predetermined algorithm to obtain the third droplet density.

* * * * *